United States Patent
Kozuka et al.

(10) Patent No.: US 11,460,666 B2
(45) Date of Patent: Oct. 4, 2022

(54) IMAGING APPARATUS AND METHOD, AND IMAGE PROCESSING APPARATUS AND METHOD

(71) Applicant: SONY CORPORATION, Tokyo (JP)

(72) Inventors: Noriaki Kozuka, Tokyo (JP); Yoshitaka Miyatani, Tokyo (JP)

(73) Assignee: SONY CORPORATION, Tokyo (JP)

( * ) Notice: Subject to any disclaimer, the term of this patent is extended or adjusted under 35 U.S.C. 154(b) by 270 days.

(21) Appl. No.: 16/754,550

(22) PCT Filed: Oct. 19, 2018

(86) PCT No.: PCT/JP2018/038942
§ 371 (c)(1),
(2) Date: Apr. 8, 2020

(87) PCT Pub. No.: WO2019/078335
PCT Pub. Date: Apr. 25, 2019

(65) Prior Publication Data
US 2020/0348491 A1 Nov. 5, 2020

(30) Foreign Application Priority Data
Oct. 19, 2017 (JP) .............................. JP2017-202889

(51) Int. Cl.
*H04N 5/378* (2011.01)
*H04N 5/357* (2011.01)
(Continued)

(52) U.S. Cl.
CPC ...... *G02B 13/002* (2013.01); *H01L 27/14612* (2013.01); *H01L 27/14621* (2013.01);
(Continued)

(58) Field of Classification Search
CPC ...... H04N 5/357; H04N 5/3572; H04N 5/378; H04N 5/23229; G06T 5/00; G06T 5/001;
(Continued)

(56) References Cited

U.S. PATENT DOCUMENTS 8,017,899 B2 * 9/2011 Levenets ................. H01L 27/00
250/208.1
8,995,057 B2 * 3/2015 Miyasaka .......... G02B 27/4233
356/445
(Continued)

FOREIGN PATENT DOCUMENTS

| CN | 1705898 A | 12/2005 |
| CN | 101361095 A | 2/2009 |

(Continued)

OTHER PUBLICATIONS

Asif, et al. "FlatCam: Replacing Lenses with Masks and Computation", IEEE International Conference on Computer Vision Workshop (ICCVW), Feb. 15, 2016, pp. 663-666.
(Continued)

*Primary Examiner* — Marly S Camargo
(74) *Attorney, Agent, or Firm* — Chip Law Group

(57) ABSTRACT

The present technology relates to an imaging apparatus and method, and an image processing apparatus and method that make it possible to expand a range of a subject that can be imaged. A subject is imaged by an imaging element including a plurality of pixel output units that receives incident light from the subject entering without passing through either an imaging lens or a pinhole and entering through an optical system that is not an imaging lens and has a negative power, and each outputs one detection signal indicating an output pixel value modulated by an incident angle of the incident light. The present disclosure can be applied to, for example, an imaging apparatus, an image processing apparatus, an information processing apparatus, an electronic
(Continued)

device, a computer, a program, a storage medium, a system, and the like.

20 Claims, 38 Drawing Sheets

(51) Int. Cl.
  *H04N 5/232* (2006.01)
  *G02B 13/00* (2006.01)
  *H01L 27/146* (2006.01)
  *G06T 5/00* (2006.01)
(52) U.S. Cl.
  CPC .. *H01L 27/14623* (2013.01); *H01L 27/14643* (2013.01); *H04N 5/357* (2013.01); *H04N 5/378* (2013.01)
(58) Field of Classification Search
  CPC ............... G06T 5/002; H01L 27/14643; H01L 26/14623; H01L 27/14612; H01L 27/14621; G02B 13/002
  See application file for complete search history.

(56) References Cited

U.S. PATENT DOCUMENTS

| | | | |
|---|---|---|---|
| 9,407,845 B1 | 8/2016 | Solh | |
| 2006/0013277 A1* | 1/2006 | Fuse | G02B 27/1086 372/101 |
| 2009/0095912 A1* | 4/2009 | Slinger | G01T 1/164 250/363.06 |
| 2009/0179882 A1* | 7/2009 | Uschiyama | G09G 5/02 345/207 |
| 2012/0022321 A1* | 9/2012 | Miyasaka | G02B 27/0944 250/216 |
| 2013/0341493 A1* | 12/2013 | Ando | H01L 27/146 250/208.1 |
| 2014/0368618 A1* | 12/2014 | Ushinaga | H04N 13/0207 348/49 |
| 2015/0130969 A1 | 5/2015 | Nakamura et al. | |
| 2016/0126275 A1 | 5/2016 | Kurokawa | |
| 2018/0205866 A1 | 7/2018 | Komai et al. | |
| 2018/0313982 A1 | 11/2018 | Bando et al. | |
| 2020/0185439 A1* | 6/2020 | Jin | G01S 7/481 |
| 2021/0203729 A1* | 7/2021 | Miyatani | H04N 5/2353 |

FOREIGN PATENT DOCUMENTS

| | | |
|---|---|---|
| CN | 108140647 A | 6/2018 |
| EP | 3358618 A1 | 8/2018 |
| JP | 2016-510910 A | 4/2016 |
| JP | 2016-092413 A | 5/2016 |
| KR | 10-2018-0063169 A | 6/2018 |
| WO | 2016/123529 A1 | 8/2016 |
| WO | 2017/022450 A1 | 2/2017 |
| WO | 2017/056865 A1 | 4/2017 |

OTHER PUBLICATIONS

International Search Report and Written Opinion of PCT Application No. PCT/JP2018/038942, dated Jan. 8, 2019, 06 pages of ISRWO.

Office Action for CN Patent Application No. 201880066129.9, dated Mar. 23, 2022, 05 pages of English Translation and 05 pages of Office Action.

* cited by examiner

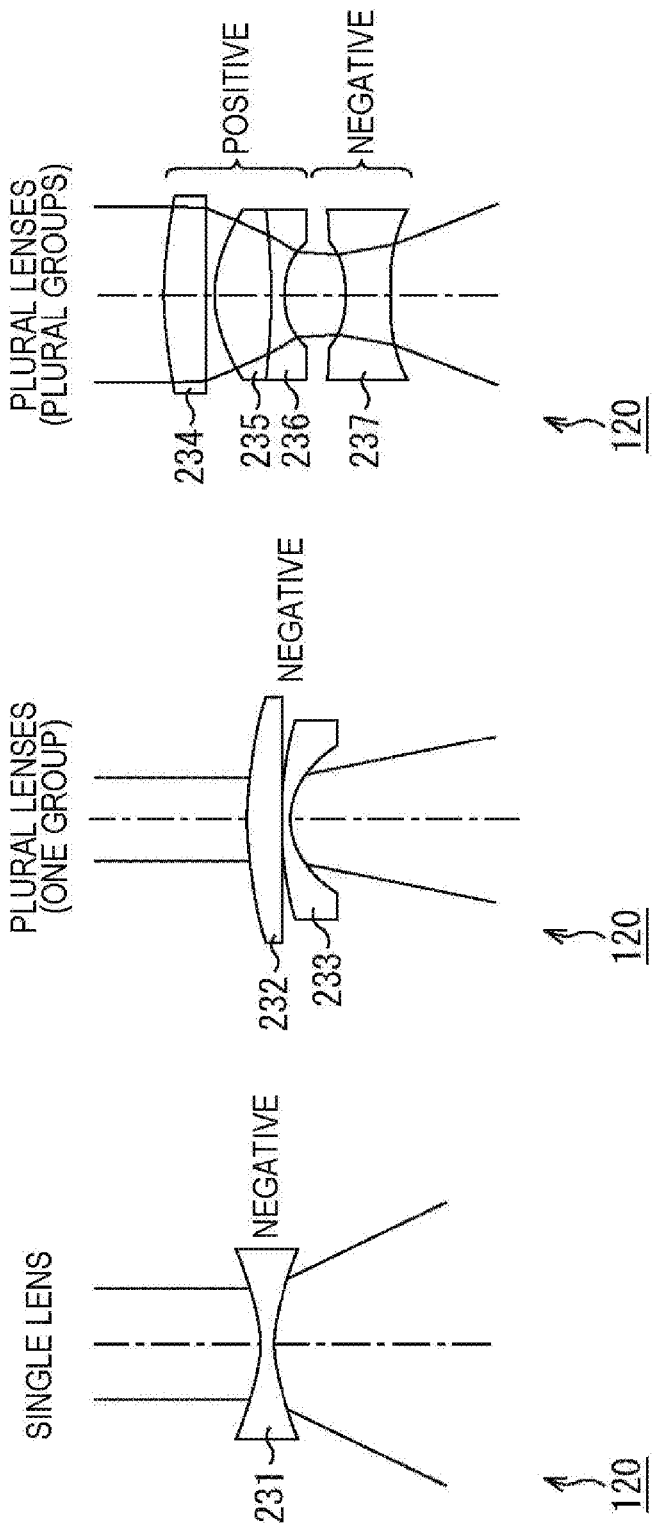

TYPE CHANGE

LENS POSITION CHANGE (REFERENCE)

IMAGING APPARATUS AND METHOD, AND IMAGE PROCESSING APPARATUS AND METHOD

CROSS REFERENCE TO RELATED APPLICATIONS

This application is a U.S. National Phase of International Patent Application No. PCT/JP2018/038942 filed on Oct. 19, 2018, which claims priority benefit of Japanese Patent Application No. JP 2017-202889 filed in the Japan Patent Office on Oct. 19, 2017. Each of the above-referenced applications is hereby incorporated herein by reference in its entirety.

TECHNICAL FIELD

The present technology relates to an imaging apparatus and method, and an image processing apparatus and method, and more particularly, to an imaging apparatus and method, and an image processing apparatus and method enabled to expand a range of a subject that can be imaged.

BACKGROUND ART

Conventionally, an imaging element is generally used in combination with an imaging lens that focuses light on the imaging element. The imaging lens guides the light from a subject surface to each pixel of the imaging element to reproduce a light intensity of the subject surface, whereby the imaging element can obtain a detection signal of a level corresponding to the light intensity in each pixel, and can obtain a captured image of the subject as a whole.

However, in this case, the physical size becomes large. Thus, an imaging element has been devised that does not use an imaging lens (for example, see Patent Document 1, Patent Document 2, and Non-Patent Document 1).

CITATION LIST

Patent Document

Patent Document 1: International Publication No. 2016/123529
Patent Document 2: PCT Japanese Translation Patent Publication No. 2016-510910

Non-Patent Document

Non-Patent Document 1: M. Salman Asif and four others, "Flatcam: Replacing lenses with masks and computation", "2015 IEEE International Conference on Computer Vision Workshop (ICCVW)", 2015, pages 663-666

SUMMARY OF THE INVENTION

Problems to be Solved by the Invention

However, in such an imaging element, the directivity of incident light becomes uniform as the distance to the subject increases, and there is a possibility that calculation accuracy is reduced of signal processing for converting a detection signal into an image. Furthermore, in such an imaging element, an angle of view that can be captured is determined depending on its physical structure, and it has not been possible to perform imaging of an angle of view larger than that.

That is, such an imaging element has a limitation on the position (distance and angle) of a subject that can be imaged, and it has been difficult to image a subject outside the limitation. Then, this limitation is due to the physical structure of the imaging element, and is determined by the design of the imaging element. It has, therefore, been difficult to change this limitation depending on an application of imaging, and the like.

The present disclosure has been made in view of such a situation, and makes it possible to expand the range of a subject that can be imaged.

Solutions to Problems

An imaging apparatus according to one aspect of the present technology is an imaging apparatus including: an optical system that is not an imaging lens and has a negative power; and an imaging element including a plurality of pixel output units that receives incident light from a subject entering without passing through either an imaging lens or a pinhole and entering through the optical system, and each outputs one detection signal indicating an output pixel value modulated by an incident angle of the incident light.

The optical system can be made to include a single concave lens.

The optical system can be made to include a plurality of lenses having a negative power as a whole.

Some lenses among the plurality of lenses can be made to have a positive power.

A relative position of the optical system with respect to the imaging element can be made variable.

The optical system can be made detachable from the imaging apparatus.

The plurality of pixel output units can be made to have a configuration in which an incident angle directivity of the output pixel value indicating a directivity with respect to an incident angle of incident light from a subject is settable independently for each of the pixel output units.

The plurality of pixel output units can be made to have a configuration in which an incident angle directivity indicating a directivity with respect to an incident angle of incident light from a subject is settable independently for each of the pixel output units.

The plurality of pixel output units can be made to have a configuration in which an incident angle directivity of the output pixel value indicating a directivity with respect to an incident angle of incident light from a subject is settable independently for each of the pixel output units by making photo diodes (PDs) that contribute to output different from each other.

An imaging method according to one aspect of the present technology is an imaging method including imaging a subject by an imaging element including a plurality of pixel output units that receives incident light from the subject entering without passing through either an imaging lens or a pinhole and entering through an optical system that is not an imaging lens and has a negative power, and each outputs one detection signal indicating an output pixel value modulated by an incident angle of the incident light.

An image processing apparatus according to another aspect of the present technology is an image processing apparatus including a coefficient setting unit that sets, depending on at least one of a type and position of an optical system that is not an imaging lens and has a negative power, or a distance to a subject, coefficients used when a restored image is restored from output pixel values of a plurality of pixel output units, of an imaging element, the imaging element including the plurality of pixel output units that receives incident light from the subject entering without passing through either an imaging lens or a pinhole and entering through the optical system, and each outputs one detection signal indicating an output pixel value modulated by an incident angle of the incident light.

A configuration can be made to further include an acceptance unit that accepts designation of the type and position of the optical system, in which the coefficient setting unit sets the coefficients depending on the type and position of the optical system accepted by the acceptance unit.

A configuration can be made to further include a detection unit that detects the type and position of the optical system, in which the coefficient setting unit sets the coefficients depending on the type and position of the optical system detected by the detection unit.

A configuration can be made to further include a subject distance acceptance unit that accepts an input of the distance to the subject, in which the coefficient setting unit sets the coefficients depending on the distance to the subject accepted by the subject distance acceptance unit.

A configuration can be made to further include a subject distance detection unit that detects the distance to the subject, in which the coefficient setting unit sets the coefficients depending on the distance to the subject detected by the subject distance detection unit.

A configuration can be made to further include a restoration unit that restores the restored image by using the output pixel values of the plurality of pixel output units of the imaging element and the coefficients set by the coefficient setting unit.

A configuration can be made to further include an associating unit that associates the coefficients set by the coefficient setting unit as metadata with data including the output pixel values of the plurality of pixel output units of the imaging element.

A configuration can be made to further include an optical system setting unit that sets the type and position of the optical system.

A configuration can be made in which the optical system setting unit sets the type and position of the optical system depending on the distance to the subject.

An image processing method according to another aspect of the present technology is an image processing method including setting, depending on at least one of a type and position of an optical system that is not an imaging lens and has a negative power, or a distance to the subject, coefficients used when a restored image is restored from output pixel values of a plurality of pixel output units, of an imaging element, the imaging element including the plurality of pixel output units that receives incident light entering without passing through either an imaging lens or a pinhole and entering through the optical system, and each outputs one detection signal indicating an output pixel value modulated by an incident angle of the incident light.

In the imaging apparatus and method according to one aspect of the present technology, a subject is imaged by an imaging element including a plurality of pixel output units that receives incident light from the subject entering without passing through either an imaging lens or a pinhole and entering through an optical system that is not an imaging lens and has a negative power, and each outputs one detection signal indicating an output pixel value modulated by the incident angle of the incident light.

In the image processing apparatus and method according to another aspect of the present technology, coefficients are set depending on at least one of a type and position of an optical system that is not an imaging lens and has a negative power, or a distance to a subject, the coefficients being used when a restored image is restored from output pixel values of a plurality of pixel output units, of an imaging element, the imaging element including the plurality of pixel output units that receives incident light entering without passing through either an imaging lens or a pinhole and entering through the optical system, and each outputs one detection signal indicating an output pixel value modulated by the incident angle of the incident light.

Effects of the Invention

According to the present technology, a subject can be imaged, or an image can be processed. Furthermore, according to the present technology, a range of a subject that can be imaged can be expanded.

BRIEF DESCRIPTION OF DRAWINGS

FIGS. 28A, 28B, and 28C are diagrams for explaining types of optical systems.

FIG. 29 is a flowchart illustrating an example of a flow of imaging processing.

MODE FOR CARRYING OUT THE INVENTION

The following is a description of a mode for carrying out the present disclosure (the mode will be hereinafter referred to as the embodiment). Note that, description will be made in the following order.

1. First embodiment (imaging apparatus: optical system type and position fixed)
2. Second embodiment (imaging apparatus: optical system type and position are variable)
3. Third embodiment (imaging apparatus: optical system type and position setting)
4. Fourth embodiment (imaging apparatus: other configuration examples of imaging element)
5. Others

1. First Embodiment

<Imaging Apparatus>

Figure 1:
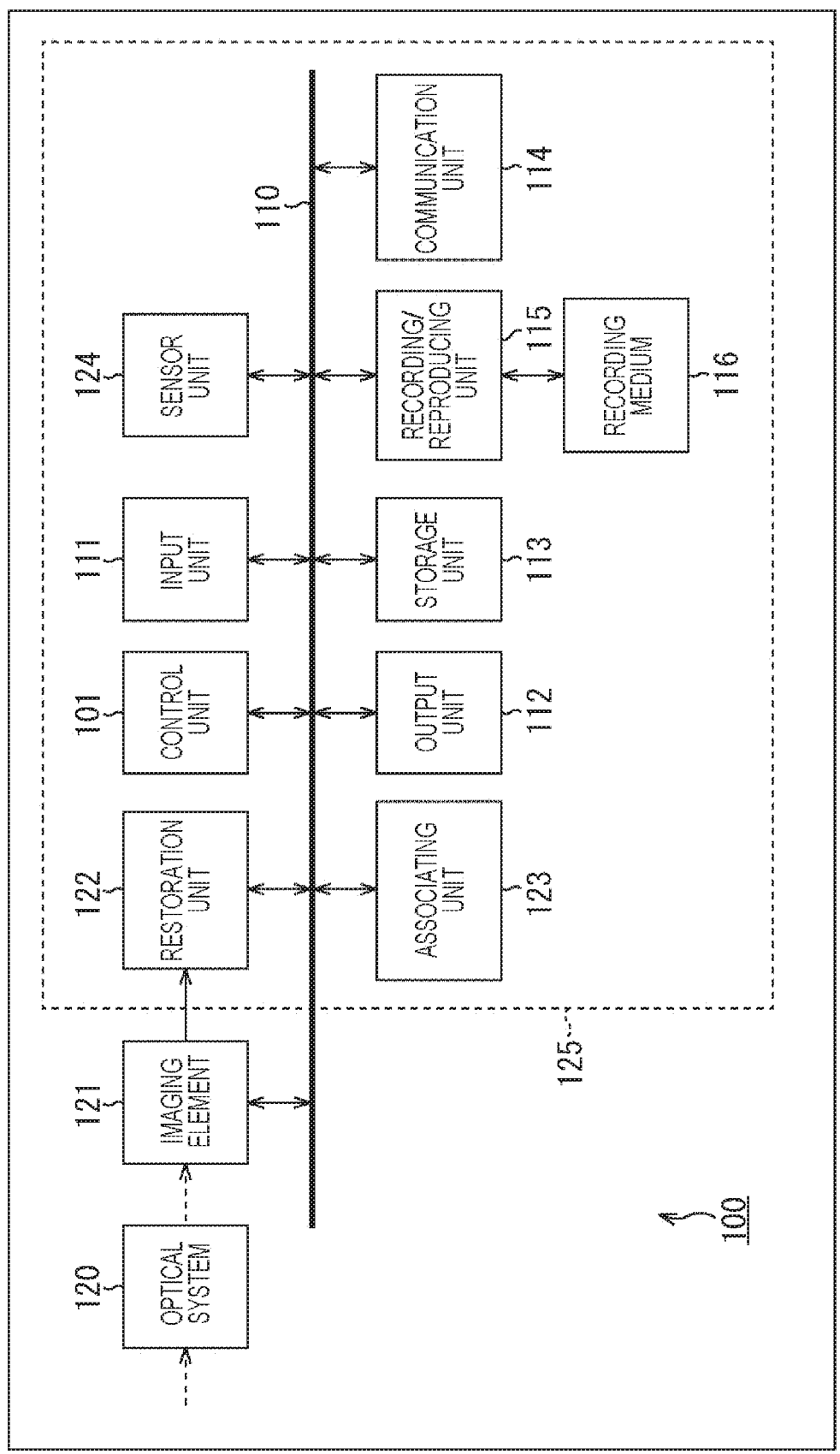
FIG. 1 is a block diagram illustrating a main configuration example of an imaging apparatus.

FIG. 1 is a diagram illustrating a main configuration example of an imaging apparatus that is an embodiment of an imaging apparatus or an image processing apparatus to which the present technology is applied. An imaging apparatus 100 illustrated in FIG. 1 is an apparatus that images a subject and obtains electronic data regarding a captured image of a subject.

As illustrated in FIG. 1, the imaging apparatus 100 includes a control unit 101, an input unit 111, an output unit 112, a storage unit 113, a communication unit 114, a recording/reproducing unit 115, an optical system 120, an imaging element 121, a restoration unit 122, an associating unit 123, a sensor unit 124, and the like. The processing units and the like other than the optical system 120 are connected to each other via a bus 110, and can exchange information, commands, and the like with each other. Note that, the optical system 120 may also be connected to the bus 110 so that information, commands, and the like can be exchanged with other processing units.

The control unit 101 is configured to perform processing related to control of the processing units and the like in the imaging apparatus 100. For example, the control unit 101 includes a central processing unit (CPU), a read only memory (ROM), a random access memory (RAM), and the like, and performs the above-described processing by executing a program by using the CPU and the like.

The input unit 111 is configured to perform processing related to input of information. For example, the input unit 111 includes input devices such as an operation button, a dial, a switch, a touch panel, a remote controller, and a sensor, and an external input terminal. For example, the input unit 111 accepts an instruction (information corresponding to input operation) from the outside such as a user with these input devices. Furthermore, for example, the input unit 111 acquires arbitrary information (program, command, data, and the like) supplied from an external apparatus via the external input terminal. Furthermore, for example, the input unit 111 supplies the accepted information (acquired information) to other processing units and the like via the bus 110.

Note that, the sensor included in the input unit 111 may be any sensor as long as it can accept the instruction from the outside such as the user, for example, an acceleration sensor or the like. Furthermore, the input device included in the input unit 111 is arbitrary, and the number of them is also arbitrary. The input unit 111 may include a plurality of types of input devices. For example, the input unit 111 may include some of the examples described above, or may include the whole. Furthermore, the input unit 111 may include an input device other than the examples described above. Moreover, for example, the input unit 111 may acquire control information regarding the input unit 111 (input device or the like) supplied via the bus 110, and operate on the basis of the control information.

The output unit 112 is configured to perform processing related to output of information. For example, the output unit 112 includes an image display device such as a monitor, an image projection device such as a projector, a sound output device such as a speaker, an external output terminal, and the like. For example, the output unit 112 outputs information supplied from other processing units and the like via the bus 110 by using those output devices and the like. For example, the output unit 112 displays a captured image (restored image described later) on a monitor, projects a captured image (restored image described later) from a projector, outputs sound (for example, sound corresponding to an input operation, a processing result, or the like), or outputs arbitrary information (program, command, data, and the like) to the outside (another device).

Note that, the output device and the like included in the output unit 112 are arbitrary, and the number of them is also arbitrary. The output unit 112 may include a plurality of types of output devices and the like. For example, the output unit 112 may include some of the examples described above, or may include the whole. Furthermore, the output unit 112 may include an output device and the like other than the examples described above. Moreover, for example, the output unit 112 may acquire control information regarding the output unit 112 (output device or the like) supplied via the bus 110, and operate on the basis of the control information.

The storage unit 113 is configured to perform processing related to storage of information. For example, the storage unit 113 includes an arbitrary storage medium such as a hard disk or a semiconductor memory. For example, the storage unit 113 stores information (program, command, data, and the like) supplied from other processing units and the like via the bus 110 in the storage medium. Furthermore, the storage unit 113 may store arbitrary information (program, command, data, and the like) at the time of shipment. Furthermore, the storage unit 113 reads information stored in the storage medium at an arbitrary timing or in response to a request from other processing units and the like, and supplies the read information to the other processing units and the like via the bus 110.

Note that, the storage medium included in the storage unit 113 is arbitrary, and the number of them is also arbitrary. The storage unit 113 may include a plurality of types of storage media. For example, the storage unit 113 may include some of the examples of the storage medium described above, or may include the whole. Furthermore, the storage unit 113 may include a storage medium and the like other than the examples described above. Furthermore, for example, the storage unit 113 may acquire control information regarding the storage unit 113 supplied via the bus 110, and operate on the basis of the control information.

The communication unit 114 is configured to perform processing related to communication with other apparatuses. For example, the communication unit 114 includes a communication device that performs communication for exchanging information such as programs and data with an external apparatus via a predetermined communication medium (for example, an arbitrary network such as the Internet). For example, the communication unit 114 communicates with another apparatus, and supplies information (program, command, data, and the like) supplied from other processing units and the like via the bus 110 to the other apparatus that is a communication partner. Furthermore, for example, the communication unit 114 communicates with another apparatus, acquires information supplied from the other apparatus that is a communication partner, and supplies the information to the other processing units and the like via the bus 110.

The communication device included in the communication unit 114 may be any communication device. For example, the communication device may be a network interface. A communication method and a communication standard are arbitrary. For example, the communication unit 114 may be made to perform wired communication, wireless communication, or both. Furthermore, for example, the communication unit 114 may acquire control information regarding the communication unit 114 (communication device or the like) supplied via the bus 110, and operate on the basis of the control information.

The recording/reproducing unit 115 is configured to perform processing related to recording and reproduction of information using a recording medium 116 mounted to the recording/reproducing unit 115. For example, the recording/reproducing unit 115 reads information (program, command, data, and the like) recorded on the recording medium 116 mounted to the recording/reproducing unit 115, and supplies the information to other processing units and the like via the bus 110. Furthermore, for example, the recording/reproducing unit 115 acquires information supplied from the other processing units and the like via the bus 110, and writes (records) the information in the recording medium 116 mounted to the recording/reproducing unit 115. Note that, for example, the recording/reproducing unit 115 may acquire control information regarding the recording/reproducing unit 115 supplied via the bus 110, and operate on the basis of the control information.

Note that, the recording medium 116 may be any recording medium. For example, the recording medium may be a magnetic disk, an optical disk, a magneto-optical disk, a semiconductor memory, or the like.

The optical system 120 is configured to optically affect incident light incident on the imaging element 121. For example, the optical system 120 is configured to have a negative power and change characteristics of the incident light incident on the imaging element 121 with respect to an incident angle. For example, the optical system 120 includes an arbitrary optical element such as a lens. Note that, the number and type of optical elements included in the optical system 120 are arbitrary. The number and type may be singular or plural. Furthermore, the optical system 120 may include a plurality of types of optical elements. Note that, the optical system 120 may be connected to the bus 110, acquire control information regarding the optical system 120 supplied via the bus 110, and operate on the basis of the control information.

The imaging element 121 is configured to perform processing related to imaging of a subject. For example, the imaging element 121 images the subject, and obtains data (electronic data) regarding the captured image. At that time, the imaging element 121 can image a subject without using an imaging lens that guides light from the subject surface to each pixel of the imaging element 121 to reproduce the light intensity of the subject surface, an optical filter such as a diffraction grating, and the like, or a pinhole or the like, and obtain data regarding the captured image. For example, the imaging element 121 images the subject and obtains data (detection signals and the like) that makes it possible to obtain data of the captured image by a predetermined calculation.

Note that, the captured image is an image that is configured by values of pixels on which a subject image is formed, and can be visually recognized by the user. On the other hand, an image (referred to as a detection image) configured from a detection signal that is a detection result of incident light in the pixel unit output of the imaging element 121 cannot be recognized as an image even when viewed by the user (that is, the subject cannot be visually recognized) since the subject image is not formed. That is, the detection image is an image different from the captured image. However, as described above, by performing the predetermined calculation on the data of the detection image, it is possible to restore the captured image, in other words, an image on which the subject image is formed and that can be recognized as an image when viewed by the user (that is, the subject can be visually recognized). This restored image is referred to as a restored image. That is, the detection image is an image different from the restored image.

Note that, an image constituting the restored image, and before synchronization processing, color separation processing, or the like (for example, demosaic processing or the like) is referred to as a Raw image. Similarly to the captured image, the Raw image is also an image that can be visually recognized by the user (that is, the subject can be visually recognized). In other words, the detection image is an image according to an arrangement of color filters, but is an image different from the Raw image.

However, in a case where the imaging element 121 has sensitivity only to invisible light, for example, infrared light, ultraviolet light, or the like, the restored image (Raw image or captured image) becomes an image that cannot be recognized as an image when viewed by the user (the subject cannot be visually recognized). However, since this depends on a wavelength range of detected light, the restored image can be an image in which the subject can be visually recognized, by converting the wavelength range to a visible light range. On the other hand, since the subject image is not formed, the detection image cannot be an image in which the subject can be visually recognized, only by converting the wavelength range. Thus, even in a case where the imaging element 121 has sensitivity only to the invisible light, the image obtained by performing the predetermined calculation on the detection image as described above is referred to as the restored image. Note that, in the following, the present technology will be described by using an example case where the imaging element 121 receives visible light basically, unless otherwise specified.

That is, the imaging element 121 can image a subject, and obtain data regarding the detection image. For example, the imaging element 121 can supply the data regarding the detection image to the restoration unit 122, and cause the restored image to be generated. Furthermore, for example, the imaging element 121 can supply the data regarding the detection image to the associating unit 123 and the like via the bus 110, and cause metadata and the like to be associated. Of course, the imaging element 121 can supply the data regarding the detection image to an arbitrary processing unit or the like. Furthermore, for example, the imaging element 121 may acquire control information regarding the imaging element 121 supplied via the bus 110, and operate on the basis of the control information.

The restoration unit 122 is configured to perform processing related to generation of the restored image. For example, the restoration unit 122 generates the restored image from data (detection signals and the like) regarding the detection image supplied from the imaging element 121 by performing the predetermined calculation. Furthermore, the restoration unit 122 supplies data (pixel values and the like) regarding the generated restored image to other processing units and the like via the bus 110.

Note that, in the imaging element 121, a detection image in which a plurality of color components is mixed may be obtained by using color filters, for example, and a Raw image in which the plurality of color components is mixed may be obtained by performing the predetermined calculation on the detection image by the restoration unit 122. Then, the restoration unit 122 may supply the Raw image in which the plurality of color components is mixed as a restored image to other processing units and the like, or may perform synchronization processing, color separation processing, or the like (for example, demosaic processing or the like) on the Raw image, and supply the image subjected to the processing as a restored image to the other processing units and the like. Of course, in the imaging element 121, a monochrome detection image or a detection image for each color is obtained, and synchronization processing, color separation processing, or the like (for example, demosaic processing or the like) may be unnecessary.

Furthermore, the restoration unit 122 may perform, on a restored image, arbitrary image processing, for example, gamma correction (γ correction), white balance adjustment, or the like, and supply data regarding a restored image after image processing to other processing units and the like. Moreover, the restoration unit 122 may convert the format of data of the restored image, or compress the data with, for example, a predetermined compression method such as joint photographic experts group (JPEG), tagged image file format (TIFF), graphics interchange format (GIF), or the like, and supply the data after the conversion (compression) to other processing units and the like.

Note that, for example, the restoration unit 122 may acquire control information regarding the restoration unit 122 supplied via the bus 110, and operate on the basis of the control information.

The associating unit 123 is configured to perform processing related to data association. For example, the associating unit 123 associates data (for example, coefficients and the like) used for the predetermined calculation for generating a restored image with data (detection signals and the like) regarding a detection image supplied from the imaging element 121 or the like.

Here, the term "associate" means that, for example, in processing of one information (data, command, program, and the like), the other information is made to be usable (linkable). That is, the pieces of information associated with each other may be combined into one file or the like, or may be individual pieces of information. For example, information B associated with information A may be transmitted on a transmission path different from that for the information A. Furthermore, for example, the information B associated with the information A may be recorded on a recording medium different from that for the information A (or another recording area of the same recording medium). Note that, this "association" may be for part of information, not the entire information. For example, an image and information corresponding to the image may be associated with each other in an arbitrary unit such as a plurality of frames, one frame, or a portion within a frame.

Furthermore, for example, the associating unit 123 supplies the associated data to other processing units and the like via the bus 110. Note that, for example, the associating unit 123 may acquire control information regarding the associating unit 123 supplied via the bus 110, and operate on the basis of the control information.

The sensor unit 124 is configured to perform processing related to detection. For example, the sensor unit 124 includes an arbitrary sensor, and detects a predetermined parameter. For example, the sensor unit 124 detects a parameter related to a peripheral state of the imaging apparatus 100, a parameter related to a state of the imaging apparatus 100, and the like. For example, the sensor unit 124 detects a parameter related to states of the optical system 120 and the imaging element 121. Furthermore, for example, the sensor unit 124 supplies the detected information to other processing units and the like via the bus 110. Note that, for example, the sensor unit 124 may acquire control information regarding the sensor unit 124 supplied via the bus 110, and operate on the basis of the control information.

Note that, the control unit 101, the input unit 111, the output unit 112, the storage unit 113, the communication unit 114, the recording/reproducing unit 115, the restoration unit 122, the associating unit 123, the sensor unit 124, and the bus 110 may be combined into one as a signal processing unit 125.

<Imaging Element>

Next, the imaging element 121 will be described with reference to FIGS. 2 to 24.

<Pixel and Pixel Output Unit>

In this specification, the present technology will be described by using the term "pixel" (or "pixel output unit"). In this specification, the "pixel" (or "pixel output unit") refers to a division unit including at least one physical configuration capable of receiving light independently from other pixels, of a region (also referred to as a pixel region) in which physical configurations for receiving incident light of the imaging element 121 are formed. The physical configuration capable of receiving light is, for example, a photoelectric conversion element, and is, for example, a photodiode (photo diode (PD)). The number of physical configurations (for example, photodiodes) formed in one pixel is arbitrary, and may be singular or plural. The physical configuration's type, size, shape, and the like are also arbitrary.

Furthermore, in addition to the above-described "physical configuration capable of receiving light", the physical configuration of the "pixel" unit includes all physical configurations related to reception of incident light, for example, an on-chip lens, a light-shielding film, a color filter, a planarization film, an anti-reflection film, and the like. Moreover, a configuration such as a read circuit may be included. That is, the physical configuration of the pixel unit may be any configuration.

Furthermore, a detection signal read from the "pixel" (that is, the physical configuration of the pixel unit) may be referred to as a "detection signal of a pixel unit (or pixel output unit)" or the like. Moreover, the detection signal of the pixel unit (or pixel output unit) is also referred to as a "pixel unit detection signal (or pixel output unit detection signal)". Furthermore, the pixel unit detection signal is also referred to as "pixel output". Moreover, a value of the pixel output is also referred to as "output pixel value".

A value (output pixel value) of a detection signal of a pixel unit of the imaging element 121 can have an incident angle directivity indicating a directivity with respect to an incident angle of incident light from a subject, independently of the others. That is, each pixel unit (pixel output unit) of the imaging element 121 has a configuration in which the incident angle directivity of the output pixel value indicating the directivity with respect to the incident angle of the incident light from the subject is settable independently. For example, in the imaging element 121, output pixel values of at least two pixel units can respectively have different incident angle directivities indicating the directivity with respect to the incident angle of the incident light from the subject.

Note that, as described above, since the number of the "physical configurations capable of receiving light" included in the "pixel (or pixel output unit)" is arbitrary, the pixel unit detection signal may be a detection signal obtained by a single "physical configuration capable of receiving light", or may be a detection signal obtained by a plurality of the "physical configurations capable of receiving light".

Furthermore, a plurality of the pixel unit detection signals (output pixel values) can also be combined into one at an arbitrary stage. For example, output pixel values of a plurality of pixels may be added together in the analog signal state, or may be added together after being converted into digital signals.

Furthermore, after the detection signal is read from the imaging element 121, in other words, in the detection image, a plurality of detection signals can be combined into a single signal, or a single detection signal can be converted into a plurality of signals. That is, the resolution (number of data) of the detection image is variable.

By the way, in the following, for convenience of description, a description will be given assuming that the imaging element 121 includes a pixel region in which a plurality of pixels is arranged in a matrix (a pixel array is formed), unless otherwise specified. Note that, the arrangement pattern of pixels (or pixel output units) of the imaging element 121 is arbitrary, and is not limited to this example. For example, the pixels (or pixel output units) may be arranged in a honeycomb structure. Furthermore, for example, the pixels (or pixel output units) may be arranged in one row (or one column). That is, the imaging element 121 may be a line sensor.

Note that, the wavelength range in which the imaging element 121 (pixels thereof) has sensitivity is arbitrary. For example, the imaging element 121 (pixels thereof) may have sensitivity to visible light, may have sensitivity to invisible light such as infrared light or ultraviolet light, or may have sensitivity to both visible light and invisible light. For example, in a case where the imaging element detects far-infrared light that is invisible light, a thermograph (an image representing a heat distribution) can be generated by using a captured image obtained in the imaging element. However, in the case of an imaging element with an imaging lens, glass is difficult to transmit far-infrared light, so that an imaging lens including an expensive special material is required, and there is a possibility that manufacturing costs increase. Since the imaging element 121 can image a subject without using an imaging lens and the like and obtain data regarding the captured image, an increase in manufacturing costs can be suppressed by enabling the pixel to detect far-infrared light. That is, imaging of far-infrared light can be performed at lower cost (a thermograph can be obtained at lower cost). Note that, in a case where the imaging element 121 (pixels thereof) has sensitivity to invisible light, the restored image does not become an image in which the user can visually recognize the subject but becomes an image in which the user cannot visually recognize the subject. In other words, the restored image may be an image of visible light, or may be an image of invisible light (for example, (far) infrared light, ultraviolet light, or the like).

<Incident Angle Directivity>

The imaging element 121 includes a plurality of pixel output units that receives incident light entering without passing through either an imaging lens or a pinhole, and each outputs one detection signal indicating an output pixel value modulated by an incident angle of the incident light. For example, the imaging element 121 has a configuration for causing incident angle directivities each indicating the directivity with respect to the incident angle of the incident light from the subject of output pixel values of at least two pixel output units among the plurality of pixel output units to be different characteristics from each other. That is, in that case, the imaging element 121 can obtain detection signals for the plurality of pixel output units (a plurality of pixel output unit detection signals), and incident angle directivities each indicating the directivity with respect to the incident angle of the incident light from the subject of at least two pixel output unit detection signals among the plurality of pixel output unit detection signals are different from each other.

Here, "incident angle directivity" refers to a light-receiving sensitivity characteristic depending on an incident angle of incident light, in other words, detection sensitivity with respect to the incident angle of the incident light. For example, even when incident light has the same light intensity, the detection sensitivity may change depending on the incident angle. Such a deviation in detection sensitivity (including a case where there is no deviation) is referred to as "incident angle directivity".

For example, when incident light beams having the same light intensity as each other enter physical configurations of the two pixel output units at the same incident angle as each other, signal levels (detection signal levels) of detection signals of the pixel output units can be different values from each other. The imaging element 121 (each pixel output unit thereof) has a physical configuration having such a feature.

The incident angle directivity may be realized by any method. For example, the incident angle directivity may be realized by providing a light-shielding film, for example, in front (light incident side) of a photoelectric conversion element (photodiode or the like) of an imaging element having a basic structure similar to that of, for example, a general complementary metal oxide semiconductor (CMOS) image sensor or the like.

When imaging is performed only with a general imaging element including pixels having the same incident angle directivity as each other, light beams of substantially the same light intensity enter all pixels of the imaging element, and an image of the subject formed cannot be obtained. Thus, in general, an imaging lens or a pinhole is provided in front (light incident side) of the imaging element. For example, by providing the imaging lens, light from the subject surface can be formed as the image on the imaging surface of the imaging element to reproduce the light intensity of the subject surface. Thus, the imaging element can obtain a detection signal of a level corresponding to the image of the subject formed at each pixel (that is, a captured image of the subject formed can be obtained). However, in this case, the size is physically increased, and there has been a possibility that downsizing of the apparatus becomes difficult. Furthermore, in a case where the pinhole is provided, downsizing becomes possible as compared with the case where the imaging lens is provided, but the amount of light entering the imaging element is reduced, so that measures are essential such as increasing the exposure time or increasing the gain, and there has been a possibility that blurring is likely to occur in imaging of a high-speed subject, or natural color expression is lost.

Figure 2:
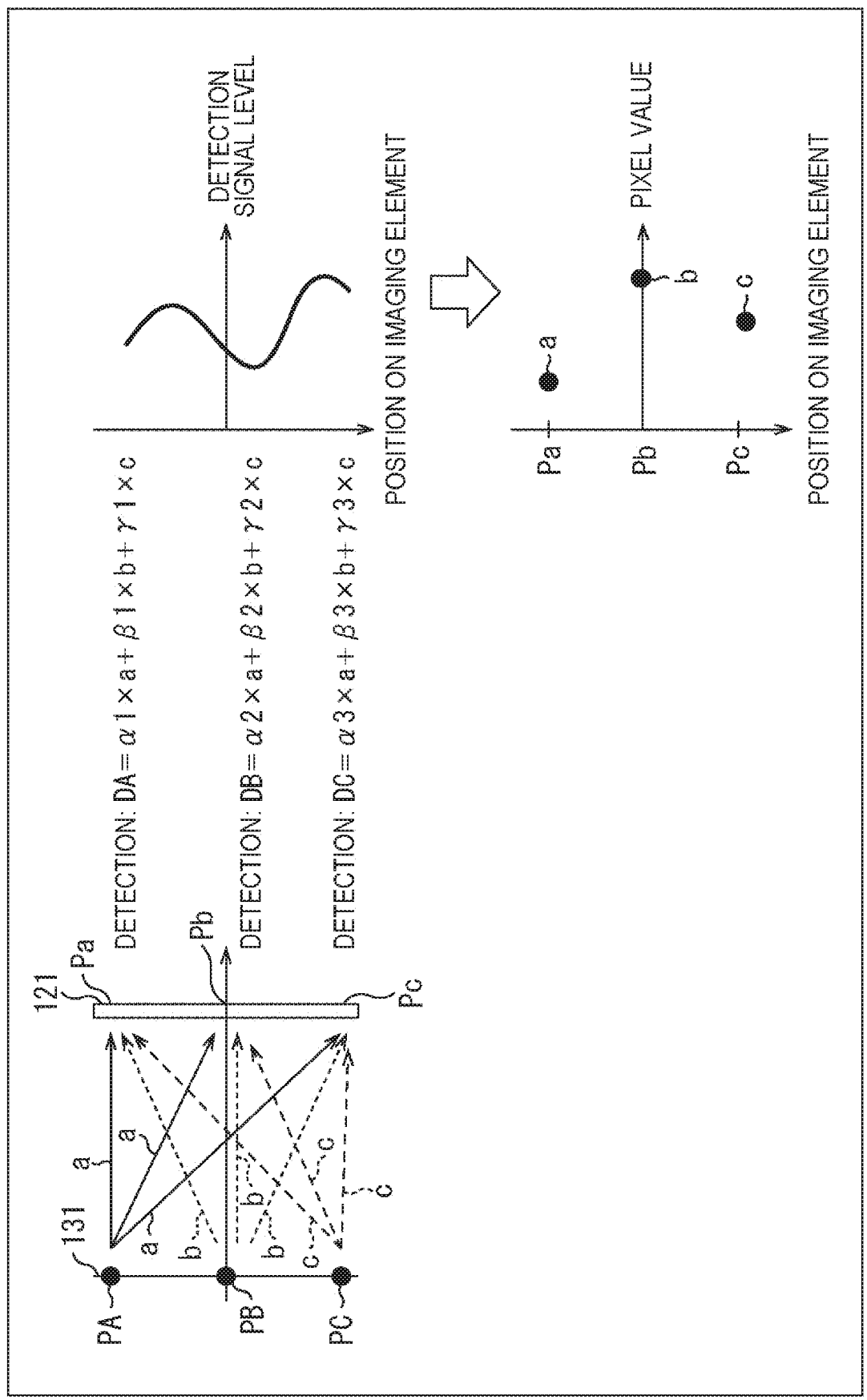
FIG. 2 is a diagram illustrating the principle of imaging in an imaging apparatus to which the technology according to the present disclosure is applied.

On the other hand, the imaging element 121 has incident angle directivity in which detection sensitivities of the respective pixels are different from each other, as illustrated in the upper left part of FIG. 2. That is, the light-receiving sensitivity characteristic depending on the incident angle of incident light is different for each pixel. However, it is not necessary that the light-receiving sensitivity characteristics of all the pixels are completely different from each other, and some pixels may have the same light-receiving sensitivity characteristic, and some pixels may have different light-receiving sensitivity characteristics.

In a case where it is assumed that a light source constituting a subject surface 131 is a point light source, in the imaging element 121, light beams having the same light intensity emitted from the same point light source are incident on all pixels, but incident at different incident angles on respective pixels. Then, since the pixels of the imaging element 121 respectively have incident angle directivities different from each other, the light beams having the same light intensity are detected with respective sensitivities different from each other. That is, a detection signal is detected having a different signal level for each pixel.

In more detail, the sensitivity characteristic depending on the incident angle of the incident light received at each pixel of the imaging element 121, in other words, the incident angle directivity depending on the incident angle at each pixel is expressed by a coefficient representing light-receiving sensitivity depending on the incident angle, and the signal level of the detection signal depending on the incident light in each pixel (also referred to as a detection signal level) is obtained by multiplication by a coefficient set corresponding to the light-receiving sensitivity depending on the incident angle of the incident light.

More specifically, as illustrated in the upper left part of FIG. 2, detection signal levels DA, DB, and DC at positions Pa, Pb, and Pc are expressed by the following equations (1) to (3), respectively.

$$DA = \alpha1 \times a + \beta1 \times b + \gamma1 \times c \quad (1)$$

$$DB = \alpha2 \times a + \beta2 \times b + \gamma2 \times c \quad (2)$$

$$DC = \alpha3 \times a + \beta3 \times b + \gamma3 \times c \quad (3)$$

Here, $\alpha1$ is a coefficient set depending on an incident angle of a light beam from a point light source PA on the subject surface 131 to be restored at the position Pa on the imaging element 121. Furthermore, $\beta1$ is a coefficient set depending on an incident angle of a light beam from a point light source PB on the subject surface 131 to be restored at the position Pa on the imaging element 121. Moreover, $\gamma1$ is a coefficient set depending on an incident angle of a light beam from a point light source PC on the subject surface 131 to be restored at the position Pa on the imaging element 121.

As indicated in the equation (1), the detection signal level DA at the position Pa is expressed by the sum (composite value) of a product of a light intensity "a" of the light beam from the point light source PA at the position Pa and the coefficient $\alpha1$, a product of a light intensity "b" of the light beam from the point light source PB at the position Pa and the coefficient $\beta1$, and a product of a light intensity "c" of the light beam from the point light source PC at the position Pa and the coefficient $\gamma1$. In the following, coefficients $\alpha x$, $\beta x$, and $\gamma x$ (x is a natural number) are collectively referred to as a coefficient set.

Similarly, a coefficient set $\alpha2$, $\beta2$, and $\gamma2$ of the equation (2) is a set of coefficients that is set depending on incident angles of light beams from the point light sources PA, PB, PC on the subject surface 131 to be restored at the position Pb on the imaging element 121. That is, as in the above-described equation (2), the detection signal level DB at the position Pb is expressed by the sum (composite value) of a product of the light intensity "a" of the light beam from the point light source PA at the position Pb and the coefficient $\alpha2$, a product of the light intensity "b" of the light beam from the point light source PB at the position Pb and the coefficient $\beta2$, and a product of the light intensity "c" of the light beam from the point light source PC at the position Pb and the coefficient $\gamma2$. Furthermore, coefficients $\alpha3$, $\beta3$, and $\gamma3$ in the equation (3) are a set of coefficients that is set depending on incident angles of light beams from the point light sources PA, PB, and PC on the subject surface 131 to be restored at the position Pc on the imaging element 121. That is, as in the above-described equation (3), the detection signal level DC at the position Pc is expressed by the sum (composite value) of a product of the light intensity "a" of the light beam from the point light source PA at the position Pc and the coefficient $\alpha3$, a product of the light intensity "b" of the light beam from the point light source PB at the position Pc and the coefficient $\beta3$, and a product of the light intensity "c" of the light beam from the point light source PC at the position Pc and the coefficient $\gamma3$.

As described above, these detection signal levels are different from those in which the subject image is formed since the light intensities of the light beams emitted from the point light sources PA, PB, and PC are mixed. That is, the detection signal level illustrated in the upper right part of FIG. 2 is not the detection signal level corresponding to the image (captured image) in which the subject image is formed, so that the detection signal level is different from the pixel value illustrated in the lower right part of FIG. 2 (generally they do not match).

However, by configuring simultaneous equations using the coefficient set α1, β1, and γ1, coefficient set α2, β2, and γ2, coefficient set α3, β3, and γ3, and detection signal levels DA, DB, and DC, and solving the simultaneous equations of the above-described equations (1) to (3) using a, b, and c as variables, it is possible to obtain the pixel values at the respective positions Pa, Pb, and Pc as illustrated in the lower right part of FIG. 2. As a result, a restored image is restored that is a set of pixel values (an image in which the subject image is formed).

With such a configuration, the imaging element 121 has incident angle directivities different from each other in at least two pixel output units, without requiring an imaging lens that guides light from the subject surface to each pixel of the imaging element so that the light intensity of the subject surface is reproduced, an optical filter including a diffraction grating or the like, a pinhole, or the like. As a result, the imaging lens, the optical filter including the diffraction grating or the like, the pinhole, or the like is not an essential configuration, so that it is possible to reduce the height of the imaging apparatus, in other words, to reduce the thickness in the light incident direction in a configuration that realizes an imaging function.

<Formation of Incident Angle Directivity>

Figure 3:
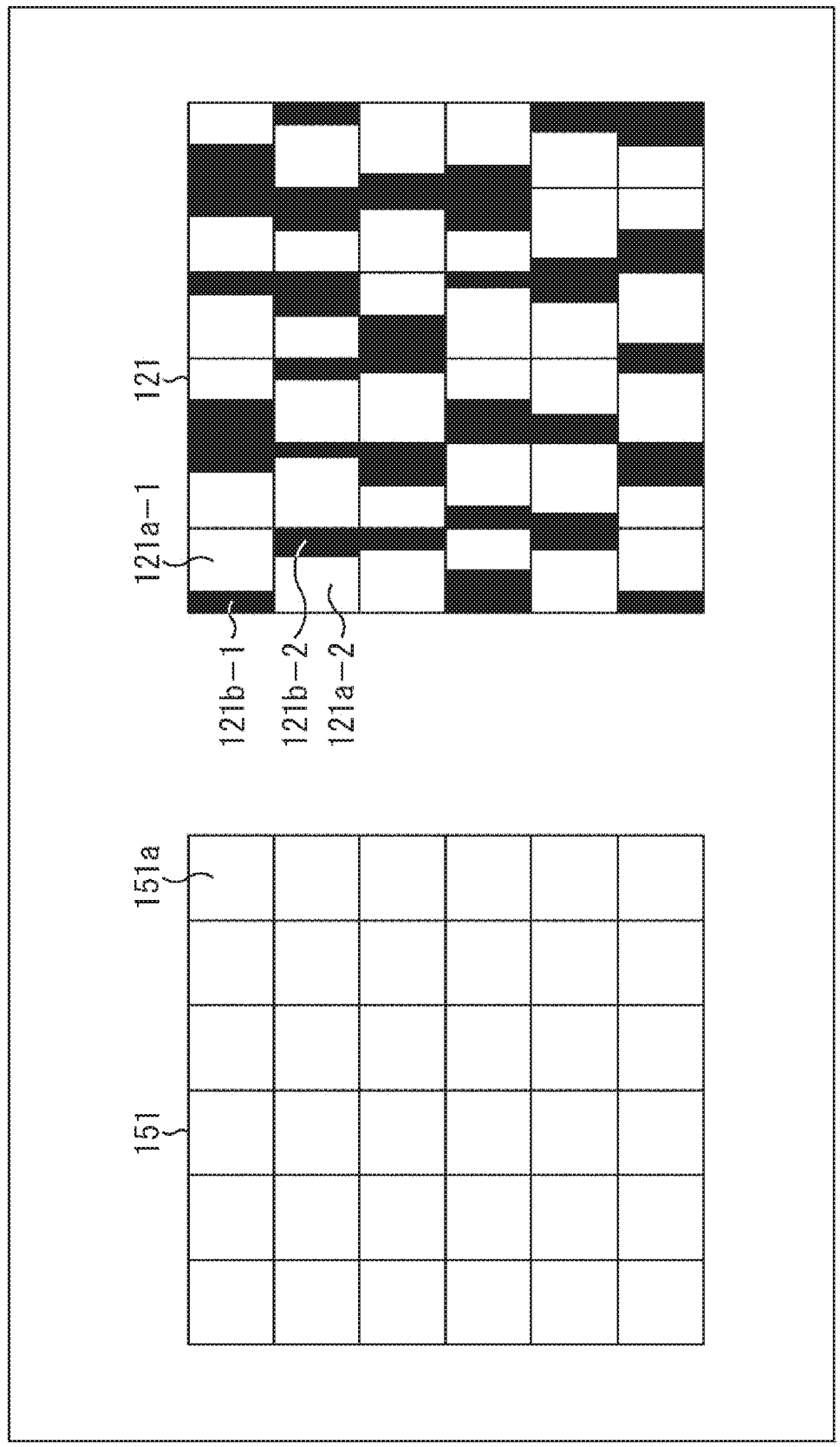
FIG. 3 is a diagram illustrating a difference in configuration between a conventional imaging element and an imaging element according to the present disclosure.

The left part of FIG. 3 illustrates a front view of a part of a pixel array unit of a general imaging element, and the right part of FIG. 3 illustrates a front view of a part of a pixel array unit of the imaging element 121. Note that, FIG. 3 illustrates an example in which the pixel array unit has a configuration in which the number of pixels in the horizontal direction x vertical direction is 6 pixels×6 pixels; however, the configuration of the number of pixels is not limited to this.

The incident angle directivity can be formed by a light-shielding film, for example. As illustrated in the example of the left part of FIG. 3, in a general imaging element 151, pixels 151*a* having the same incident angle directivity are arranged in an array. On the other hand, the imaging element 121 in the example of the right part of FIG. 3 is provided with a light-shielding film 121*b* that is one of modulation elements to cover a part of the light-receiving region of the photodiode for each of pixels 121*a*, and incident light entering each pixel 121*a* is optically modulated depending on an incident angle. Then, for example, by providing the light-shielding film 121*b* in a different range for each pixel 121*a*, the light-receiving sensitivity with respect to the incident angle of the incident light differs for each pixel 121*a*, and each pixel 121*a* has a different incident angle directivity.

For example, a pixel 121*a*-1 and a pixel 121*a*-2 have different ranges of pixels shielded by a light-shielding film 121*b*-1 and a light-shielding film 121*b*-2 provided (at least one of light-shielding region (position) or light-shielding area differs). In other words, in the pixel 121*a*-1, the light-shielding film 121*b*-1 is provided to shield a part of the left side in the light-receiving region of the photodiode by a predetermined width, and in the pixel 121*a*-2, the light-shielding film 121*b*-2 is provided to shield a part of the right side in the light-receiving region by a width wider in the horizontal direction than the light-shielding film 121*b*-1. Similarly, in the other pixels 121*a*, the light-shielding film 121*b* is provided so that a different range in the light-receiving region is shielded for each pixel, and is randomly arranged in the pixel array.

Note that, since the amount of light that can be received decreases as the ratio of covering the light-receiving region of each pixel increases, the range of the light-shielding film 121*b* is desirably set to an area that can secure a desired amount of light, and the area of the light-shielding film 121*b* may be configured with a limitation, for example, up to about ¾ of a range capable of receiving light at most. In this way, it becomes possible to secure the amount of light of greater than or equal to the desired amount. However, if an unshielded range is provided having a width corresponding to the wavelength of light to be received, for each pixel, it is possible to receive a minimum amount of light. In other words, for example, in the case of a blue pixel (B pixel), the wavelength is about 500 nm, and it is possible to receive the minimum amount of light if the pixel is not shielded from light of greater than or equal to a width corresponding to this wavelength.

<Configuration Example of Imaging Element>

Figure 4:
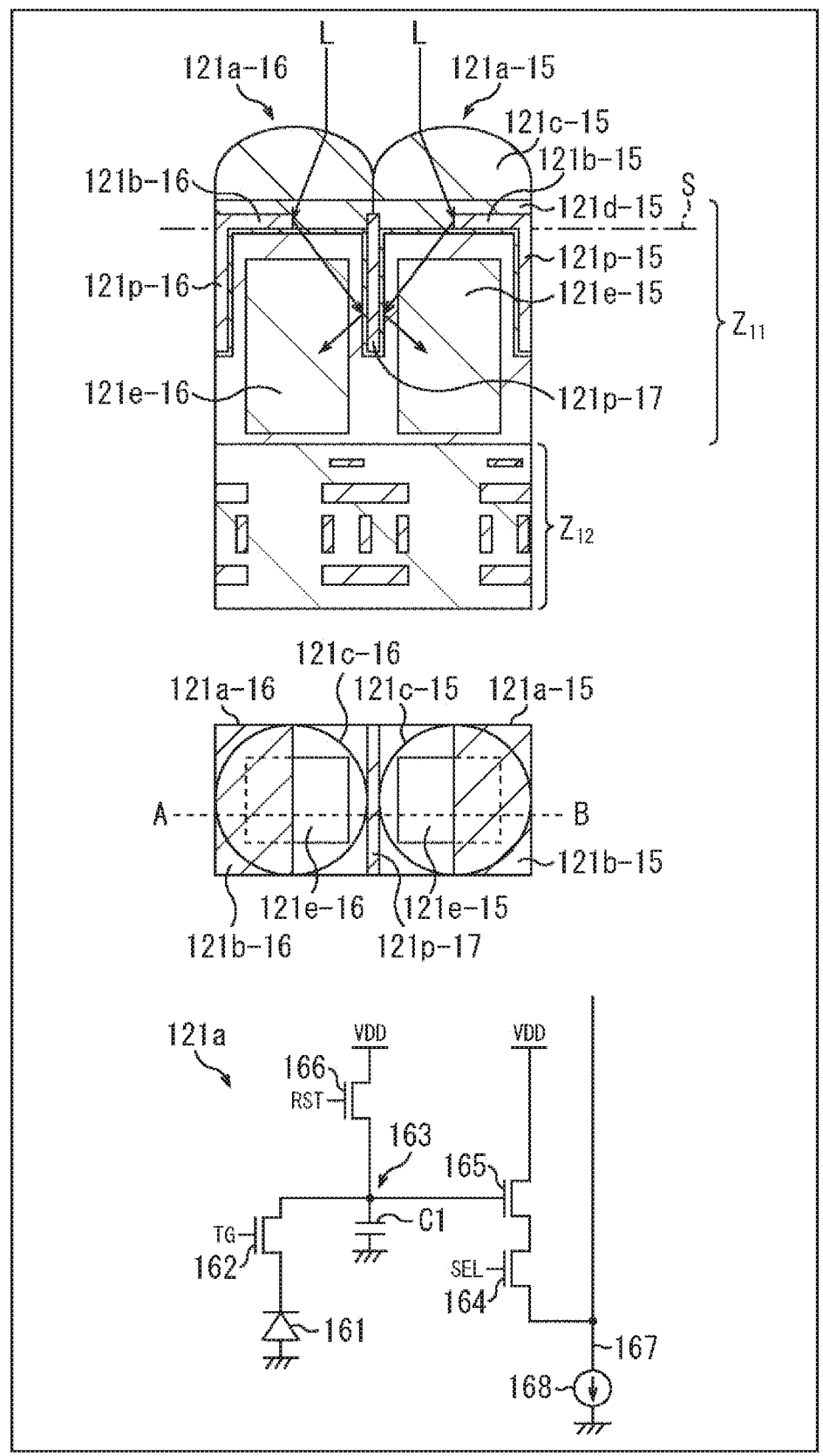
FIG. 4 is a diagram illustrating a first configuration example of the imaging element.

With reference to FIG. 4, a configuration example will be described of the imaging element 121 in this case. The upper part of FIG. 4 is a side cross-sectional view of the imaging element 121, and the middle part of FIG. 4 is a top view of the imaging element 121. Furthermore, the side cross-sectional view in the upper part of FIG. 4 is an AB cross section in the middle part of FIG. 4. Moreover, the lower part of FIG. 4 is a circuit configuration example of the imaging element 121.

The imaging element 121 having the configuration illustrated in FIG. 4 includes a plurality of pixel output units that receives incident light entering without passing through either an imaging lens or a pinhole, and each outputs one detection signal indicating an output pixel value modulated by an incident angle of the incident light. For example, the imaging element 121 has a configuration for causing incident angle directivities each indicating the directivity with respect to the incident angle of the incident light from the subject of output pixel values of at least two pixel output units among the plurality of pixel output units to be different characteristics from each other. Furthermore, in this case, in the imaging element 121, the plurality of pixel output units has a configuration in which an incident angle directivity indicating the directivity with respect to the incident angle of the incident light from the subject is settable independently for each of the pixel output units.

In the imaging element 121 in the upper part of FIG. 4, the incident light enters from the upper side to the lower side in the figure. Adjacent pixels 121*a*-15 and 121*a*-16 are of a so-called back-illuminated type in which a wiring layer Z12 is provided in the lowermost layer in the figure, and a photoelectric conversion layer Z11 is provided thereon.

Note that, in a case where it is not necessary to distinguish the pixels 121*a*-15 and 121*a*-16, the pixels 121*a*-15 and 121*a*-16 are simply referred to as the pixel 121*a*, and the other configurations are also referred to similarly. Furthermore, FIG. 4 illustrates a side view and a top view of two pixels constituting the pixel array of the imaging element 121; however, needless to say, a larger number of pixels 121*a* are arranged but illustration thereof is omitted.

Moreover, the pixels 121*a*-15 and 121*a*-16 include photodiodes 121*e*-15 and 121*e*-16 in the photoelectric conversion layer Z11, respectively. Furthermore, on the photodiodes 121e-15 and 121e-16, on-chip lenses 121c-15 and 121c-16, and color filters 121d-15 and 121d-16 are formed from above, respectively.

The on-chip lenses 121c-15 and 121c-16 focus the incident light on the photodiodes 121e-15 and 121e-16.

The color filters 121d-15 and 121d-16 are, for example, optical filters that transmit light of specific wavelengths such as red, green, blue, infrared, and white. Note that, in the case of white, the color filters 121d-15 and 121d-16 may be transparent filters, or do not have to exist.

In the photoelectric conversion layer Z11 of the pixels 121a-15 and 121a-16, light-shielding films 121p-15 to 121p-17 are respectively formed at boundaries between pixels, and crosstalk between adjacent pixels is suppressed.

Furthermore, the light-shielding films 121b-15 and 121b-16, which are one of the modulation elements, shield a part of a light-receiving surface S as illustrated in the upper part and the middle part of FIG. 4. A part of the light-receiving surface S is shielded by the light-shielding film 121b, whereby the incident light entering the pixel 121a is optically modulated depending on the incident angle. Since the pixel 121a detects the optically modulated incident light, the pixel 121a has an incident angle directivity. On the light-receiving surface S of the photodiodes 121e-15 and 121e-16 in the pixels 121a-15 and 121a-16, different ranges are respectively shielded by the light-shielding films 121b-15 and 121b-16, whereby a different incident angle directivity is set for each pixel. However, not limited to a case where the ranges shielded from light are different from each other in all the pixels 121a of the imaging element 121, some pixels 121a may exist in which the same range is shielded from light.

With the configuration illustrated in the upper part of FIG. 4, the right end of the light-shielding film 121p-15 and the upper end of the light-shielding film 121b-15 are connected together, and the left end of the light-shielding film 121b-16 and the upper end of the light-shielding film 121p-16 are connected together, and they are configured to have an L shape when viewed from the side.

Moreover, the light-shielding films 121b-15 to 121b-17 and the light-shielding films 121p-15 to 121p-17 include metal, for example, tungsten (W), aluminum (Al), or an alloy of Al and copper (Cu). Furthermore, the light-shielding films 121b-15 to 121b-17 and the light-shielding films 121p-15 to 121p-17 may be formed at the same time with the same metal as wiring, in the same process as a process of forming wiring in a semiconductor process. Note that, the film thicknesses of the light-shielding films 121b-15 to 121b-17 and the light-shielding films 121p-15 to 121p-17 do not have to be the same depending on the position.

Furthermore, as illustrated in the lower part of FIG. 4, the pixel 121a includes a photodiode 161 (corresponding to the photodiode 121e), a transfer transistor 162, a floating diffusion (FD) portion 163, a selection transistor 164, an amplification transistor 165, and a reset transistor 166, and is connected to a current source 168 via a vertical signal line 167.

The photodiode 161 is configured such that the anode electrode is individually grounded, and the cathode electrode is individually connected to the gate electrode of the amplification transistor 165 via the transfer transistor 162.

The transfer transistors 162 are individually driven in accordance with a transfer signal TG. For example, when the transfer signal TG supplied to the gate electrode of the transfer transistor 162 becomes the high level, the transfer transistor 162 is turned on. Therefore, charges accumulated in the photodiode 161 are transferred to the FD portion 163 via the transfer transistor 162.

The amplification transistor 165 is an input unit of a source follower that is a read circuit that reads a signal obtained by photoelectric conversion in the photodiode 161, and outputs a pixel signal of a level corresponding to the charges accumulated in the FD portion 163 to the vertical signal line 23. In other words, the amplification transistor 165, in which a drain terminal is connected to a power supply voltage VDD and a source terminal is connected to the vertical signal line 167 via the selection transistor 164, configures the source follower together with the current source 168 connected to one end of the vertical signal line 167.

The floating diffusion (FD) portion 163 is a floating diffusion region including a charge capacitance C1 provided between the transfer transistor 162 and the amplification transistor 165, and temporarily accumulates the charges transferred from the photodiode 161 via the transfer transistor 162. The FD portion 163 is a charge detection unit that converts charges into a voltage, and the charges accumulated in the FD portion 163 are converted into a voltage in the amplification transistor 165.

The selection transistor 164 is driven in accordance with a selection signal SEL, and is turned on when the selection signal SEL supplied to the gate electrode becomes the high level, and connects the amplification transistor 165 and the vertical signal line 167 together.

The reset transistor 166 is driven in accordance with a reset signal RST. For example, the reset transistor 166 is turned on when the reset signal RST supplied to the gate electrode becomes the high level, discharges the charges accumulated in the FD portion 163 to the power supply voltage VDD, and resets the FD portion 163.

With the circuit configuration described above, the pixel circuit illustrated in the lower part of FIG. 4 operates as follows.

In other words, as the first operation, the reset transistor 166 and the transfer transistor 162 are turned on, the charges accumulated in the FD portion 163 are discharged to the power supply voltage VDD, and the FD portion 163 is reset.

As the second operation, the reset transistor 166 and the transfer transistor 162 are turned off, and an exposure period is started, and charges corresponding to the amount of light of the incident light are accumulated by the photodiode 161.

As the third operation, the reset transistor 166 is turned on and the FD portion 163 is reset, and then the reset transistor 166 is turned off. By this operation, the FD portion 163 is reset, and set to a reference potential.

As the fourth operation, the potential of the FD portion 163 in a reset state is output from the amplification transistor 165 as the reference potential.

As the fifth operation, the transfer transistor 162 is turned on, and the charges accumulated in the photodiode 161 are transferred to the FD portion 163.

As the sixth operation, the potential of the FD portion 163 to which the charges of the photodiode are transferred is output from the amplification transistor 165 as a signal potential.

Through the above processing, the reference potential is subtracted from the signal potential, and is output as a detection signal by correlated double sampling (CDS). A value of the detection signal (output pixel value) is modulated depending on the incident angle of the incident light from the subject, and the characteristic (directivity) varies depending on the incident angle (has incident angle directivity).

As described above, the pixel 121a in the case of FIG. 4 is provided with one photodiode 121e for each pixel, and a different range for each pixel 121a is shielded by the light-shielding film 121b, and by optical modulation using the light-shielding film 121b, a detection signal for one pixel of a detection image having incident angle directivity can be expressed by one pixel 121a.

<Other Configuration Examples of Imaging Elements>

Furthermore, the incident angle directivity can be formed by, for example, the position, size, shape, and the like in a pixel of a light receiving element (for example, a photodiode). Pixels having different parameters have different sensitivities to incident light having the same light intensity from the same direction. That is, by setting these parameters for each pixel, the incident angle directivity can be set for each pixel.

For example, a plurality of light receiving elements (for example, photodiodes) may be provided in a pixel and used selectively. In this way, the incident angle directivity can be set for each pixel by selection of the light receiving element.

Figure 5:
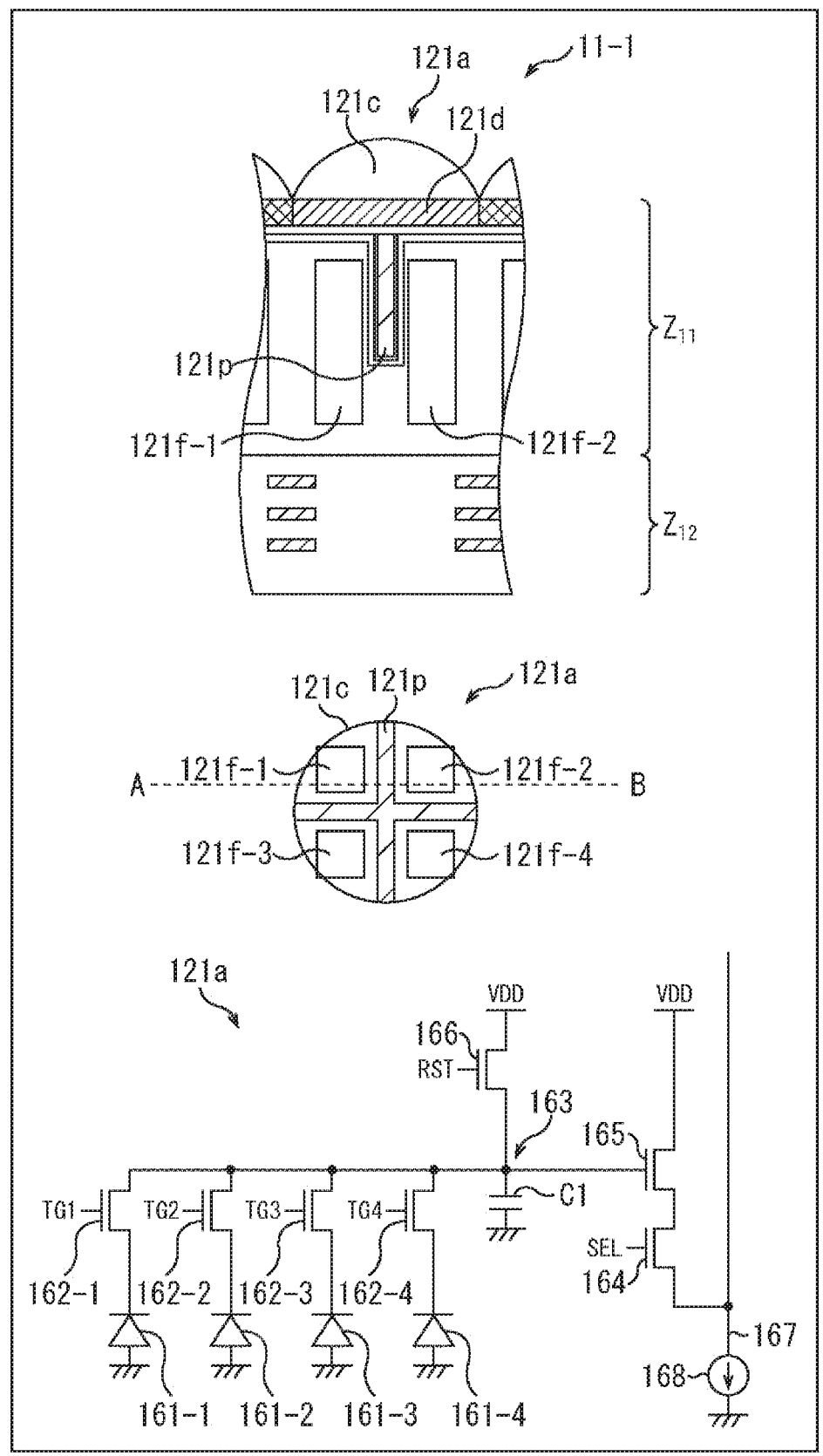
FIG. 5 is a diagram illustrating the first configuration example of the imaging element.

FIG. 5 is a diagram illustrating another configuration example of the imaging element 121. The upper part of FIG. 5 illustrates a side cross-sectional view of the pixel 121a of the imaging element 121, and the middle part of FIG. 5 illustrates a top view of the imaging element 121. Furthermore, the side cross-sectional view of the upper part of FIG. 5 is an AB cross section in the middle part of FIG. 5. Moreover, the lower part of FIG. 5 is a circuit configuration example of the imaging element 121.

The imaging element 121 having the configuration illustrated in FIG. 5 includes a plurality of pixel output units that receives incident light entering without passing through either an imaging lens or a pinhole, and each outputs one detection signal indicating an output pixel value modulated by an incident angle of the incident light. For example, the imaging element 121 has a configuration for causing incident angle directivities each indicating the directivity with respect to the incident angle of the incident light from the subject of output pixel values of at least two pixel output units among the plurality of pixel output units to be different characteristics from each other. Furthermore, in the imaging element 121 of this case, the plurality of pixel output units can set the incident angle directivity of the output pixel value indicating the directivity with respect to the incident angle of the incident light from the subject independently for each pixel output unit, by making photo diodes (PDs) that contribute to output different from each other.

As illustrated in FIG. 5, the imaging element 121 has a configuration different from that of the imaging element 121 of FIG. 5 in that four photodiodes 121f-1 to 121f-4 are formed in the pixel 121a, and a light-shielding film 121p is formed in a region that separates the photodiodes 121f-1 to 121f-4 from each other. In other words, in the imaging element 121 of FIG. 5, the light-shielding film 121p is formed in a "+" shape when viewed from the top. Note that, common components are denoted by the same reference signs, and a detailed description thereof will be omitted.

In the imaging element 121 configured as illustrated in FIG. 5, the photodiodes 121f-1 to 121f-4 are separated by the light-shielding film 121p, whereby an electrical and optical crosstalk between the photodiodes 121f-1 to 121f-4 can be prevented. In other words, similarly to the light-shielding film 121p of the imaging element 121 of FIG. 4, the light-shielding film 121p of FIG. 5 is for preventing the crosstalk, and is not for providing the incident angle directivity.

Although details will be described later, the photodiodes 121f-1 to 121f-4 have different incident angles at which the light-receiving sensitivity characteristics increase. That is, a desired incident angle directivity can be given to the output pixel value of the pixel 121a depending on which of the photodiodes 121f-1 to 121f-4 is used to read charges. That is, it is possible to control the incident angle directivity of the output pixel value of the pixel 121a.

In the configuration example of the imaging element 121 of FIG. 5, one FD portion 163 is shared by four photodiodes 121f-1 to 121f-4. The lower part of FIG. 5 illustrates a circuit configuration example in which one FD portion 163 is shared by four photodiodes 121f-1 to 121f-4. Note that, in the lower part of FIG. 5, descriptions will be omitted of the same components as those of the lower part of FIG. 4.

The lower part of FIG. 5 differs from the circuit configuration of the lower part of FIG. 4 in that photodiodes 161-1 to 161-4 (corresponding to photodiodes 121f-1 to 121f-4 in the upper part of FIG. 5) and transfer transistors 162-1 to 162-4 are provided instead of the photodiode 161 and the transfer transistor 162, and the FD portion 163 is shared.

In the circuit illustrated in the lower part of FIG. 5, the photodiodes 161-1 to 161-4 are referred to as the photodiode 161 in a case where it is not necessary to distinguish them from each other. Furthermore, the transfer transistors 162-1 to 162-4 are referred to as the transfer transistors 162 in a case where it is not necessary to distinguish them from each other.

In the circuit illustrated in the lower part of FIG. 5, when any of the transfer transistors 162 is turned on, the charges of the photodiode 161 corresponding to the transfer transistor 162 is read, and transferred to the common FD portion 163. Then, a signal corresponding to a level of the charges held in the FD portion 163 is read as a detection signal in a pixel output unit. That is, the charges of each photodiode 161 can be read independently of each other, and it is possible to control which of the photodiodes 161 is used to read the charges depending on which transfer transistor 162 is turned on. In other words, it is possible to control the degree of contribution to the output pixel value by each photodiode 161 depending on which transfer transistor 162 is turned on. For example, the photodiodes 161 that contribute to the output pixel value can be made different from each other by making the photodiodes 161 that read the charges different from each other between at least two pixels. That is, by selection of the photodiode 161 that reads the charges, a desired incident angle directivity can be given to the output pixel value of the pixel 121a. That is, the detection signal output from each pixel 121a can be a value (output pixel value) modulated depending on the incident angle of the incident light from the subject.

For example, in FIG. 5, the charges of the photodiodes 121f-1 and 121f-3 are transferred to the FD portion 163, and the signals obtained by reading them are added together, whereby incident angle directivity in the horizontal direction in the figure can be given to the output pixel value of the pixel 121a. Similarly, the charges of the photodiode 121f-1 and the photodiode 121f-2 are transferred to the FD portion 163, and the signals obtained by reading them are added together, whereby incident angle directivity in the vertical direction in the figure can be given to the output pixel value of the pixel 121a Note that, the signals obtained on the basis of the charges of respective photodiodes 121f of the pixel 121a of FIG. 5 may be added together after being read from the pixel, or may be added together within the pixel (for example, the FD portion 163).

Furthermore, the combination is arbitrary of the photodiodes 121*f* for adding the charges (or the signals corresponding to the charges) together, and is not limited to the above example. For example, the charges (or the signals corresponding to the charges) of three or more photodiodes 121*f* may be added together. Furthermore, for example, the charges of one photodiode 121*f* may be read without performing addition.

Note that, for example, by resetting detection values (charges) accumulated in the photodiode 161 (photodiode 121*f*) by using the electronic shutter function before reading the charges to the FD portion 163, a desired incident angle directivity may be given to the pixel 121*a* (detection sensitivity thereof).

For example, in a case where the electronic shutter function is used, if the reset of the charges of the photodiode 121*f* is performed immediately before the reading to the FD portion 163, the photodiode 121*f* can be made to have no contribution to the detection signal level of the pixel 121*a*, and if a time is given between resetting and reading to the FD portion 163, a partial contribution can be made.

As described above, each of the pixels 121*a* of FIG. 5 includes four photodiodes 121*f*, and, although the light-shielding film 121*b* is not formed on the light-receiving surface, is divided into a plurality of regions by the light-shielding film 121*p*, and the four photodiodes 121*f*-1 to 121*f*-4 are formed, and expresses a detection signal for one pixel of a detection image having incident angle directivity. In other words, for example, a range that does not contribute to output among the photodiodes 121*f*-1 to 121*f*-4 functions similarly to a region shielded from light, and expresses a detection signal for one pixel of a detection image having incident angle directivity. Note that, in a case where the detection signal for one pixel is expressed by using the photodiodes 121*f*-1 to 121*f*-4, since the light-shielding film 121*b* is not used, the detection signal is not a signal obtained by optical modulation.

In the above, an example has been described in which four photodiodes are arranged in a pixel; however, the number of photodiodes arranged in the pixel is arbitrary and is not limited to the above example. That is, the number of partial regions is also arbitrary in which the photodiodes are arranged in the pixel.

Furthermore, in the above description, the photodiodes are arranged in four partial regions obtained by equally dividing the inside of the pixel into four regions; however, the partial regions do not have to be equally divided. That is, the sizes and shapes of the partial regions do not have to be unified (partial regions having different sizes and shapes may be included). Alternatively, the position (position in the partial region), size, shape, and the like of the photodiodes arranged in each partial region may be different for each photodiode (for each partial region). At that time, the sizes and shapes of the partial regions may be all unified or may not be unified.

Moreover, these parameters do not have to be unified for all the pixels of the imaging element 121. That is, in one or more pixels of the imaging element 121, one or more of these parameters may be different from those of other pixels.

For example, the pixel group of the imaging element 121 may include a pixel in which a division position for forming the partial region in which the photodiode is arranged in the pixel is different from that of other pixels. That is, the imaging element 121 may include one or more pixels whose partial regions have different sizes and shapes from those of other pixels. For example, by making the division position different for each pixel, even if only the upper left photodiode is used in a plurality of pixels, the incident angle directivity of the detection signal detected in each of the plurality of pixels can be made different from each other.

Furthermore, for example, the pixel group of the imaging element 121 may include a pixel in which the position, size, shape, and the like of a plurality of photodiodes arranged in the pixel are different from those of other pixels. That is, the imaging element 121 may include one or more pixels in which at least one of the position, size, or shape of the plurality of photodiodes arranged is different from that of other pixels. For example, by making the position, size, shape, and the like of the photodiode different for each pixel, even if only the upper left photodiode is used in a plurality of pixels, the incident angle directivity of the detection signal detected in each of the plurality of pixels can be made different from each other.

Moreover, for example, one or more pixels may be included in which both the parameters (size, shape) of the partial region and the parameters (position, size, shape) of the photodiode are different from those of other pixels.

Furthermore, for example, the pixel group of the imaging element 121 may include a pixel in which the number of divisions for forming the partial region in which the photodiode is arranged in the pixel is different from that of other pixels. That is, the imaging element 121 may include one or more pixels in which the number of photodiodes arranged is different from that of other pixels. For example, by making the number of divisions (the number of photodiodes) different for each pixel, the incident angle directivity can be set more freely.

<Principle of Causing Incident Angle Directivity>

Figure 6:
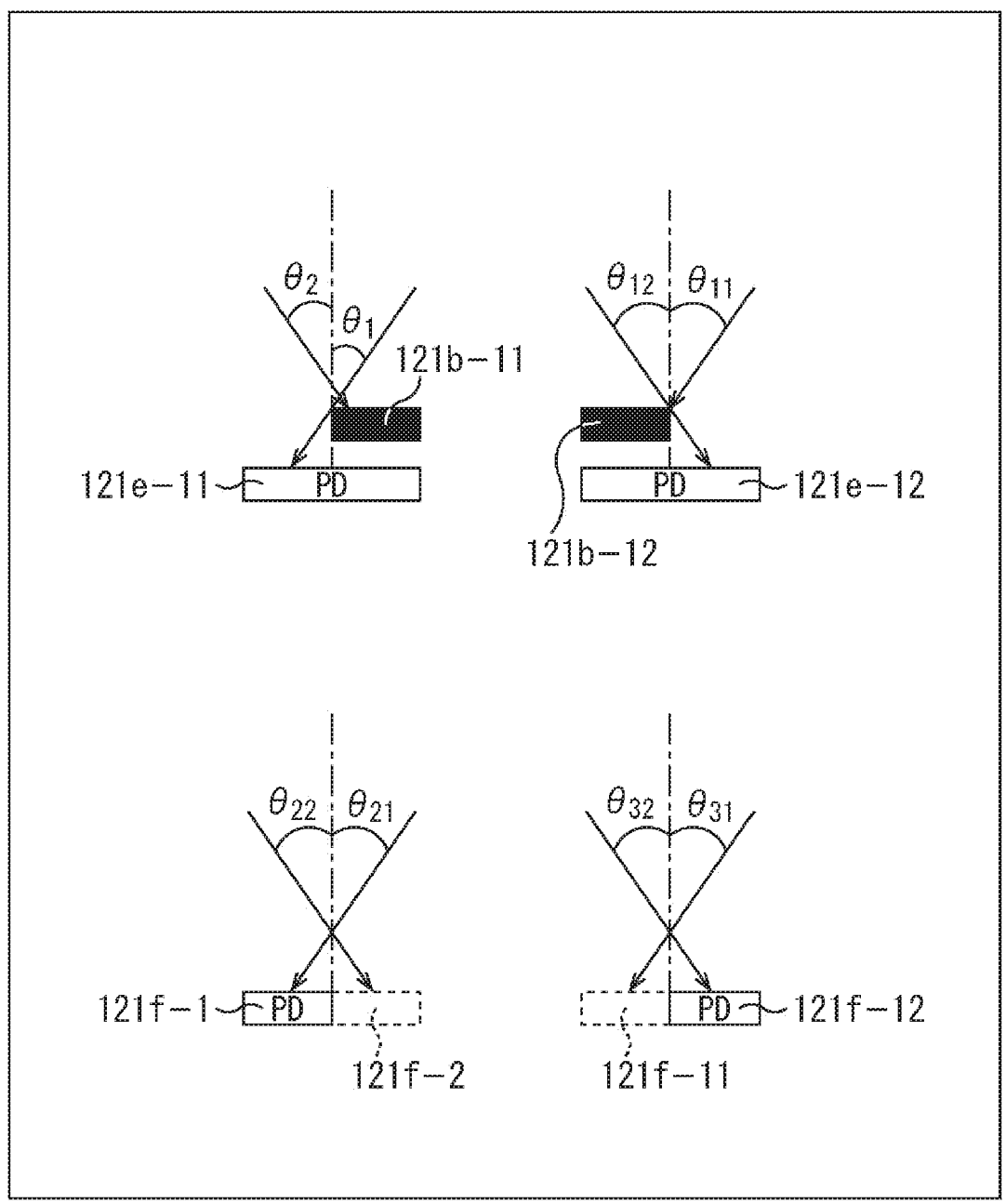
FIG. 6 is a diagram illustrating the principle of generation of incident angle directivity.

The incident angle directivity of each pixel in the imaging element 121 is generated on the basis of a principle illustrated in FIG. 6, for example. Note that, the upper left part and the upper right part of FIG. 6 are diagrams illustrating a generation principle of the incident angle directivity in the imaging element 121 of FIG. 4, and the lower left part and lower right part of FIG. 6 are diagrams illustrating a generation principle of the incident angle directivity in the imaging element 121 of FIG. 5.

Furthermore, each of the pixels in the upper left part and the upper right part of FIG. 6 includes one photodiode 121*e*. On the other hand, each of the pixels in the lower left part and the lower right part of FIG. 6 includes two photodiodes 121*f*. Note that, here, an example is described in which one pixel includes two photodiodes 121*f*; however, this is for convenience of description, and the number of photodiodes 121*f* included in one pixel may be the other number.

In the upper left part of FIG. 6, a light-shielding film 121*b*-11 is formed to shield the right half of the light-receiving surface of the photodiode 121*e*-11 when incident light enters from the upper side to the lower side in the figure. Furthermore, in the upper right part of FIG. 6, a light-shielding film 121*b*-12 is formed to shield the left half of the light-receiving surface of the photodiode 121*e*-12. Note that, it is indicated that one-dot chain lines in the figure are at the center position in the horizontal direction in the figure of the light-receiving surface of the photodiode 121*e*, and is in the vertical direction with respect to the light-receiving surface.

For example, in the case of the configuration illustrated in the upper left part of FIG. 6, incident light from the upper right direction in the figure indicated by an arrow forming an incident angle $\theta 1$ with respect to the one-dot chain line in the figure is easily received in a left half range that is not shielded by the light-shielding film 121*b*-11 of the photodiode 121*e*-11, but incident light from the upper left direction in the figure indicated by an arrow forming an incident angle θ2 with respect to the one-dot chain line in the figure is not easily received in the left half range that is not shielded by the light-shielding film 121b-11 of the photodiode 121e-11. Thus, in the case of the configuration illustrated in the upper left part of FIG. 6, an incident angle directivity is given such that the light-receiving sensitivity characteristic is high for the incident light from the upper right in the figure, and the light-receiving sensitivity characteristic is low for the incident light from the upper left.

On the other hand, for example, in the case of the configuration illustrated in the upper right part of FIG. 6, incident light from the upper right direction in the figure indicated by an arrow forming an incident angle θ11 with respect to the one-dot chain line in the figure is not easily received in a left half range that is shielded by the light-shielding film 121b-12 of the photo diode 121e-12, but incident light from the upper left direction in the figure indicated by an arrow forming an incident angle θ12 with respect to the one-dot chain line in the figure is easily received in a right half range that is not shielded by the light-shielding film 121b-12 of the photodiode 121e-12. Thus, in the case of the configuration illustrated in the upper right part of FIG. 6, an incident angle directivity is given such that the light-receiving sensitivity characteristic is low for the incident light from the upper right in the figure, and the light-receiving sensitivity characteristic is high for the incident light from the upper left.

Furthermore, in the case of the lower left part of FIG. 6, the photodiodes 121f-1 and 121f-2 are provided on the left and right in the figure, and the configuration is made to have the incident angle directivity without providing the light-shielding film 121b by reading one of the detection signals.

In other words, in a case where two photodiodes 121f-1 and 121f-2 are formed in the pixel 121a as illustrated in the lower left part of FIG. 6, by making the detection signal of the photodiode 121f-1 provided on the left side in the figure contribute to the detection signal level of the pixel 121a, it is possible to have the incident angle directivity similar to that of the configuration in the upper left part of FIG. 6. In other words, incident light from the upper right direction in the figure, indicated by an arrow forming an incident angle θ21 with respect to the one-dot chain line in the figure, enters the photodiode 121f-1 and is received, and the detection signal is read and contributes to the detection signal level of the pixel 121a. On the other hand, incident light from the upper left direction in the figure, indicated by an arrow forming an incident angle θ22 with respect to the one-dot chain line in the figure, enters the photodiode 121f-2, but the detection signal is not read and does not contribute to the detection signal level of the pixel 121a.

Similarly, in a case where two photodiodes 121f-11 and 121f-12 are formed in the pixel 121a as illustrated in the lower right part of FIG. 6, by making the detection signal of the photodiode 121f-12 provided on the left side in the figure contribute to the detection signal level of the pixel 121a, it is possible to have the incident angle directivity similar to that of the configuration in the upper right part of FIG. 6. In other words, incident light from the upper right direction in the figure, indicated by an arrow forming an incident angle θ31 with respect to the one-dot chain line in the figure, enters the photodiode 121f-11, but the detection signal is not read and does not contribute to the detection signal level of the pixel 121a. On the other hand, incident light from the upper left direction in the figure, indicated by an arrow forming an incident angle θ32 with respect to the one-dot chain line in the figure, enters the photodiode 121f-12 and is received, and the detection signal is read and contributes to the detection signal level of the pixel 121a.

Note that, in FIG. 6, an example has been described in which the one-dot chain line in the vertical direction is at the center position in the horizontal direction in the figure of the light-receiving surface of the photodiode 121e; however, this is for convenience of description, and the one-dot chain line may be at another position. Different incident angle directivities can be generated by the difference in the horizontal position of the light-shielding film 121b indicated by the one-dot chain line in the vertical direction.

<Incident Angle Directivity in Configuration Including On-Chip Lens>

In the above, the principle of generation of the incident angle directivity has been described; however, here, a description will be given of the incident angle directivity in the configuration including the on-chip lens 121c.

Figure 7:
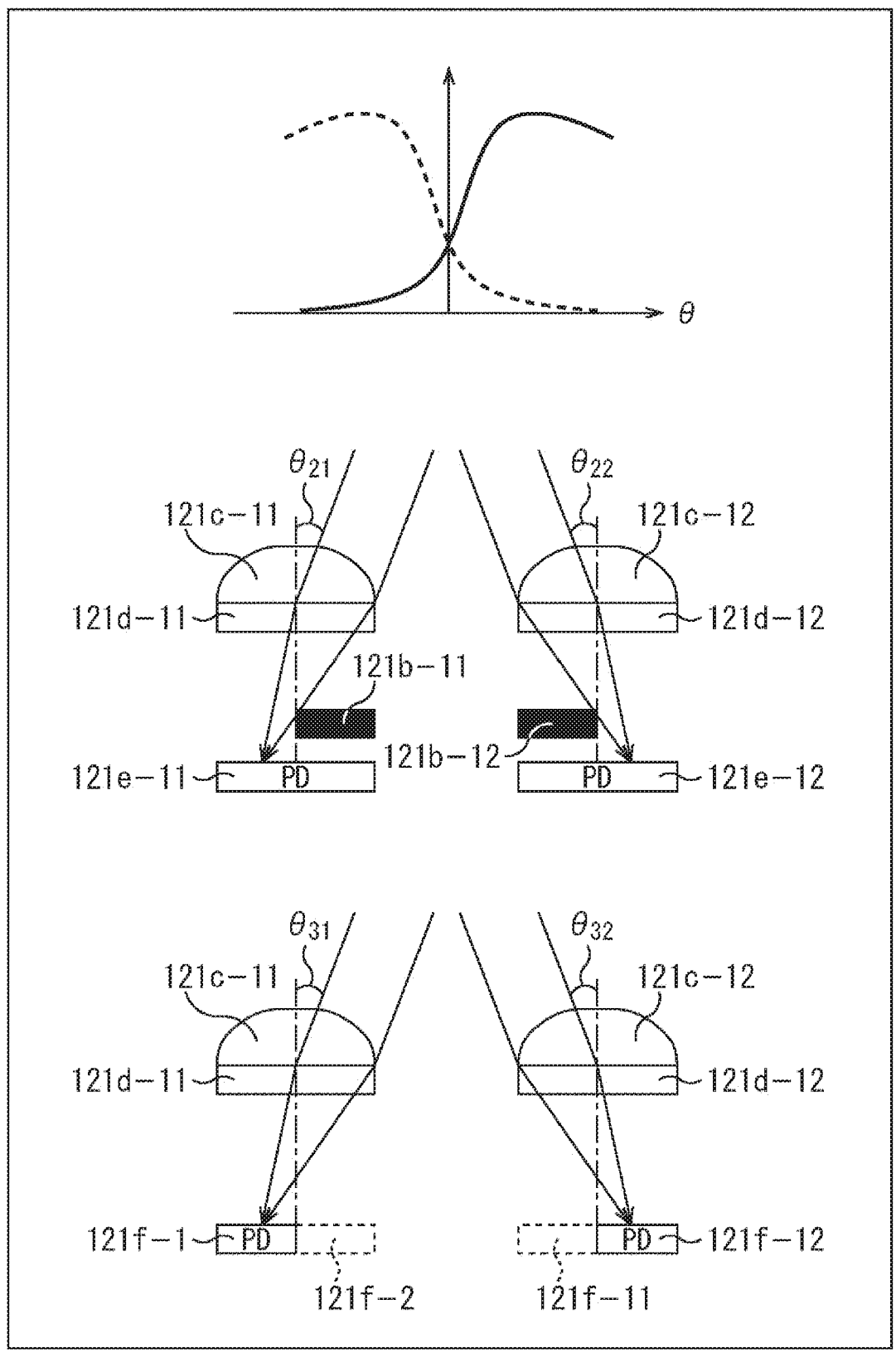
FIG. 7 is a diagram illustrating a change in incident angle directivity using an on-chip lens.

In other words, the incident angle directivity of each pixel in the imaging element 121 is set, for example, as illustrated in FIG. 7, by using the on-chip lens 121c, in addition to that by the above-described light-shielding film 121b. In other words, in the middle left part of FIG. 7, from the incident direction in the upper part of the figure, an on-chip lens 121c-11 that focuses incident light, a color filter 121d-11 that transmits light of a predetermined wavelength, and the photodiode 121e-11 that generates a pixel signal by photoelectric conversion are layered in this order, and in the middle right part of FIG. 7, from the incident direction in the upper part of the figure, an on-chip lens 121c-12, a color filter 121d-12, and the photodiode 121e-12 are arranged in this order.

Note that, in a case where it is not necessary to distinguish between the on-chip lenses 121c-11 and 121c-12, between the color filters 121d-11 and 121d-12, and between the photodiodes 121e-11 and 121e-12, they are simply referred to as the on-chip lenses 121c, the color filter 121d, and the photodiode 121e.

The imaging element 121 is further provided with the light-shielding films 121b-11 and 121b-12 that shield part of the region that receives incident light, as respectively illustrated in the middle left part and the middle right part of FIG. 7.

As illustrated in the middle left part of FIG. 7, in a case where the light-shielding film 121b-11 is provided that shields the right half of the photodiode 121e-11 in the figure, the detection signal level of the photodiode 121e-11 changes depending on an incident angle θ of the incident light as indicated by the solid line waveform in the upper part of FIG. 7.

In other words, when the incident angle θ, which is an angle formed by the incident light with respect to the one-dot chain line that is at the center position of the photodiode 121e and the on-chip lens 121c and vertical to each of the photodiode 121e and the on-chip lens 121c, increases (when the incident angle θ increases in the positive direction (inclines to the right direction in the figure)), the light is focused on a range where the light-shielding film 121b-11 is not provided, whereby the detection signal level of the photodiode 121e-11 increases. Conversely, as the incident angle θ decreases (as the incident angle θ increases in the negative direction (inclines to the left direction in the figure)), the light is focused on a range where the light-shielding film 121b-11 is provided, whereby the detection signal level of the photodiode 121e-11 decreases.

Note that, the incident angle θ here is defined as 0 degrees in a case where the direction of the incident light coincides with the one-dot chain line, and the incident angle θ on the incident angle θ21 side in the middle left of FIG. 7, at which incident light from the upper right in the figure enters, is defined as a positive value, and the incident angle θ on the incident angle θ22 side in the middle right of FIG. 7 is defined as a negative value. Thus, in FIG. 7, the incident angle of the incident light entering the on-chip lens 121c from the upper right is greater than the incident angle of the incident light entering from the upper left. That is, in FIG. 7, the incident angle θ increases as a direction of travel of the incident light inclines to the right (increases in the positive direction), and decreases as the direction of travel inclines to the left (increases in the negative direction).

Furthermore, as illustrated in the middle right part of FIG. 7, in a case where the light-shielding film 121b-12 is provided that shields the left half of the photodiode 121e-12 in the figure, the detection signal level of the photodiode 121e-12 changes depending on the incident angle θ of the incident light as indicated by the dotted line waveform in the upper part of FIG. 7.

In other words, as indicated by the dotted line waveform in the upper part of FIG. 7, as the incident angle θ, which is an angle formed by the incident light with respect to the one-dot chain line that is at the center position of the photodiode 121e and the on-chip lens 121c and vertical to each of the photodiode 121e and the on-chip lens 121c, increases (as the incident angle θ increases in the positive direction), the light is focused on a range where the light-shielding film 121b-12 is provided, whereby the detection signal level of the photodiode 121e-12 decreases. Conversely, as the incident angle θ decreases (as the incident angle θ increases in the negative direction), the light enters a range where the light-shielding film 121b-12 is not provided, whereby the detection signal level of the photodiode 121e-12 increases.

Note that, in the upper part of FIG. 7, the horizontal axis indicates the incident angle θ, and the vertical axis indicates the detection signal level in the photodiode 121e.

Since the waveforms indicated by the solid line and the dotted line indicating the detection signal level depending on the incident angle θ illustrated in the upper part of FIG. 7 can be changed depending on the range of the light-shielding film 121b, thus it becomes possible to give (set) incident angle directivities different from each other in respective pixel units. Note that, the solid line waveform in the upper part of FIG. 7 corresponds to solid line arrows indicating that the incident light in the middle left part and the lower left part of FIG. 7 is focused with the incident angle θ changed. Furthermore, the dotted line waveform in the upper part of FIG. 7 corresponds to dotted arrows indicating that the incident light in the middle right part and the lower right part of FIG. 7 is focused with the incident angle θ changed.

The incident angle directivity here is a characteristic (light-receiving sensitivity characteristic) of the detection signal level of each pixel depending on the incident angle θ, but in the case of the example of the middle part of FIG. 7, it can also be said that this is a characteristic of a light shielding value depending on the incident angle θ. In other words, the light-shielding film 121b blocks incident light in a specific direction at a high level, but cannot sufficiently block incident light from directions other than the specific direction. This change in level of shielding from light causes different detection signal levels depending on the incident angle θ as illustrated in the upper part of FIG. 7. Thus, when a direction in which each pixel can be shielded at the highest level from light is defined as a light shielding direction of each pixel, having incident angle directivities different from each other in respective pixel units is, in other words, having light shielding directions different from each other in respective pixels.

Moreover, with a configuration in which two photodiodes 121f-1 and 121f-2 are provided for one on-chip lens 121c-11 (a pixel output unit includes two photodiodes 121f-1 and 121f-2) as illustrated in the lower left part of FIG. 7, by using only the detection signal of the photodiode 121f-1 in the left part of the figure, it is possible to obtain the same detection signal level as that in a state where the right side of the photodiode 121e-11 in the middle left part of FIG. 7 is shielded from light.

In other words, when the incident angle θ, which is an angle formed by the incident light with respect to the one-dot chain line that is the center position of the on-chip lens 121c and vertical to each, increases (when the incident angle θ increases in the positive direction), the light is focused on a range of the photodiode 121f-1 from which the detection signal is read, whereby the detection signal level increases. Conversely, as the incident angle θ decreases (as the incident angle θ increases in the negative direction), the light is focused on a range of the photodiode 121f-2 from which the detection value is not read, whereby the detection signal level decreases.

Furthermore, similarly, with a configuration in which two photodiodes 121f-11 and 121f-12 are provided for one on-chip lens 121c-12 as illustrated in the lower right part of FIG. 7, by using only the detection signal of the photodiode 121f-12 in the right part of the figure, it is possible to obtain a detection signal of an output pixel unit of the same detection signal level as that in a state where the left side of the photodiode 121e-12 in the middle right part of FIG. 7 is shielded from light.

In other words, when the incident angle θ, which is an angle formed by the incident light with respect to the one-dot chain line that is at the center position of the on-chip lens 121c and vertical to each, increases (when the incident angle θ increases in the positive direction), the light is focused on a range of the photodiode 121f-11 in which the detection signal does not contribute to the detection signal of the output pixel unit, whereby the detection signal level of the detection signal of the output pixel unit decreases. Conversely, as the incident angle θ decreases (as the incident angle θ increases in the negative direction), the light is focused on a range of the photodiode 121f-12 in which the detection signal contributes to the detection signal of the output pixel unit, whereby the detection signal level of the detection signal of the output pixel unit increases.

Note that, it is desirable that the incident angle directivity has high randomness. This is because there is a possibility that, for example, when adjacent pixels have the same incident angle directivity, the above-described equations (1) to (3) or equations (4) to (6) described later become the same equations as each other, and the relationship cannot be satisfied between the number of equations and the number of unknowns that are the solutions of the simultaneous equations, and the pixel values constituting the restored image cannot be obtained. Furthermore, in the configuration illustrated in the middle part of FIG. 7, one photodiode 121e-11 and one photodiode 121e-12 are formed in the pixel 121a. On the other hand, in the configuration illustrated in the lower part of FIG. 7, two photodiodes 121f-1 and 121f-2, and two photodiodes 121f-11 and 121f-12 are formed in the pixel 121a. Thus, for example, in the lower part of FIG. 7, a single photodiode 121f does not constitute one pixel.

Furthermore, as illustrated in the lower part of FIG. 7, in a case where one pixel output unit includes a plurality of photodiodes 121*f*, it can be considered that the output pixel value of the pixel output unit is modulated depending on the incident angle. Thus, the characteristic (incident angle directivity) of the output pixel value can be made different in pixel output unit, and the incident angle directivity in one pixel output unit is set. Moreover, in the case where one pixel output unit includes the plurality of photodiodes 121*f*, a configuration is essential of one on-chip lens 121*c* for one pixel output unit, for generating incident angle directivity in one pixel output unit.

Furthermore, as illustrated in the upper part of FIG. 7, in a case where one photodiode 121*e*-11 or one photodiode 121*e*-12 individually constitutes one pixel output unit, incident light to one photodiode 121*e*-11 or one photodiode 121*e*-12 constituting one pixel output unit is modulated depending on the incident angle, whereby the output pixel value is modulated as a result. Thus, the characteristics (incident angle directivities) of the output pixel value can be made different from each other, and the incident angle directivity in one pixel output unit is set. Moreover, in a case where one photodiode 121*e*-11 or one photodiode 121*e*-12 individually constitutes one pixel output unit, the incident angle directivity is set independently by the light-shielding film 121*b* provided for each one pixel output unit at the time of manufacturing.

Furthermore, as illustrated in the lower part of FIG. 7, in the case where one pixel output unit includes the plurality of photodiodes 121*f*, positions and the number of the plurality of photodiodes 121*f* (the number of divisions of the photodiodes 121*f* constituting one pixel output unit) for setting the incident angle directivity for each one pixel output unit are set independently in one pixel output unit at the time of manufacturing, and moreover, regarding which photodiode 121*f* is used for setting the incident angle directivity among the plurality of photodiodes 121*f*, it is possible to switch at the time of imaging.

<Setting of incident angle directivity>

Figure 8:
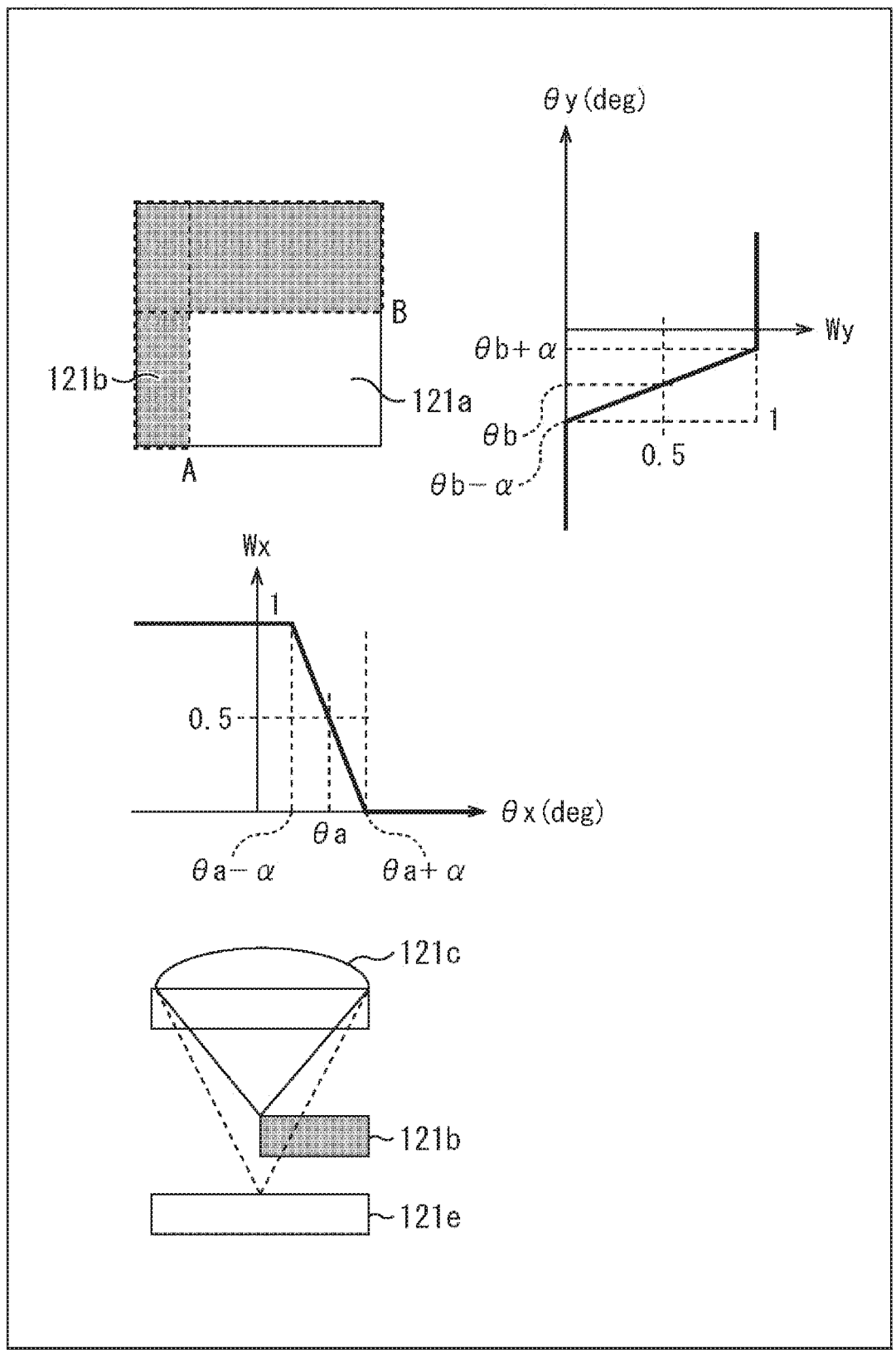
FIG. 8 is a diagram illustrating design of incident angle directivity.

For example, as illustrated in the upper part of FIG. 8, a setting range of the light-shielding film 121*b* is set as a range from the left end to a position A in the horizontal direction in the pixel 121*a*, and a range from the upper end to a position B in the vertical direction.

In this case, a weight Wx of from 0 to 1 in the horizontal direction is set, which serves as an index of incident angle directivity depending on an incident angle $\theta x$ (deg) from the center position in the horizontal direction of each pixel. In more detail, in a case where it is assumed that the weight Wx is 0.5 at the incident angle $\theta x = \theta a$ corresponding to the position A, a weight Wh is set so that the weight Wx is 1 at the incident angle $\theta x < \theta a - \alpha$, and the weight Wx is $(-(\theta x - \theta a)/2\alpha + 1/2)$ at $\theta a - \alpha \leq$ the incident angle $\theta x \leq \theta a + \alpha$, and the weight Wx is 0 at the incident angle $\theta x > \theta a + \alpha$. Note that, here, an example will be described in which the weight Wh is 0, 0.5, and 1; however, the weight Wh is 0, 0.5, and 1 when an ideal condition is satisfied.

Similarly, a weight Wy of from 0 to 1 in the vertical direction is set, which serves as an index of incident angle directivity depending on an incident angle $\theta y$ (deg) from the center position in the vertical direction of each pixel. In more detail, in a case where it is assumed that the weight Wv is 0.5 at the incident angle $\theta y = \theta b$ corresponding to the position B, a weight Wy is set so that the weight Wy is 0 at the incident angle $\theta y < \theta b - \alpha$, the weight Wy is $((\theta y - \theta b)/2\alpha + 1/2)$ at $\theta b - \alpha \leq$ the incident angle $\theta y \leq \theta b + \alpha$, and the weight Wy is 1 at the incident angle $\theta y > \theta b + \alpha$.

Then, by using the weights Wx and Wy thus obtained, the incident angle directivity of each pixel 121*a*, in other words, coefficients (coefficient set) corresponding to the light-receiving sensitivity characteristic can be obtained.

Furthermore, at this time, an inclination ($1/2\alpha$) indicating a change in weight in a range where the weight Wx in the horizontal direction and the weight Wy in the vertical direction are around 0.5 is set by using the on-chip lens 121*c* having a different focal length.

In other words, different focal lengths can be obtained by using on-chip lenses 121*c* having different curvatures.

For example, by using the on-chip lens 121*c* having a different curvature, as indicated by the solid line in the lower part of FIG. 8, when light is focused so that the focal length is on the light-shielding film 121*b*, the inclination ($1/2\alpha$) becomes steep. In other words, in the upper part of FIG. 8, the weight Wx in the horizontal direction and the weight Wy in the vertical direction sharply change to 0 or 1 in the vicinity of boundaries of the incident angle $\theta x = \theta a$ in the horizontal direction and the incident angle $\theta y = \theta b$ in the vertical direction where the weights are near 0.5.

Furthermore, for example, by using the on-chip lens 121*c* having a different curvature, when the focal length is focused on the photodiode 121*e* as indicated by the dotted line in the lower part of FIG. 8, the inclination ($1/2\alpha$) becomes moderate. In other words, in the upper part of FIG. 8, the inclination moderately changes to 0 or 1 in the vicinity of boundaries of the incident angle $\theta x = ea$ in the horizontal direction and the incident angle $\theta y = \theta b$ in the vertical direction where the weight Wx in the horizontal direction and the weight Wy in the vertical direction are near 0.5.

As described above, different incident angle directivities, in other words, different light-receiving sensitivity characteristics can be obtained by using the on-chip lenses 121*c* having different curvatures to make different focal lengths.

Thus, the incident angle directivity of the pixel 121*a* can be set to a different value by making the range in which the photodiode 121*e* is shielded by the light-shielding film 121*b* and the curvature of the on-chip lens 121*c* different. Note that, the curvature of the on-chip lens may be the same for all pixels in the imaging element 121, or may be different for some pixels.

<Difference Between On-Chip Lens and Imaging Lens>

As described above, the imaging element 121 does not require an imaging lens that guides light from the subject surface to each pixel of the imaging element to reproduce the light intensity of the subject surface (it is imaging lens free). However, the on-chip lens 121*c* is necessary at least in a case where the incident angle directivity is realized by using the plurality of photodiodes in the pixel as described with reference to FIG. 5. The on-chip lens 121*c* and the imaging lens have different physical functions.

The imaging lens has a focusing function for causing incident light entering from the same direction to enter a plurality of pixels adjacent to each other. On the other hand, light passing through the on-chip lens 121*c* is incident only on the light-receiving surface of the photodiode 121*e* or 121*f* constituting one corresponding pixel. In other words, the on-chip lens 121*c* is provided for each pixel output unit, and focuses subject light entering the on-chip lens 121*c* on only the corresponding pixel output unit. In other words, the on-chip lens 121*c* does not have a focusing function for causing diffused light emitted from a virtual point light source to enter a plurality of pixels adjacent to each other.

<Relationship Between Subject Surface and Distance to Imaging Element>

Next, a relationship between the subject surface and the distance to the imaging element 121 will be described with reference to FIG. 9.

Figure 9:
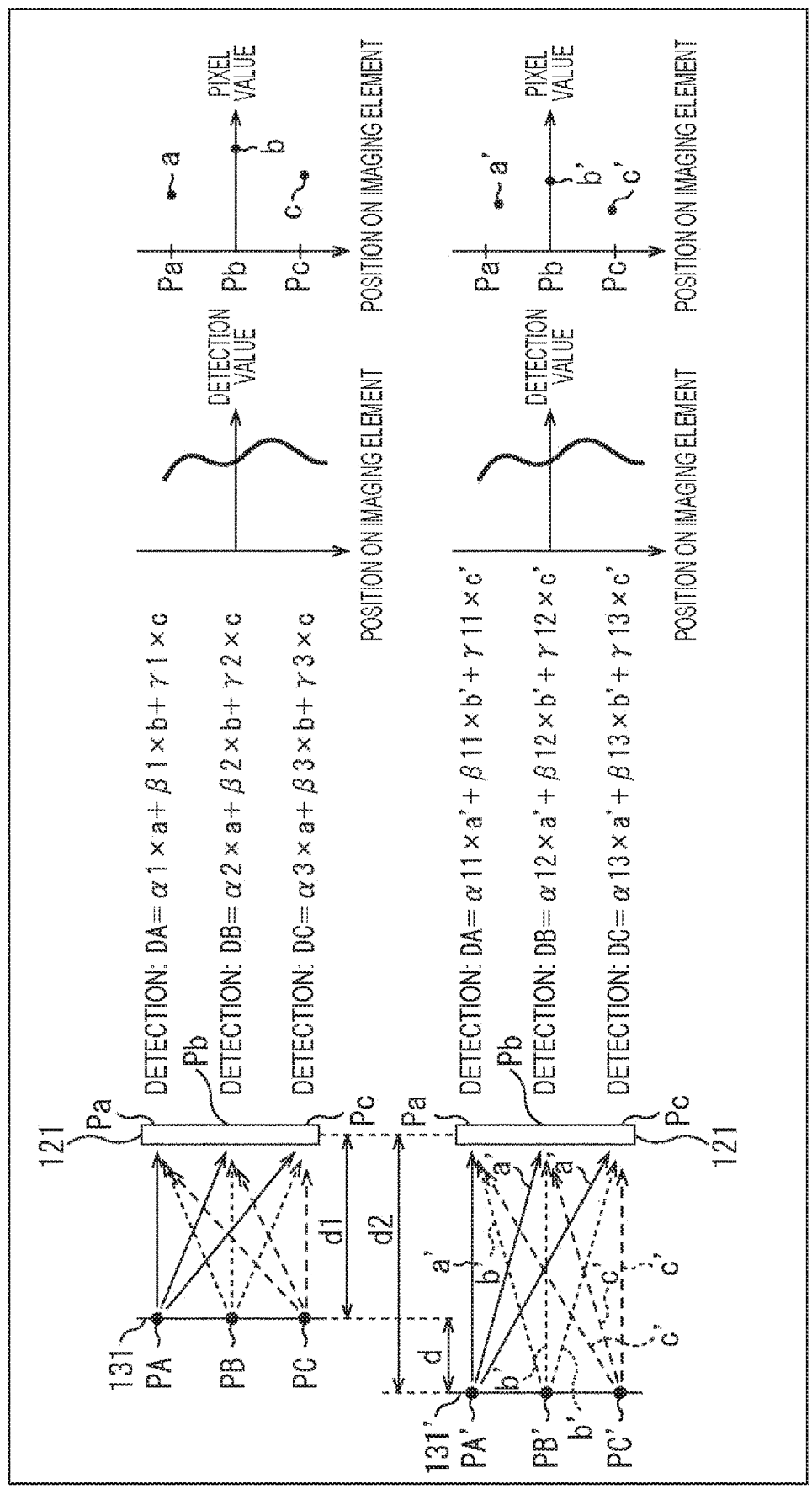
FIG. 9 is a diagram illustrating a relationship between a subject distance and coefficients expressing incident angle directivity.

As illustrated in the upper left part of FIG. 9, in a case where a subject distance between the imaging element 121 and the subject surface 131 is a distance d1, for example, when the point light sources PA, PB, and PC on the subject surface 131 are set, it is assumed that the detection signal levels DA, DB, and DC at the corresponding positions Pa, Pb, and Pc on the imaging element 121 can be expressed by the same equations as the equations (1) to (3) described above.

$$DA = \alpha 1 \times a + \beta 1 \times b + \gamma 1 \times c \quad (1)$$

$$DB = \alpha 2 \times a + \beta 2 \times b + \gamma 2 \times c \quad (2)$$

$$DC = \alpha 3 \times a + \beta 3 \times b + \gamma 3 \times c \quad (3)$$

On the other hand, as illustrated in the lower left part of FIG. 9, in the case of a subject surface 131' in which the subject distance to the imaging element 121 is a distance d2 greater than the distance d1 by d, in other words, in the case of the subject surface 131' that is behind the subject surface 131 when viewed from the imaging element 121, the detection signal levels DA, DB, and DC are all similar, as illustrated in the upper center part and the lower center part of FIG. 9.

However, in this case, the light beams having light intensities a', b', and c' from point light sources PA', PB', and PC' on the subject surface 131' are received by each pixel of the imaging element 121. At this time, since the incident angles of the light beams having the light intensities a', b', and c' received on the imaging element 121 differ (change), respective different coefficient sets are required, and the detection signal levels DA, DB, and DC in the respective positions Pa, Pb, and Pc are expressed as indicated in the following equations (4) to (6), for example.

$$DA = \alpha 11 \times a' + \beta 11 \times b' + \gamma 11 \times c' \quad (4)$$

$$DB = \alpha 12 \times a' + \beta 12 \times b' + \gamma 12 \times c' \quad (5)$$

$$DC = \alpha 13 \times a' + \beta 13 \times b' + \gamma 13 \times c' \quad (6)$$

Here, a coefficient set group including coefficient sets $\alpha 11$, $\beta 11$, and $\gamma 11$, coefficient sets $\alpha 12$, $\beta 12$, and $\gamma 12$, and coefficient sets $\alpha 13$, $\beta 13$, and $\gamma 13$ is a coefficient set group of the subject surface 131' respectively corresponding to coefficient sets $\alpha 1$, $\beta 1$, and $\gamma 1$, coefficient set $\alpha 2$, $\beta 2$, and $\gamma 2$, and coefficient sets $\alpha 3$, $\beta 3$, and $\gamma 3$ in the subject surface 131.

Thus, by solving the equations (4) to (6) by using the preset coefficient set group $\alpha 11$, $\beta 11$, $\gamma 11$, $\alpha 12$, $\beta 12$, $\gamma 12$, $\alpha 13$, $\beta 13$, and $\gamma 13$, it becomes possible to obtain the light intensity (a', b', c') of the light beams from the point light sources PA', PB', and PC', as illustrated in the lower right part of FIG. 9, with a method similar to the method of obtaining the light intensity (a, b, c) of the light beams in the point light sources PA, PB, and PC in the case of the subject surface 131 as illustrated in the upper right part of FIG. 9, and as a result, it becomes possible to obtain a restored image of the subject on the subject surface 131'.

In other words, in the imaging apparatus 100 of FIG. 1, a coefficient set group for each distance from the imaging element 121 to a subject surface is stored in advance, simultaneous equations are configured by switching the coefficient set groups, and the configured simultaneous equations are solved, whereby it becomes possible to obtain a restored image of the subject surface at various subject distances on the basis of one detection image.

That is, by simply capturing the detection image once, the restored image is obtained by switching the coefficient set groups depending on the distance to the subject surface in subsequent processing, whereby it is also possible to generate a restored image at an arbitrary distance.

Furthermore, in the case of image recognition or in a case where it is desired to obtain characteristics of a subject such as a visible image or other than the visible image, it is also possible to perform image recognition or the like by using a detection signal itself by applying machine learning such as deep learning to the detection signal of the imaging element, without performing the image recognition on the basis of a restored image after the restored image is obtained.

Furthermore, in a case where the subject distance and the angle of view can be specified, a restored image may be generated by using a detection image including detection signals of respective pixels each having an incident angle directivity suitable for imaging the subject surface corresponding to the specified subject distance and angle of view, without using all the pixels. In this way, a restored image can be obtained by using a detection signal of a pixel suitable for imaging the subject surface corresponding to the specified subject distance and angle of view.

Figure 10:
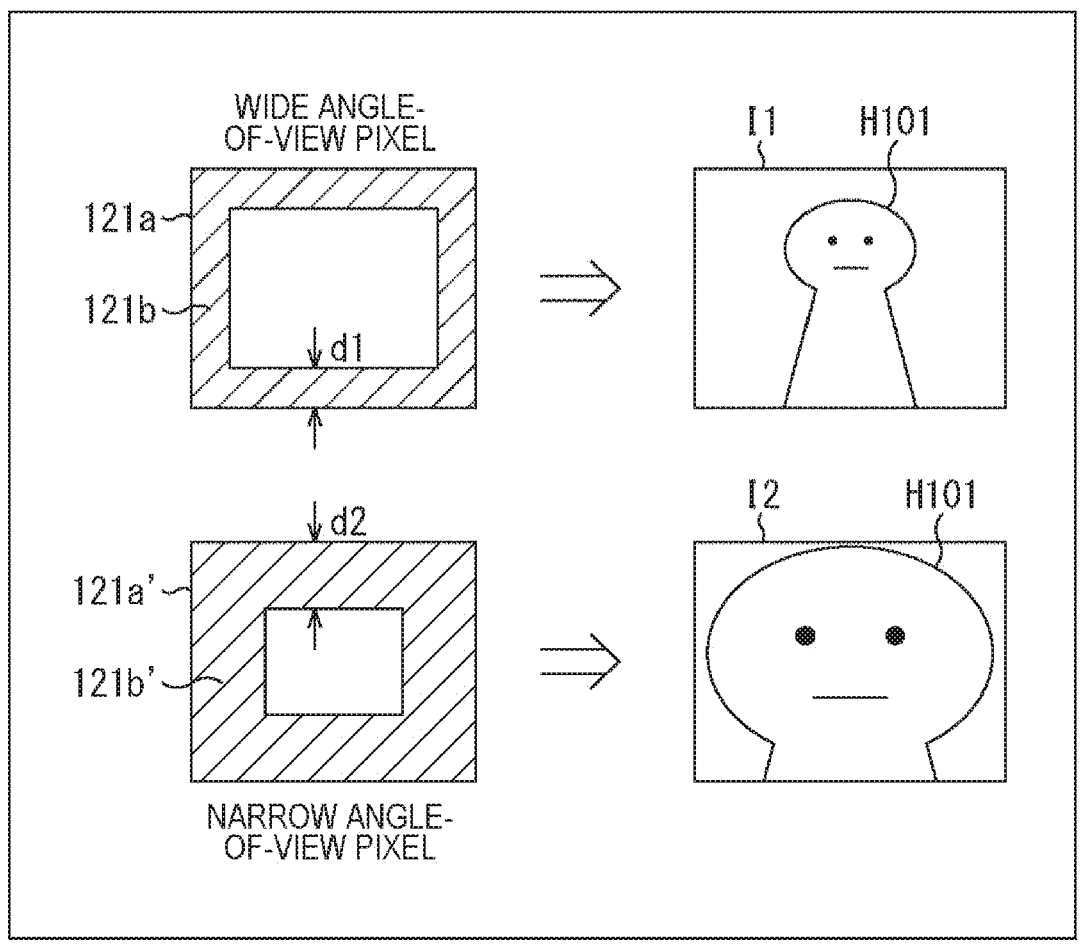
FIG. 10 is a diagram illustrating a relationship between a narrow angle-of-view pixel and a wide angle-of-view pixel.

For example, pixels are considered, a pixel 121a that is shielded by the light-shielding film 121b by a width d1 from each end of four sides as illustrated in the upper part of FIG. 10, and a pixel 121a' that is shielded by the light-shielding film 121b by a width d2 (>d1) from each end of four sides as illustrated in the lower part of FIG. 10.

Figure 11:
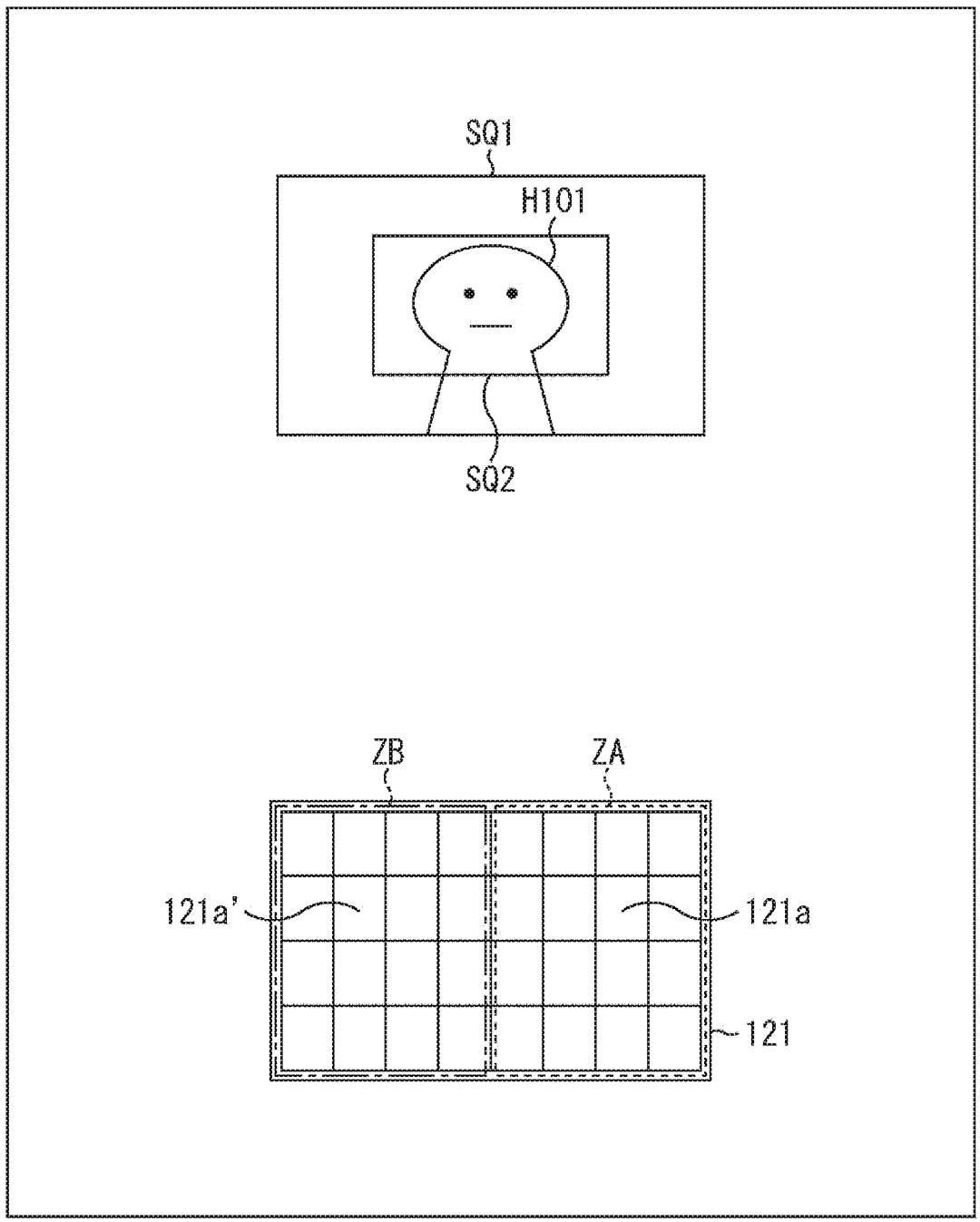
FIG. 11 is a diagram illustrating the relationship between the narrow angle-of-view pixel and the wide angle-of-view pixel.

The pixel 121a is used, for example, for restoring an image I1 of FIG. 10 corresponding to an angle of view SQ1 including the whole of a person H101 as a subject, as illustrated in the upper part of FIG. 11. On the other hand, the pixel 121a' is used, for example, for restoring an image I2 of FIG. 10 corresponding to an angle of view SQ2 in which the periphery of the face of the person H101 as the subject is zoomed up, as illustrated in the upper part of FIG. 11.

Figure 12:
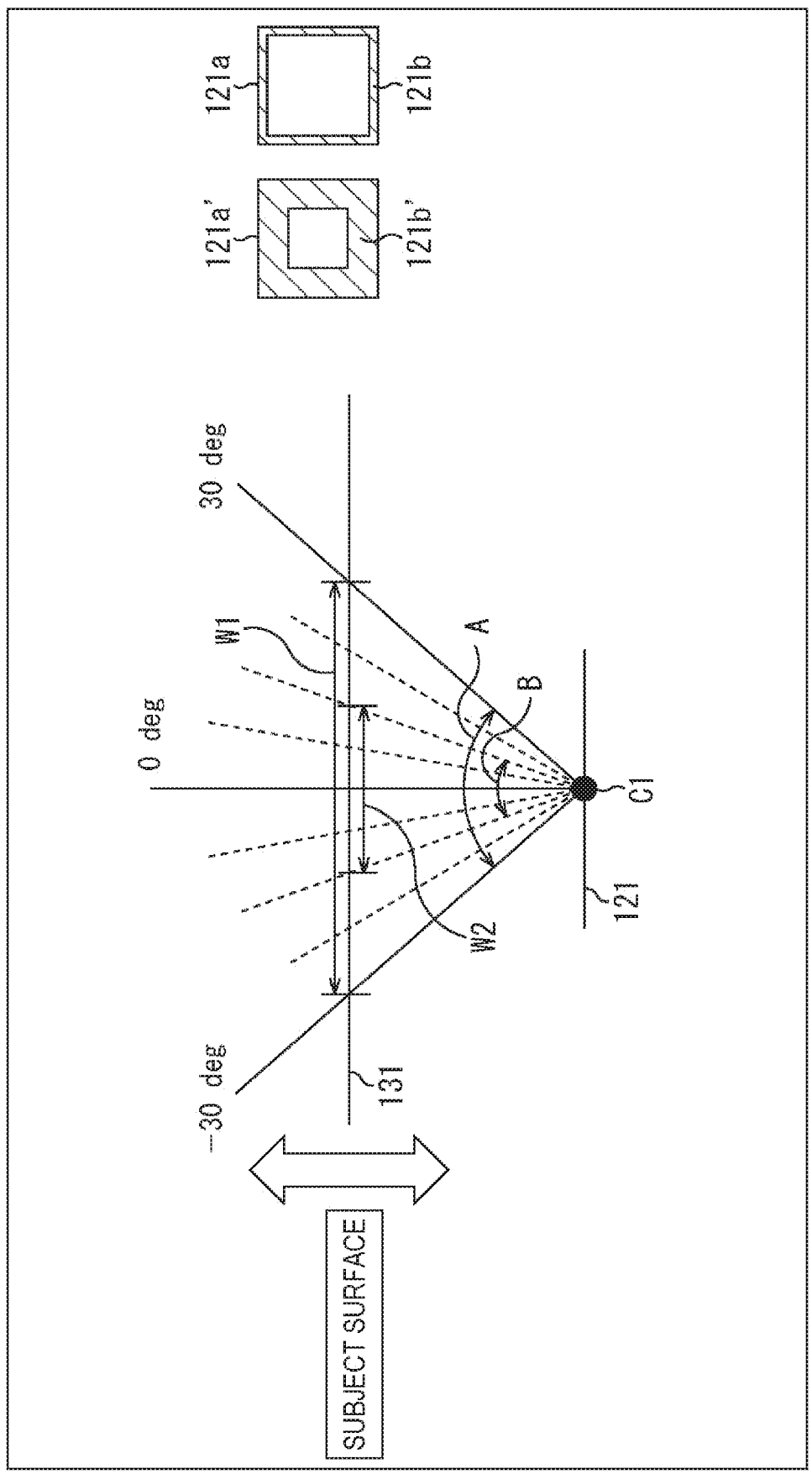
FIG. 12 is a diagram illustrating the relationship between the narrow angle-of-view pixel and the wide angle-of-view pixel.

This is because the pixel 121a of FIG. 10 has an incident light angle range A with respect to the imaging element 121 as illustrated in the left part of FIG. 12, whereby incident light can be received for a subject width W1 in the horizontal direction on the subject surface 131.

On the other hand, since the pixel 121a' of FIG. 10 has a wider range shielded from light than that of the pixel 121a of FIG. 10, an incident light angle range with respect to the imaging element 121 is B (<A) as illustrated in the left part of FIG. 12, so that incident light can be received for a subject width W2 (<W1) in the horizontal direction on the subject surface 131.

That is, the pixel 121a of FIG. 10 with a narrow light-shielding range is a wide angle-of-view pixel suitable for imaging a wide range on the subject surface 131, whereas the pixel 121a' of FIG. 10 with a wide light-shielding range is a narrow angle-of-view pixel suitable for imaging a narrow range on the subject surface 131. Note that, the wide angle-of-view pixel and the narrow angle-of-view pixel here are expressions for comparing both the pixels 121a and 121a' of FIG. 10 with each other, and are not limited to these when comparing pixels having other angles of view.

Note that, FIG. 12 illustrates a relationship between positions on the subject surface 131 and the incident angle of incident light from each position, with respect to the center position C1 of the imaging element 121. Furthermore, FIG. 12 illustrates the relationship with respect to the horizontal direction between the positions on the subject surface 131 and the incident angle of incident light from each position on the subject surface 131, but there is a similar relationship for the vertical direction. Moreover, on the right part of FIG. 12, the pixels 121a and 121a' of FIG. 10 are illustrated.

With such a configuration, as illustrated in the lower part of FIG. 11, in the case of a configuration in which a predetermined number of pixels 121a of FIG. 10 are gathered in a range ZA surrounded by the dotted line, and the predetermined number of pixels 121a' of FIG. 10 are gathered in a range ZB surrounded by the one-dot chain line, in the imaging element 121, when an image of the angle of view SQ1 corresponding to the subject width W1 is to be restored, the pixel 121a of FIG. 10 that images the angle of view SQ1 is used, whereby an image of the subject width W1 on the subject surface 131 can be appropriately restored.

Similarly, when an image of the angle of view SQ2 corresponding to the subject width W2 is to be restored, the detection signal level of the pixel 121a' of FIG. 10 that images the angle of view SQ2 is used, whereby an image of the subject width W2 can be appropriately restored.

Note that, in the lower part of FIG. 11, a configuration is illustrated in which the predetermined number of pixels 121a' are provided on the left side in the figure, and the predetermined number of pixels 121a are provided on the right side; however, this is illustrated as an example for simplifying the description, and the pixel 121a and the pixel 121a' are desirably arranged to be randomly mixed.

As described above, the angle of view SQ2 is narrower than the angle of view SQ1, so in a case where the images of the angle of view SQ2 and the angle of view SQ1 are to be restored with the same predetermined number of pixels, a restored image with higher image quality can be obtained by restoring the image of the angle of view SQ2 having a narrower angle of view, than restoring the image of the angle of view SQ1.

That is, in a case where it is considered to obtain a restored image by using the same number of pixels, a restored image with higher image quality can be obtained by restoring an image with a narrower angle of view.

Note that, in a case where an image with a wide angle of view is obtained as a restored image, all pixels of the wide angle-of-view pixels may be used, or some of the wide angle-of-view pixels may be used. Furthermore, in a case where an image with a narrow angle of view is obtained as a restored image, all pixels of the narrow angle-of-view pixels may be used, or some of the narrow angle-of-view pixels may be used.

By using the imaging element 121 as described above, as a result, an imaging lens, an optical element including a diffraction grating and the like, a pinhole, or the like is unnecessary, so that it becomes possible to increase the degree of freedom in apparatus design, and also possible to realize downsizing of the apparatus with respect to the incident direction of the incident light, and possible to reduce the manufacturing cost. Furthermore, a lens is also unnecessary corresponding to an imaging lens for forming an optical image, such as a focus lens.

Moreover, by using the imaging element 121, only a detection image is acquired, and thereafter, a restored image is obtained by solving simultaneous equations configured by selectively using a coefficient set group corresponding to the subject distance and the angle of view, whereby it becomes possible to generate restored images having various subject distances and angles of view.

Moreover, since the imaging element 121 can have an incident angle directivity in a pixel unit, it is possible to realize a multi-pixel, compared to an optical filter including a diffraction grating, a conventional imaging element, and the like, and also it is possible to obtain a restored image with high resolution and high angular resolution. On the other hand, in an imaging apparatus including an optical filter and a conventional imaging element, it is difficult to realize a high resolution of a restored image, and the like since it is difficult to miniaturize the optical filter even if the pixels are miniaturized.

Furthermore, since the imaging element 121 does not require an optical filter including a diffraction grating, or the like, it does not occur that the optical filter is distorted by heat due to temperature rise of the use environment. Thus, by using such an imaging element 121, it becomes possible to realize an apparatus with high environmental resistance.

<First Modification>

In the right part of FIG. 3, as the configuration of the light-shielding film 121b in each pixel 121a of the imaging element 121, an example has been described in which the entire light shielding is performed in the vertical direction, and the light shielding width and position are changed in the horizontal direction, whereby a difference is given in the incident angle directivity in the horizontal direction; however, the configuration of the light-shielding film 121b is not limited to this example. For example, the entire light-shielding is performed in the horizontal direction, and the width (height) and position are changed in the vertical direction, whereby a difference may be given in the incident angle directivity in the vertical direction.

Note that, the light-shielding film 121b that shields the entire pixel 121a in the vertical direction, and shields the pixel 121a with a predetermined width in the horizontal direction as in the example illustrated in the right part of FIG. 3, is referred to as a horizontal band type light-shielding film 121b. On the other hand, the light-shielding film 121b that shields the entire pixel 121a in the horizontal direction, and shields the pixel 121a with a predetermined height in the vertical direction, is referred to as a vertical band type light-shielding film 121b.

Figure 13:
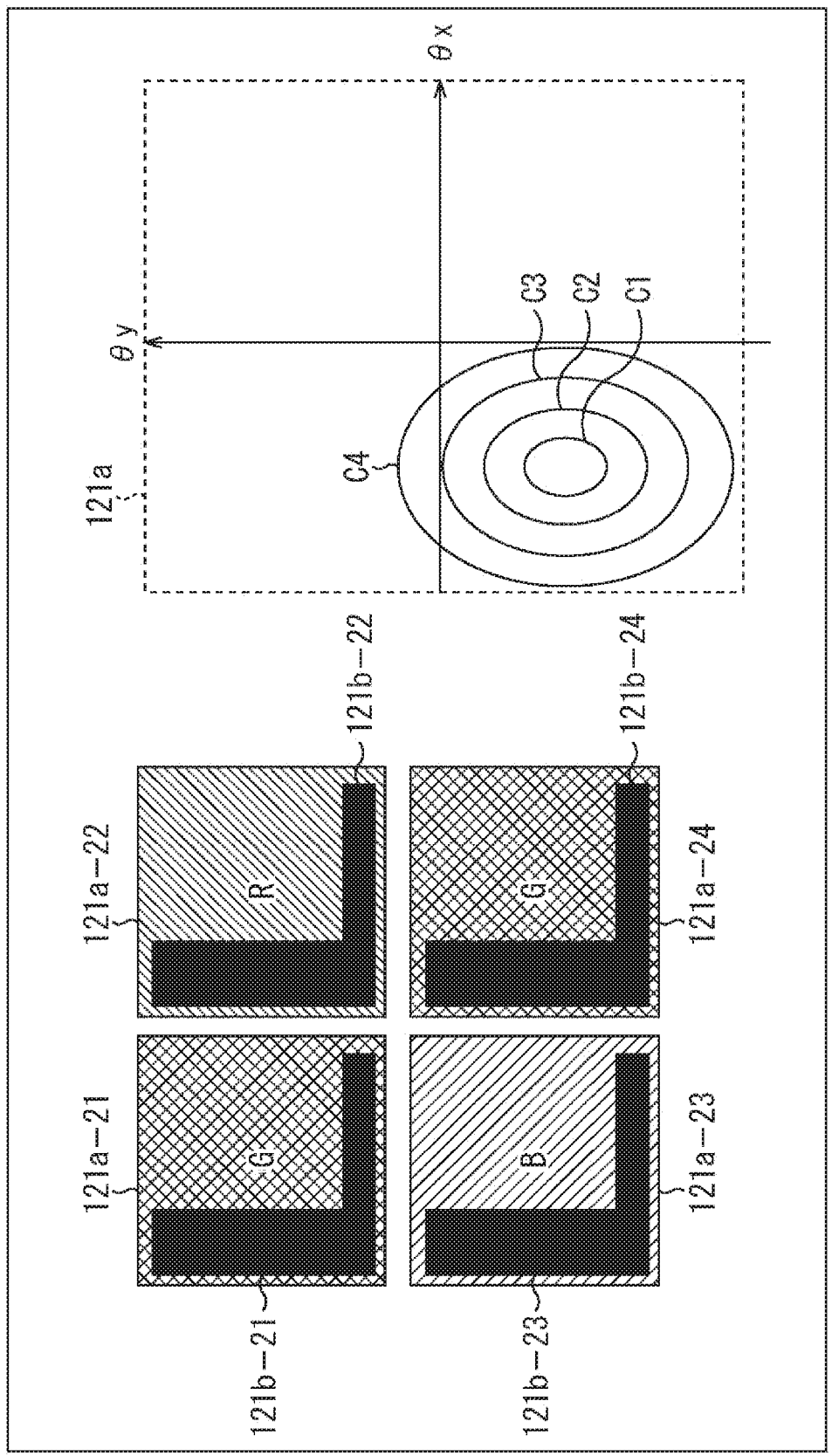
FIG. 13 is a diagram illustrating a modification.

Furthermore, as illustrated in the example illustrated in the left part of FIG. 13, the pixel 121a may be provided with an L-shaped light-shielding film 121b obtained by combining the vertical band type and the horizontal band type light-shielding films 121b. In the left part of FIG. 13, a portion indicated in black is the light-shielding film 121b. That is, light-shielding films 121b-21 to 121b-24 are light-shielding films of pixels 121a-21 to 121a-24, respectively.

Each of these pixels (pixels 121a-21 to 121a-24) has incident angle directivity as illustrated in the right part of FIG. 13. The graph illustrated in the right part of FIG. 13 illustrates light-receiving sensitivity in each pixel. The horizontal axis represents the incident angle $\theta x$ in the horizontal direction (x direction) of the incident light, and the vertical axis represents the incident angle $\theta y$ in the vertical direction (y direction) of the incident light. Then, light-receiving sensitivity within a range C4 is higher than that outside the range C4, light-receiving sensitivity within a range C3 is higher than that outside the range C3, light-receiving sensitivity within a range C2 is higher than that outside the range C2, and light-receiving sensitivity within a range C1 is higher than that outside the range C1.

Thus, it is indicated that, for each pixel, a detection signal level of the incident light that satisfies conditions of the incident angle $\theta x$ in the horizontal direction (x direction) and the incident angle $\theta y$ in the vertical direction (y direction) that are within the range C1, is the highest, and the detection signal level decreases in the order of the conditions of being within the range C2, the range C3, the range C4, and the range other than the range C4. Such intensity of light-receiving sensitivity is determined by the range shielded by the light-shielding film 121b.

Furthermore, in the left part of FIG. 13, an alphabet in each pixel 121a indicates color of a color filter (the alphabet is indicated for convenience of description, and is not actually written). The pixel 121a-21 is a G pixel in which a green color filter is arranged, the pixel 121a-22 is an R pixel in which a red color filter is arranged, the pixel 121a-23 is a B pixel in which a blue color filter is arranged, and the pixel 121a-24 is a G pixel in which a green color filter is arranged. That is, these pixels form a Bayer array. Of course, this is an example, and the arrangement pattern of the color filters is arbitrary. The arrangement of the light-shielding film 121b and the color filter are irrelevant. For example, in some or all of the pixels, a filter other than the color filter may be provided, or no filter may be provided.

In the left part of FIG. 13, an example is illustrated in which an "L-shaped" light-shielding film 121b shields the left side and the lower side in the figure of the pixel 121a; however, the orientation of the "L-shaped" light-shielding film 121b is arbitrary, and is not limited to the example of FIG. 13. For example, the "L-shaped" light-shielding film 121b may shield the lower side and the right side in the figure of the pixel 121a, may shield the right side and the upper side in the figure of the pixel 121a, or may shield the upper side and the left side in the figure of the pixel 121a. Of course, the orientation of the light-shielding film 121b can be set independently for each pixel. Note that, the "L-shaped" light-shielding film 121b is also collectively referred to as "L-shaped type light-shielding film 121b".

Although the light-shielding film has been described above, the description of this example can also be applied to a case where incident angle directivity is given by selectively using a plurality of photodiodes arranged in a pixel. That is, for example, by appropriately setting the division position (size and shape of each partial region), and the position, size, shape, and the like of each photodiode, or appropriately selecting the photodiode, an incident light directivity can be realized equivalent to the incident light directivity by the above-described L-shaped type light-shielding film 121b.

<Second Modification>

Figure 14:
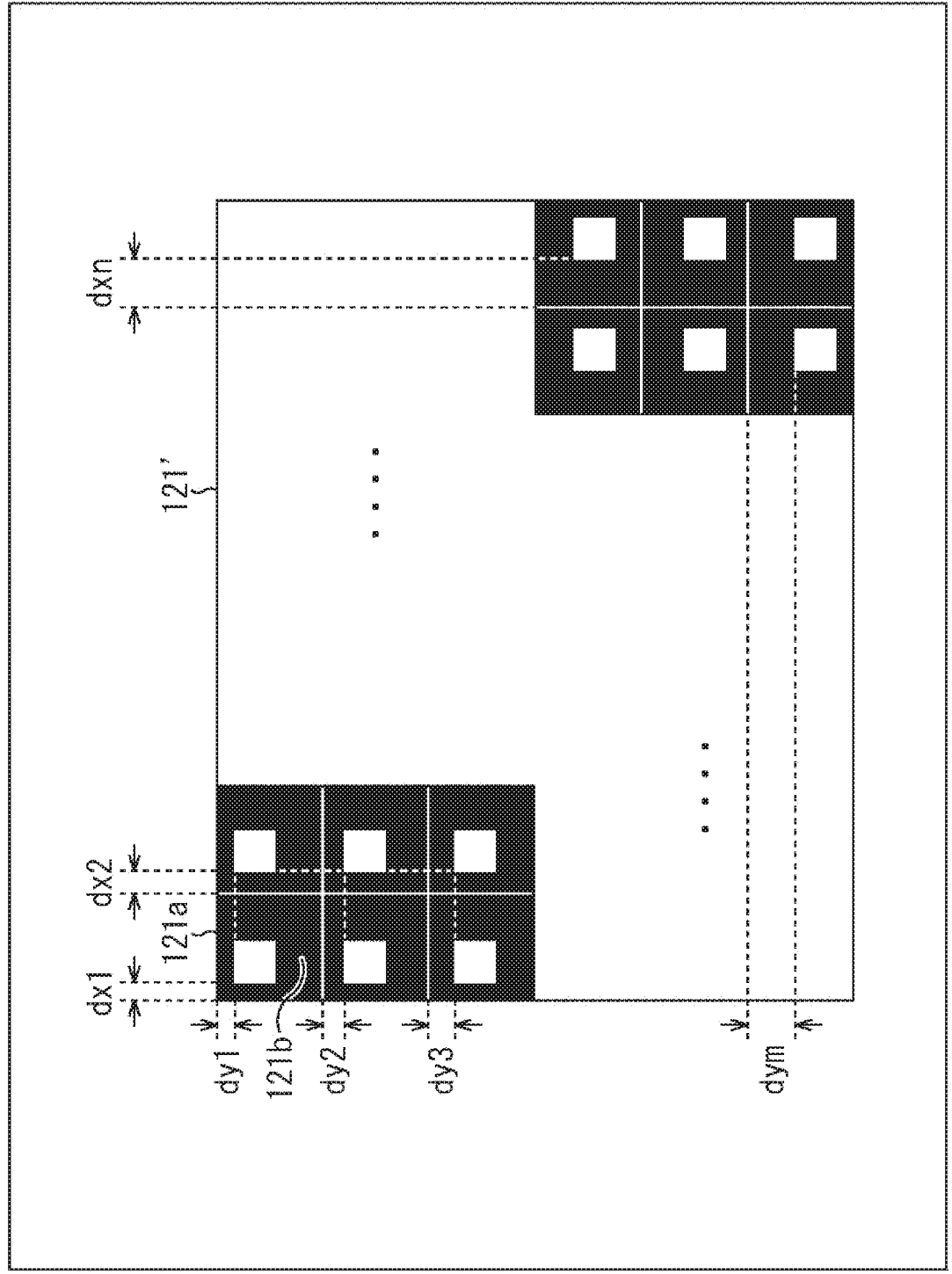
FIG. 14 is a diagram illustrating a modification.

In the above, an example has been described in which the horizontal band type, the vertical band type, and the L-shaped type light-shielding films are arranged in each pixel so that the range shielded from light randomly changes; however, for example, as illustrated by an imaging element 121' of FIG. 14, a light-shielding film 121b may be formed that shields a range (a range indicated in black in the figure) other than a range in the vicinity of a position where a light beam is received in each pixel in a case where a rectangular opening is provided.

In other words, the light-shielding film 121b may be provided so that an incident angle directivity is given in which only a light beam transmitted through the rectangular opening is received among light beams emitted from a point light source constituting a subject surface at a predetermined subject distance in a case where the rectangular opening is provided for each pixel.

Note that, in FIG. 14, for example, the horizontal width of the light-shielding film 121b changes to the widths dx1, dx2, . . . dxn with respect to the horizontal pixel arrangement, and there is a relationship of dx1<dx2< . . . <dxn. Similarly, the vertical height of the light-shielding film 121b changes to the heights dy1, dy2 . . . dym with respect to the vertical pixel arrangement, and there is a relationship of dy1<dy2< . . . <dxm. Furthermore, an interval of the change in each of the horizontal width and the vertical width of the light-shielding film 121b depends on the subject resolution (angular resolution) to be restored.

In other words, it can be said that the configuration of each pixel 121a in the imaging element 121' of FIG. 14 has incident angle directivity in which a range shielded from light is changed to correspond to the pixel arrangement in the imaging element 121' in the horizontal direction and the vertical direction.

Figure 15:
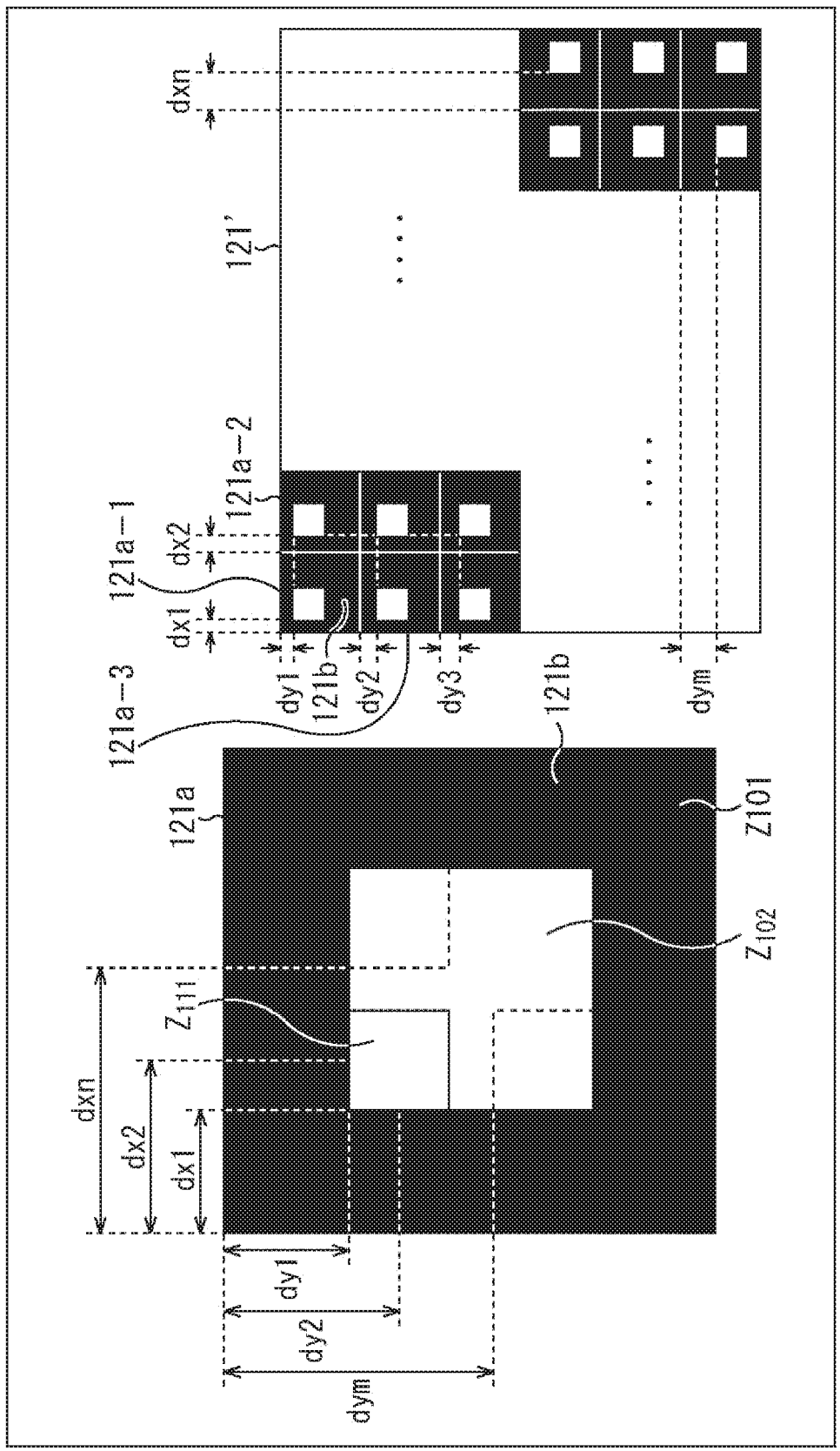
FIG. 15 is a diagram illustrating a modification.

In more detail, the light-shielding range of each pixel 121a of FIG. 14 is determined in accordance with a rule described by using the pixel 121a illustrated in the left part of FIG. 15, for example.

Note that, the right part of FIG. 15 illustrates the configuration of the same imaging element 121' as that of FIG. 14. Furthermore, the left part of FIG. 15 illustrates the configuration of the pixel 121a of the imaging element 121' in the right part of FIG. 15 (same as FIG. 14).

As illustrated in the left part of FIG. 15, the pixel is shielded by the light-shielding film 121b by the widths dx1 from the ends of the upper side and the lower side of the pixel 121a toward the inside of the pixel 121a, respectively, and shielded by the light-shielding film 121b by the heights dy1 from the ends of the left side and the right side toward the inside of the pixel 121a, respectively. Note that, in FIGS. 15 and 16, the light-shielding film 121b is in a range indicated in black.

In the left part of FIG. 15, a range shielded from light by such formation of the light-shielding film 121b is hereinafter referred to as a main light-shielding portion 2101 (black portion in the left part of FIG. 15) of the pixel 121a, and a rectangular range other than that is referred to as a range 2102.

In the pixel 121a, a rectangular opening 2111 not shielded by the light-shielding film 121b is provided in the range 2102. Thus, in the range 2102, a range other than the rectangular opening 2111 is shielded by the light-shielding film 121b.

In the pixel arrangement in the imaging element 121' of FIG. 14, as illustrated in the right part of FIG. 15 (same as FIG. 14), the pixel 121a-1 at the upper left end has a configuration in which the rectangular opening 2111 is arranged so that its left side is at a distance of the width dx1 from the left side of the pixel 121a, and its upper side is at a distance of the dy1 from the upper side of the pixel 121a.

Similarly, the pixel 121a-2 on the right side of the pixel 121a-1 has a configuration in which the rectangular opening 2111 is arranged so that its left side is at a distance of the width dx2 from the left side of the pixel 121a, and its upper side is at a distance of the height dy1 from the upper side of the pixel 121a, and the range other than the rectangular opening 2111 is shielded by the light-shielding film 121b.

Similarly, in the pixel 121a adjacent in the horizontal direction, as the arrangement proceeds to the right side in the figure, the right side of the rectangular opening 2111 moves to the widths dx1, dx2 . . . dxn from the right side of the pixel 121a. Note that, the dotted line rectangular portion of the upper right part in the range 2102 of FIG. 15 illustrates a state in which the rectangular opening 2111 is arranged so that its left side is at a distance of the width dxn from the left side of the pixel 121a, and its upper side is at a distance of the height dy1 from the upper side of the pixel 121a. Furthermore, each interval between the widths dx1, dx2 . . . dxn is a value obtained by dividing the width obtained by subtracting the width of the rectangular opening 2111 from the horizontal width of the range 2102 by the number of pixels n in the horizontal direction. In other words, the interval of the change in the horizontal direction is determined by division by the number of pixels n in the horizontal direction.

Furthermore, the horizontal position of the rectangular opening 2111 in the pixel 121*a* in the imaging element 121' is the same in the pixels 121*a* having the same horizontal position in the imaging element 121' (pixels 121*a* in the same column).

Moreover, the pixel 121*a*-3 immediately below the pixel 121*a*-1 has a configuration in which the rectangular opening 2111 is arranged so that its left side is at a distance of the width dx1 from the left side of the pixel 121*a*, and its upper side is at a distance of the height dy2 from the upper side of the pixel 121*a*, and the range other than the rectangular opening 2111 is shielded by the light-shielding film 121*b*.

Similarly, in the pixel 121*a* adjacent in the vertical direction, as the arrangement proceeds to the lower side in the figure, the upper side of the rectangular opening 2111 moves to the heights dy1, dy2, . . . dyn from the upper side of the pixel 121*a*. Note that, the dotted line rectangular portion of the lower left part in the range 2102 of FIG. 15 illustrates a state in which the rectangular opening 2111 is arranged so that its left side is at a distance of the width dx1 from the left side of the pixel 121*a*, and its upper side is at a distance of the height dym from the upper side of the pixel 121*a*. Furthermore, each interval between the heights dy1, dy2, . . . dym is a value obtained by dividing the height obtained by subtracting the height of the rectangular opening 2111 from the vertical height of the range 2102 by the number of pixels m in the vertical direction. In other words, the interval of the change in the vertical direction is determined by division by the number of pixels m in the vertical direction.

Furthermore, the vertical position of the rectangular opening 2111 in the pixel 121*a* in the imaging element 121' is the same in the pixels 121*a* having the same vertical position in the imaging element 121' (pixels 121*a* in the same row).

Moreover, the angle of view can be changed by changing the main light-shielding portion 2101 and the rectangular opening Z111 of each pixel 121*a* constituting the imaging element 121' illustrated in FIG. 15 (FIG. 14).

Figure 16:
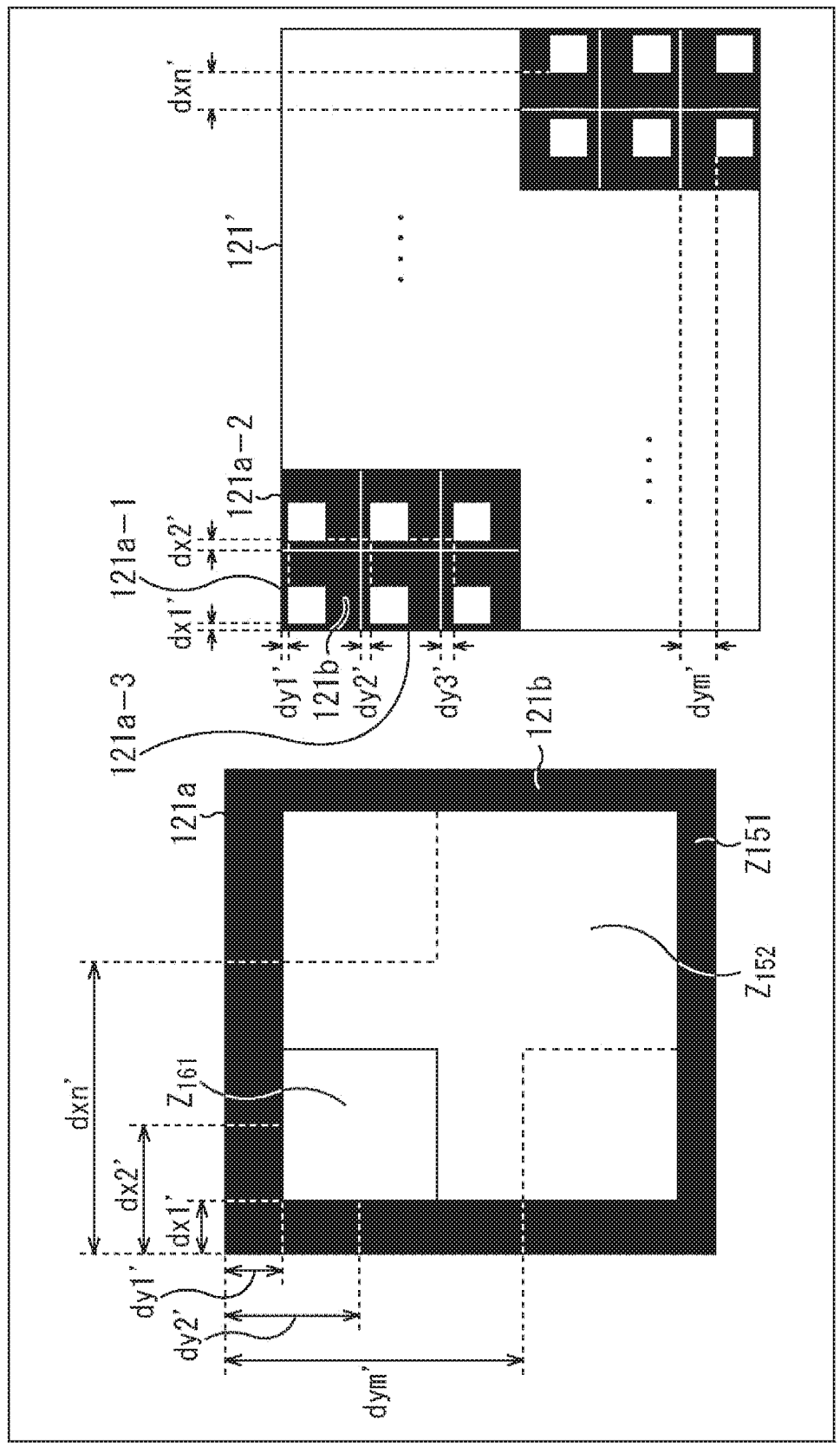
FIG. 16 is a diagram illustrating an example in which an angle of view is changed by applying the modification.

The right part of FIG. 16 illustrates a configuration of the imaging element 121' in a case where the angle of view is wider than the imaging element 121' of FIG. 15 (FIG. 14). Furthermore, the left part of FIG. 16 illustrates a configuration of the pixel 121*a* of the imaging element 121' in the right part of FIG. 16.

In other words, as illustrated in the left part of FIG. 16, for example, in the pixel 121*a*, a main light-shielding portion Z151 (black portion in the left part of FIG. 16) is set having a light-shielding range narrower than that of the main light-shielding portion 2101 in FIG. 15, and a range other than that is set to a range 2152. Moreover, in the range 2152, a rectangular opening 2161 is set having a wider opening area than that of the rectangular opening 2111.

In more detail, as illustrated in the left part of FIG. 16, the pixel is shielded by the light-shielding film 121*b* by the widths dx1' (<dx1) from the ends of the upper side and the lower side of the pixel 121*a* toward the inside of the pixel 121*a*, respectively, and shielded by the light-shielding film 121*b* by the heights dy1' (<dy1) from the ends of the left side and the right side toward the inside of the pixel 121*a*, respectively, whereby the rectangular opening 2161 is formed.

Here, as illustrated in the right part of FIG. 16, the pixel 121*a*-1 at the upper left end has a configuration in which the rectangular opening 2161 is arranged so that its left side is at a distance of the width dx1' from the left side of the pixel 121*a*, and its upper side is at a distance of the height dy1' from the upper side of the pixel 121*a*, and a range other than the rectangular opening 2161 is shielded by the light-shielding film 121*b*.

Similarly, the pixel 121*a*-2 on the right side of the pixel 121*a*-1 has a configuration in which the rectangular opening 2161 is arranged so that its left side is at a distance of the width dx2' from the left side of the pixel 121*a*, and its upper side is at a distance of the height dy1' from the upper side of the pixel 121*a*, and the range other than the rectangular opening Z161 is shielded by the light-shielding film 121*b*.

Similarly, in the pixel 121*a* adjacent in the horizontal direction, as the arrangement proceeds to the right side in the figure, the right side of the rectangular opening 2161 moves to the widths dx1', dx2' . . . dxn' from the right side of the pixel 121*a*. Here, each interval between the widths dx1', dx2' . . . dxn' is a value obtained by dividing the width obtained by subtracting the horizontal width of the rectangular opening 2161 from the horizontal width of the range 2152 by the number of pixels n in the horizontal direction. In other words, the interval of the change in the vertical direction is determined by division by the number of pixels n in the horizontal direction. Thus, the interval of the change between the widths dx1', dx2' . . . dxn' is greater than the interval of the change between the widths dx1, dx2 . . . dxn.

Furthermore, the horizontal position of the rectangular opening 2161 in the pixel 121*a* in the imaging element 121' of FIG. 16 is the same in the pixels 121*a* having the same horizontal position in the imaging element 121' (pixels 121*a* in the same column).

Moreover, the pixel 121*a*-3 immediately below the pixel 121*a*-1 has a configuration in which the rectangular opening 2161 is arranged so that its left side is at a distance of the width dx1' from the left side of the pixel 121*a*, and its upper side is at the height dy2' from the upper side of the pixel 121*a*, and the range other than the rectangular opening 2161 is shielded by the light-shielding film 121*b*.

Similarly, in the pixel 121*a* adjacent in the vertical direction, as the arrangement proceeds to the lower side in the figure, the upper side of the rectangular opening 2161 changes to the heights dy1', dy2' . . . dym' from the upper side of the pixel 121*a*. Here, the interval of the change between the heights dy1', dy2' . . . dym' is a value obtained by dividing the height obtained by subtracting the height of the rectangular opening Z161 from the vertical height of the range 2152 by the number of pixels m in the vertical direction. In other words, the interval of the change in the vertical direction is determined by division by the number of pixels m in the vertical direction. Thus, the interval of the change between the heights dy1', dy2' . . . dym' is greater than the interval of the change between the width heights dy1, dy2 . . . dym.

Furthermore, the vertical position of the rectangular opening 2161 in the pixel 121*a* in the imaging element 121' of FIG. 16 is the same in the pixels 121*a* having the same vertical position in the imaging element 121' (pixels 121*a* in the same row).

As described above, by changing the combination of the light-shielding range of the main light-shielding portion and the opening range of the opening, it becomes possible to realize the imaging element 121' including the pixels 121*a* having various angles of view (having various incident angle directivities).

Moreover, the imaging element 121 may be realized by combining not only the pixels 121a having the same angle of view but also the pixels 121a having various angles of view.

Figure 17:
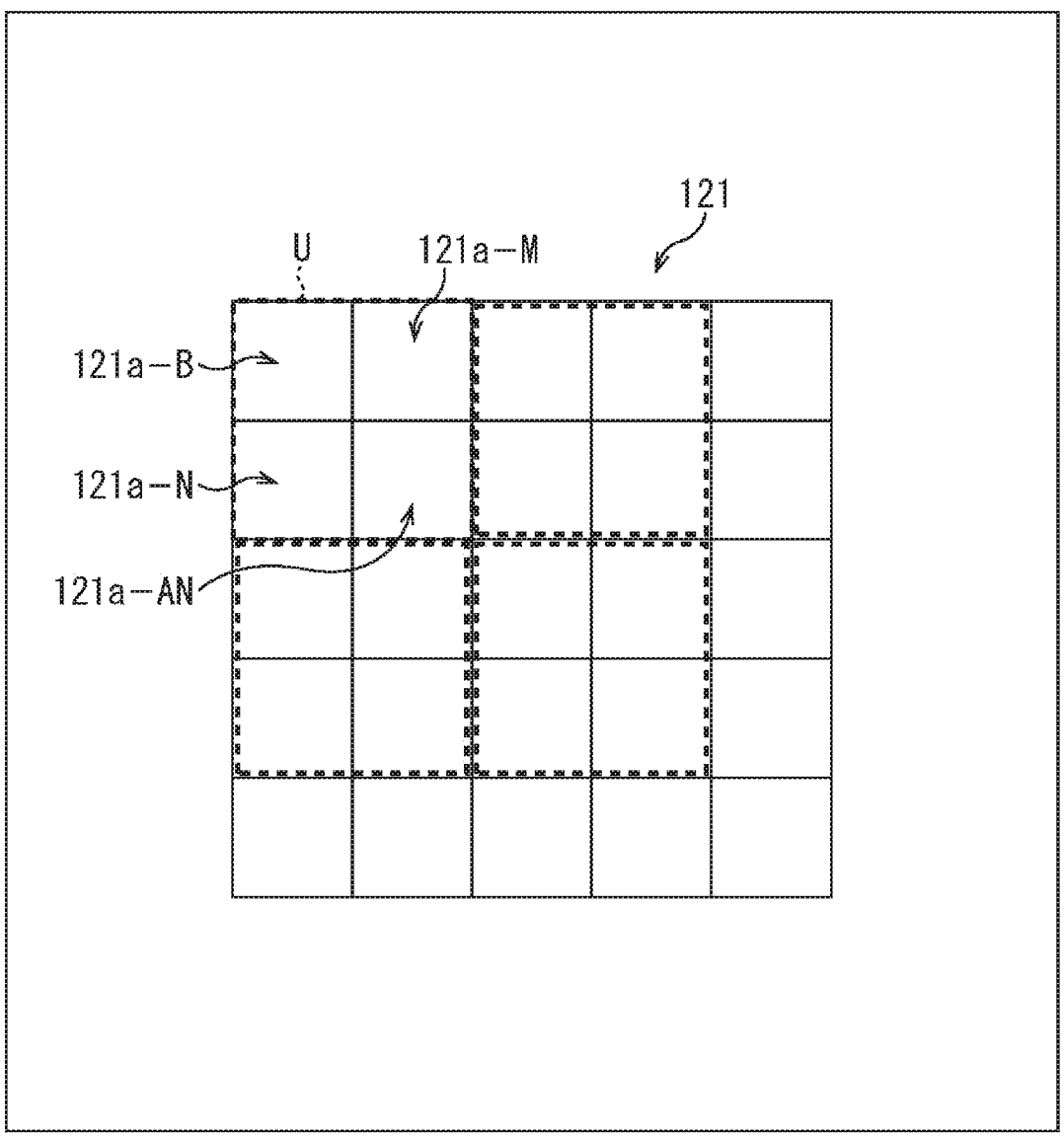
FIG. 17 is a diagram illustrating an example of combining pixels having a respective plurality of angles of view when the angle of view is changed by applying the modification.

For example, as illustrated in FIG. 17, four pixels including two pixels×two pixels indicated by a dotted line are defined as one unit U, in which each unit U includes a pixel 121a-W having a wide angle of view, a pixel 121a-M having a medium angle of view, a pixel 121a-N having a narrow angle of view, and a pixel 121a-AN having an extremely narrow angle of view.

In this case, for example, in a case where the number of pixels of all the pixels 121a is X, it becomes possible to restore a restored image by using detection images of X/4 pixels for each of the four types of angles of view. At this time, four types of different coefficient sets are used for respective angles of view, and restored images having different angles of view are restored by four types of different simultaneous equations.

For this reason, by restoring a restored image having an angle of view to be restored using a detection image obtained from a pixel suitable for imaging the angle of view to be restored, it becomes possible to restore an appropriate restored image corresponding to each of the four types of angles of view.

Furthermore, an image having an intermediate angle of view between the four types of angles of view, or an angle of view around the intermediate angle of view may be generated by interpolation from images having the four types of angles of view, and pseudo optical zoom may be realized by seamlessly generating images having various angles of view.

Although the light-shielding film has been described above, the description of this example can also be applied to a case where incident angle directivity is given by selectively using a plurality of photodiodes arranged in a pixel. That is, for example, by appropriately setting the division position (size and shape of each partial region), and the position, size, shape, and the like of each photodiode, or appropriately selecting the photodiode, an incident light directivity can be realized equivalent to the incident light directivity by the above-described light-shielding film 121b including the rectangular opening. Of course, also in this case, the imaging element 121 can be realized by combining the pixels 121a having various angles of view. Furthermore, an image having an intermediate angle of view, or an angle of view around the intermediate angle of view may be generated by interpolation from images having a plurality of types of angles of view, and pseudo optical zoom may be realized by seamlessly generating images having various angles of view.

<Third Modification>

By the way, in a case where randomness is given to a range shielded by the light-shielding film 121b of the pixel 121a in the imaging element 121, as the randomness of the difference in the range shielded by light-shielding film 121b increases, the processing load by the restoration unit 122 and the like increases. Thus, the processing load may be reduced by reducing the randomness of the difference by making a part of the difference in the range shielded by the light-shielding film 121b of the pixel 121a have regularity.

For example, an L-shaped type light-shielding film 121b obtained by combining a vertical band type and a horizontal band type is configured, and the horizontal band type light-shielding films 121b having the same width are combined for a predetermined column direction, and the vertical band type light-shielding films 121b having the same height are combined for a predetermined row direction. In this way, the light-shielding range of the light-shielding film 121b of each pixel 121a is set to a different value randomly in the pixel unit while having regularity in the column direction and the row direction. As a result, it is possible to reduce the difference in the light-shielding range of the light-shielding film 121b of each pixel 121a, in other words, the randomness of the difference in the incident angle directivity of each pixel, and it is possible to reduce the processing load outside the imaging element 121 such as the restoration unit 122.

Figure 18:
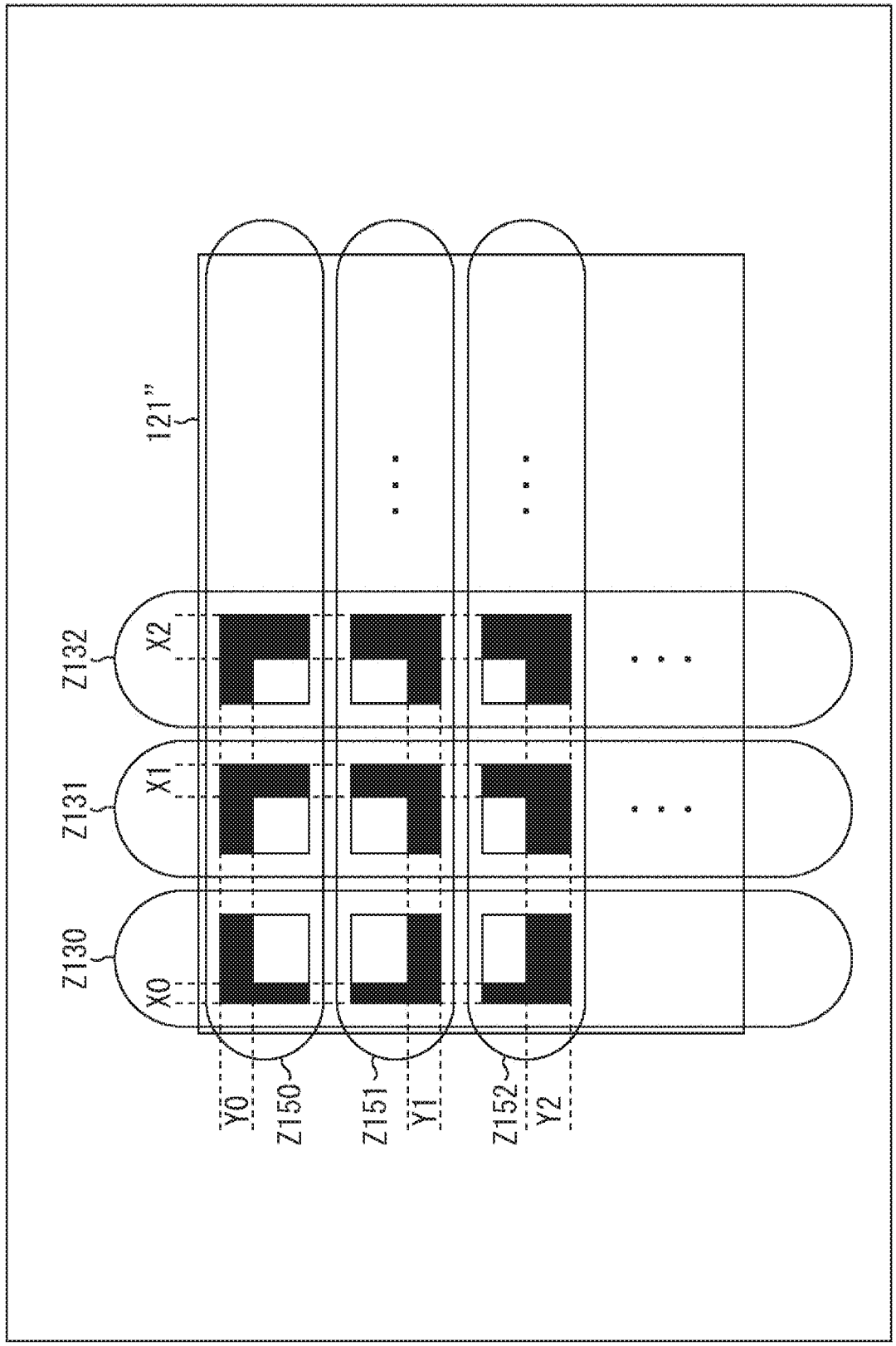
FIG. 18 is a diagram illustrating a modification.

For example, in the case of an imaging element 121" of FIG. 18, the horizontal band type light-shielding film 121b having the same width X0 is used for the pixels in the same column indicated by a range 2130, and the vertical band type light-shielding film 121b having the same height Y0 is used for the pixels in the same row indicated by a range 2150, and the L-shaped type light-shielding film 121b in which these are combined is set for the pixels 121a specified by each row and each column.

Similarly, the horizontal band type light-shielding film 121b having the same width X1 is used for the pixels in the same column indicated by a range 2131 adjacent to the range 2130, and the vertical band type light-shielding film 121b having the same height Y1 is used for the pixels in the same row indicated by a range 2151 adjacent to the range 2150, and the L-shaped type light-shielding film 121b in which these are combined is set for the pixels 121a specified by each row and each column.

Moreover, the horizontal band type light-shielding film having the same width X2 is used for the pixels in the same column indicated by a range 2132 adjacent to the range 2131, and the vertical band type light-shielding film having the same height Y2 is used for the pixels in the same row indicated by a range 2152 adjacent to the range 2151, and the L-shaped type light-shielding film 121b in which these are combined is set for the pixels 121a specified by each row and each column.

In this way, it is possible to set the range of the light-shielding film to a different value in the pixel unit while giving regularity in the horizontal width and position and the vertical height and position of the light-shielding film 121b, so that it is possible to suppress the randomness of the difference in the incident angle directivity. As a result, it becomes possible to reduce patterns of the coefficient set, and it becomes possible to reduce the processing load of calculation processing in the subsequent stage (for example, the restoration unit 122 and the like).

Figure 19:
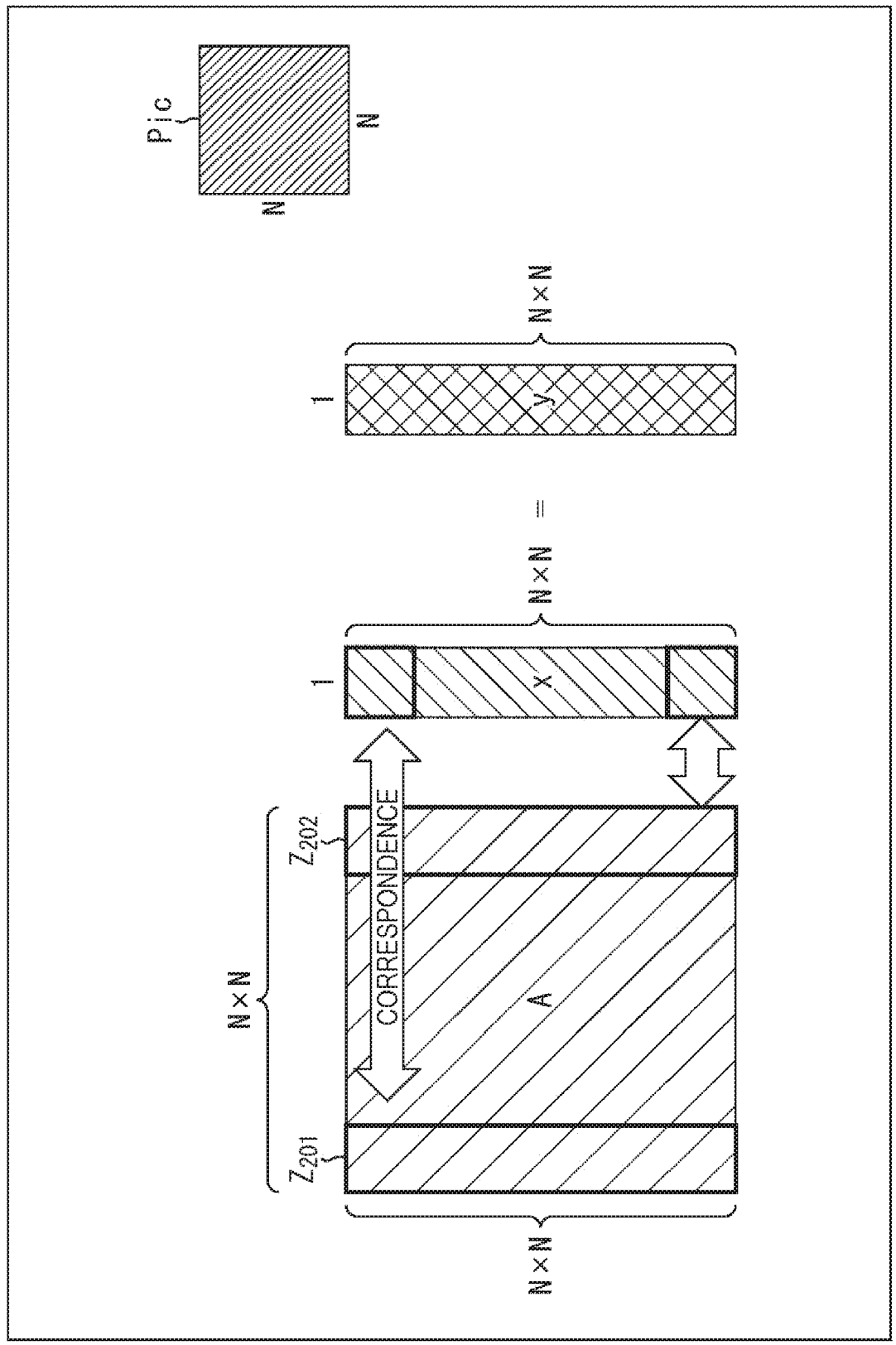
FIG. 19 is a diagram illustrating a reason why the amount of calculation and the memory capacity are reduced by providing rules for a light-shielding range in each of the horizontal direction and the vertical direction.

In more detail, as illustrated in the upper right part of FIG. 19, in a case where a restored image of N×N pixels is obtained from a detection image Pic of N pixels×N pixels, a relationship illustrated in the left part of FIG. 19 is established by a vector X having pixel values of respective pixels of the restored image of N×N rows and one column as elements, a vector Y having pixel values of respective pixels of the detection image of N×N rows and one column as elements, and an N×N by N×N matrix A including coefficient sets.

In other words, in FIG. 19, it is illustrated that a result of multiplying elements of the N×N by N×N matrix A including coefficient sets and the vector X of N×N rows and one column representing the restored image together is the vector Y of N× N rows and one column representing the detection image, and simultaneous equations are configured from this relationship.

Note that, in FIG. 19, it is illustrated that each element in the first column indicated by a range 2201 of the matrix A corresponds to the element of the first row of the vector X, and each element in the N×Nth column indicated by a range 2202 of the matrix A corresponds to the element of the N×Nth row of the vector X.

In other words, a restored image is obtained by obtaining each element of the vector X by solving simultaneous equations based on the determinant illustrated in FIG. 19. Furthermore, in a case where a pinhole is used, and in a case where a focusing function, such as an imaging lens, is used for causing incident light entering from the same direction to enter both pixel output units adjacent to each other, a relationship between a position of each pixel and an incident angle of light is uniquely determined, so that the matrix A becomes a diagonal matrix that is a square matrix in which diagonal components ((i, i) elements) are all 1 and components other than the diagonal components are all 0. Conversely, in a case where neither a pinhole nor an imaging lens is used as in the imaging element 121 of FIG. 2, the relationship between the position of each pixel and the incident angle of light is not uniquely determined, so that the matrix A does not become a diagonal matrix.

Figure 20:
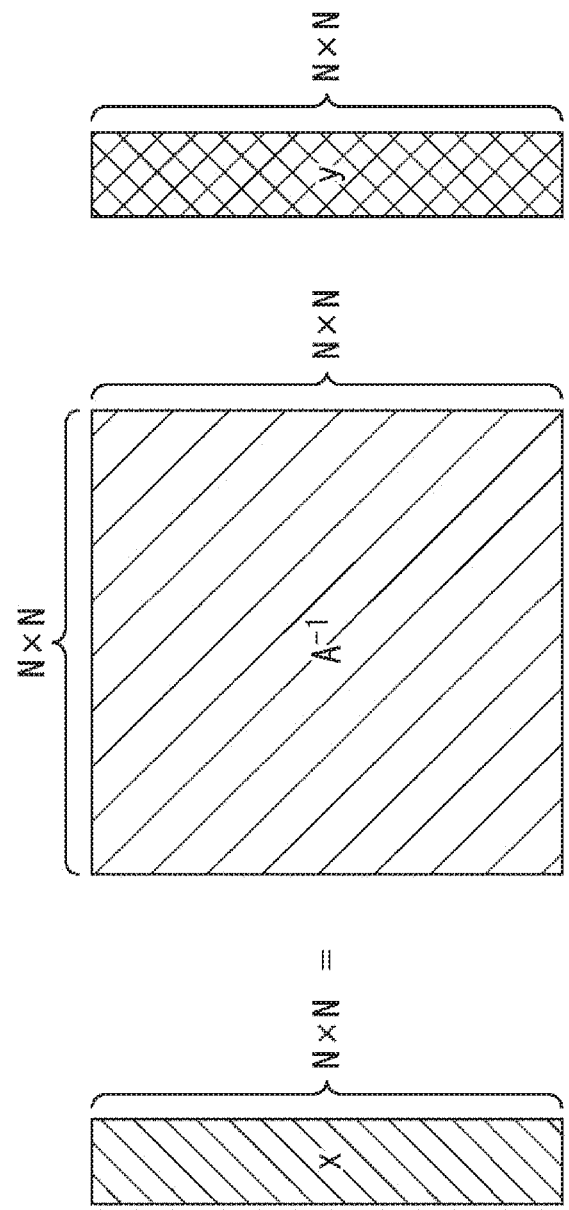
FIG. 20 is a diagram illustrating the reason why the amount of calculation and the memory capacity are reduced by providing rules for the light-shielding range in each of the horizontal direction and the vertical direction.

By the way, in general, the determinant of FIG. 19 is transformed as illustrated in FIG. 20 by multiplying both sides by an inverse matrix A-1 of the matrix A from the left, and the elements of the vector X being the detection image is obtained by multiplying the vector Y of the detection image by the inverse matrix A-1 from the right.

However, sometimes it is not possible to solve the simultaneous equations for any of reasons, such as that the real matrix A cannot be obtained accurately, cannot be measured accurately, cannot be solved in a case where the basis vector of the matrix A is close to linearly dependent, and noise is included in the elements of the detection image, or combination thereof.

Thus, considering a configuration robust against various errors, the following equation (7) using the concept of the regularized least squares method is adopted.

[Math. 1]

$$\hat{x} = \min \|A\hat{x} - y\|^2 + \|\gamma\hat{x}\|^2 \quad (7)$$

Here, in the equation (7), x with "^" at the top represents the vector X, A represents the matrix A, Y represents the vector Y, γ represents a parameter, and ||A|| represents an L2 norm (square root of sum of squares). Here, the first term is a norm when the difference between both sides in FIG. 19 is minimized, and the second term is a regularization term.

When this equation (7) is solved for x, it is expressed by the following equation (8).

[Math. 2]

$$\hat{x} = (A^t A + \gamma I)^{-1} A^t y \quad (8)$$

However, since the matrix A is enormous in size, calculation time and a large capacity memory for calculation are required.

Figure 21:
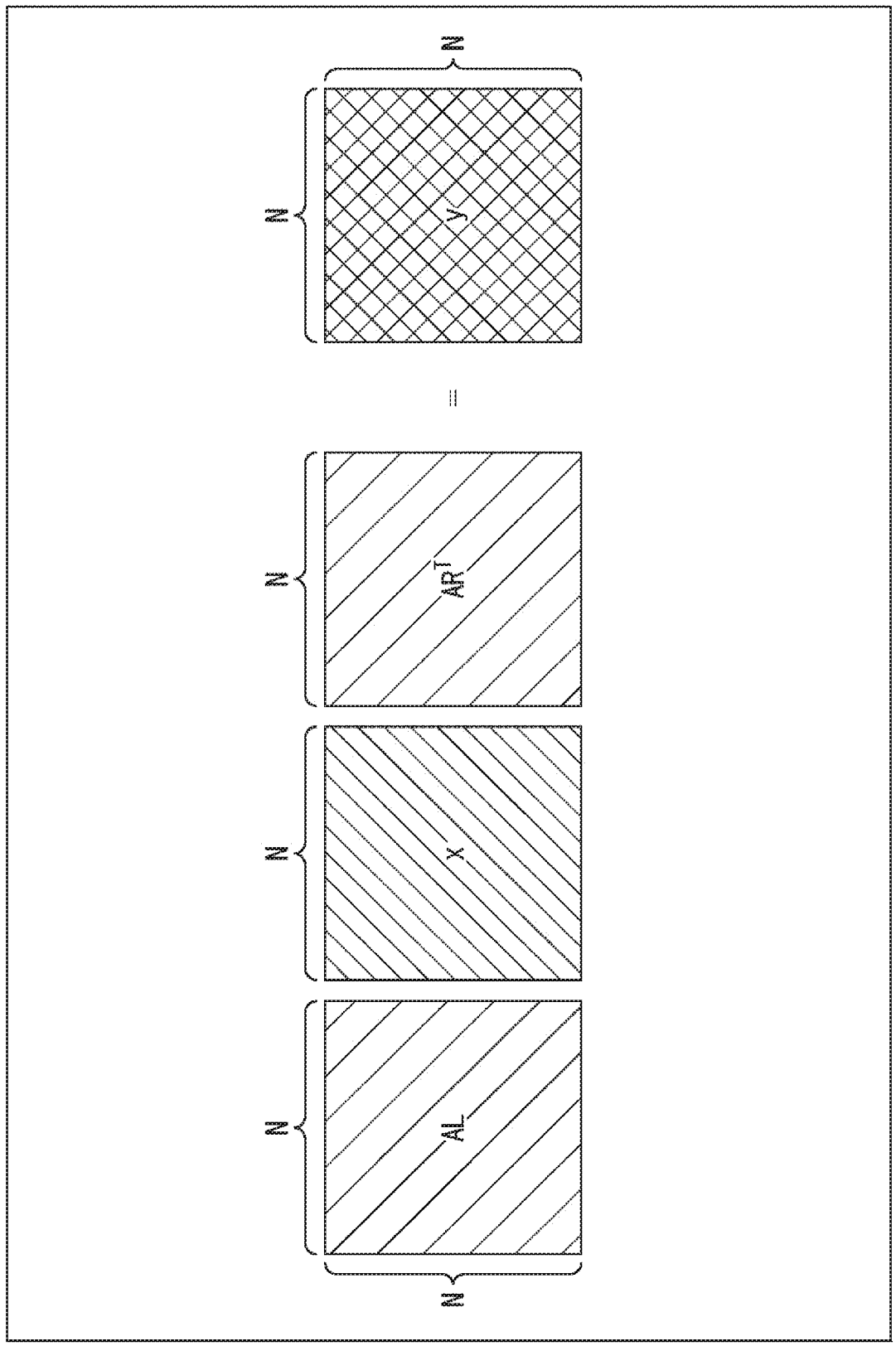
FIG. 21 is a diagram illustrating the reason why the amount of calculation and the memory capacity are reduced by providing rules for the light-shielding range in each of the horizontal direction and the vertical direction.

Thus, considering that, for example, as illustrated in FIG. 21, the matrix A is decomposed into an N by N matrix AL and an N by N matrix $AR^T$, and a result of multiplying an N by N matrix X representing a restored image by the decomposed matrices respectively from the preceding stage and the subsequent stage becomes an N by N matrix Y representing the detection image. Therefore, for the matrix A with the number of elements (N×N)×(N×N), the matrices AL and $AR^T$ with the number of elements (N×N) are obtained, so that the number of elements can be reduced to 1/(N×N). As a result, it is only necessary to use two matrices AL and $AR^T$ having the number of elements (N×N), so that the amount of calculation and the memory capacity can be reduced.

Here, $A^T$ is a transposed matrix of the matrix A, γ is the parameter, and I is a unit matrix. In the equation (8), the matrix in parentheses is set as the matrix AL, and the inverse matrix of the transposed matrix of the matrix A is set as the matrix $AR^T$. The determinant illustrated in FIG. 21 is realized.

Figure 22:
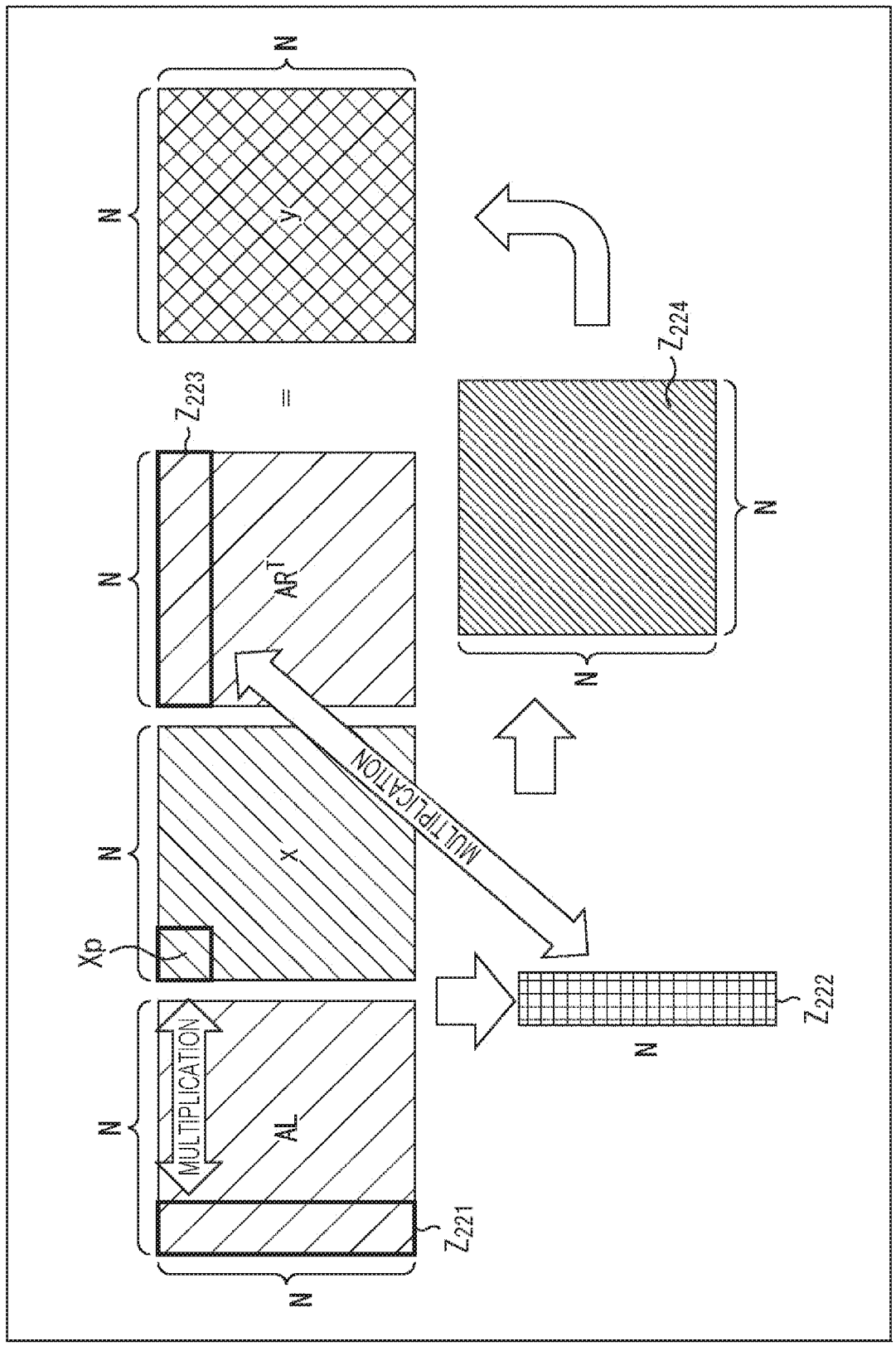
FIG. 22 is a diagram illustrating the reason why the amount of calculation and the memory capacity are reduced by providing rules for the light-shielding range in each of the horizontal direction and the vertical direction.

In the calculation as illustrated in FIG. 21 in this way, as illustrated in FIG. 22, elements 2222 are obtained by multiplying a target element Xp in the matrix X by each of elements 2221 of a corresponding column of the matrix AL. Moreover, by multiplying the elements 2222 and elements in a row corresponding to the target element Xp of the matrix $AR^T$, a two-dimensional response 2224 corresponding to the target element Xp is obtained. Then, the two-dimensional responses 2224 corresponding to all the elements of the matrix X are integrated together, whereby the matrix Y is obtained.

Thus, to the elements 2221 corresponding to respective rows of the matrix AL, a coefficient set is given corresponding to the incident angle directivity of the horizontal band type pixel 121a set to the same width for each column of the imaging element 121 illustrated in FIG. 18.

Similarly, to elements 2223 of each row of the matrix $AR^T$, a coefficient set is given corresponding to the incident angle directivity of the vertical band type pixel 121a set to the same height set for each row of the imaging element 121 illustrated in FIG. 18.

As a result, since it becomes possible to reduce the size of the matrix used when the restored image is restored on the basis of the detection image, the amount of calculation is reduced, whereby it becomes possible to improve the processing speed and reduce the power consumption related to the calculation. Furthermore, since the size of the matrix can be reduced, it becomes possible to reduce the memory capacity used for the calculation, and reduce the apparatus cost.

Note that, the example of FIG. 18 illustrates an example in which the range shielded from light in the pixel unit (range in which light can be received) is changed while the predetermined regularity is given in the horizontal direction and the vertical direction; however, in the technology of the present disclosure, a range shielded from light in the pixel unit (range in which light can be received) as described above is not randomly set completely, but randomly set to some extent is also considered as being randomly set. In other words, in the present disclosure, not only a case where the range shielded from light in the pixel unit (range in which light can be received) is randomly set completely, but also a case where the range is randomly set to some extent (for example, a case where a range having regularity is partially included, but the other range has randomness, among all the pixels), or a case where regularity does not seem to exist to some extent (a case of an arrangement in which it cannot be confirmed that arrangement is performed in accordance with the rule described with reference to FIG. 18, among all the pixels), is also considered to be random.

Although the light-shielding film has been described above, the description of this example can also be applied to a case where incident angle directivity is given by selectively using a plurality of photodiodes arranged in a pixel. That is, for example, by appropriately setting the division position (size and shape of each partial region), and the position, size, shape, and the like of each photodiode, or appropriately selecting the photodiode, an incident light directivity can be realized equivalent to the incident light directivity in a case where a part of the change in the range shielded by the light-shielding film 121*b* of the pixel 121*a* described above is made to have regularity. In this way, it is possible to reduce the randomness in the incident angle directivity of each pixel, and reduce the processing load outside the imaging element 121 such as the restoration unit 122.

<Fourth Modification>

Variations in the shape of the light-shielding film 121*b* in pixel units are arbitrary, and are not limited to the above examples. For example, different incident angle directivity may be given (set) by setting the light-shielding film 121*b* as a triangle and making the range different, or different incident angle directivity may be given by setting the light-shielding film 121*b* as a circle and making the range different. Furthermore, for example, a light-shielding film or the like having a linear shape in an oblique direction may be used.

Furthermore, a variation (pattern) of the light-shielding film 121*b* may be set by a plurality of pixel units constituting a unit including a predetermined number of multiple pixels. This one unit may include any pixel. For example, the imaging element 121 may include a color filter, and the unit may include a pixel constituting a unit of color arrangement of the color filter. Furthermore, a pixel group in which pixels having different exposure times are combined may be used as a unit. Note that, it is desirable that the randomness of the pattern in the range shielded by the light-shielding film 121*b* in each pixel constituting the unit is high, in other words, the pixels constituting the unit respectively have different incident angle directivities.

Furthermore, the arrangement pattern of the light-shielding film 121*b* may be set between the units. For example, the width and position of the light-shielding film may be changed for each unit. Moreover, a pattern in a range shielded by the light-shielding film 121*b* may be set within a unit including a plurality of pixels classified in different categories or between units.

Although the light-shielding film has been described above, the description of this example can also be applied to a case where incident angle directivity is given by selectively using a plurality of photodiodes arranged in a pixel. That is, for example, by appropriately setting the division position (size and shape of each partial region), and the position, size, shape, and the like of each photodiode, or appropriately selecting the photodiode, an incident light directivity can be realized equivalent to the incident light directivity in a case where a part of the change in the range shielded by the light-shielding film 121*b* of the pixel 121*a* described above is made to have regularity. In this way, it is possible to reduce the randomness in the incident angle directivity of each pixel, and reduce the processing load outside the imaging element 121 such as the restoration unit 122.

Although the light-shielding film has been described above, the description of this example can also be applied to a case where incident angle directivity is given by selectively using a plurality of photodiodes arranged in a pixel. That is, by appropriately setting the division position (size and shape of each partial region), the position, size, shape, and the like of each photodiode, or appropriately selecting the photodiode, an incident light directivity can be realized equivalent to the incident light directivity by a light-shielding film having an arbitrary shape, for example, a triangle, a circle, a linear shape in an oblique direction, or the like.

Furthermore, for example, setting of the division position (size and shape of each partial region), setting of the position, size, shape, and the like of each photodiode, selection of the photodiode, and the like may be set for each unit similarly to the case of the light-shielding film 121*b* described above.

<Control of Photodiode>

In a case where a plurality of photodiodes arranged in a pixel as described above with reference to FIG. 5 is selectively used, the incident angle directivity of the output pixel value of the pixel output unit may be made to be variously changed by switching the presence/absence and degree of contribution to the output pixel value of each pixel output unit of the plurality of photodiodes 121*f*.

Figure 23:
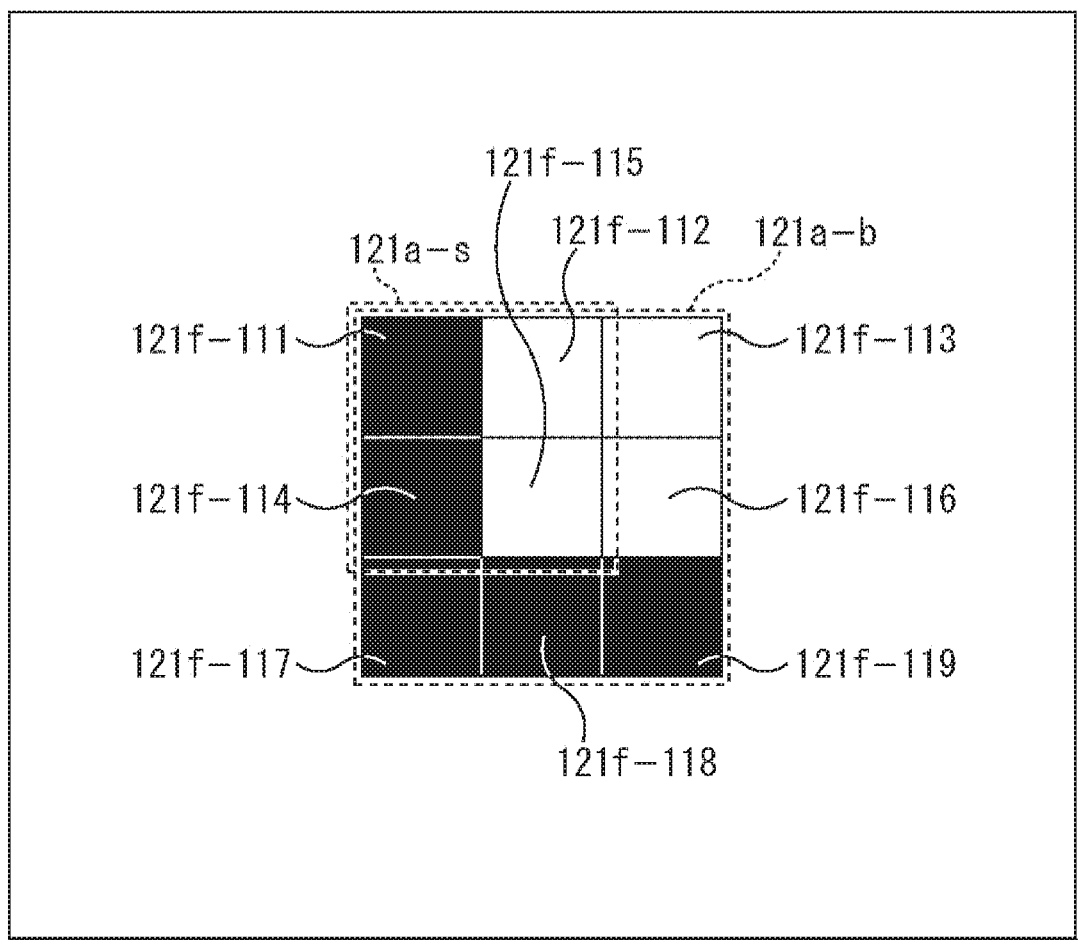
FIG. 23 is a diagram illustrating a modification.

For example, as illustrated in FIG. 23, it is assumed that nine (vertical three×horizontal three) photodiodes 121*f* of photodiodes 121*f*-111 to 121*f*-119 are arranged in the pixel 121*a*. In this case, the pixel 121*a* may be used as a pixel 121*a-b* including the photodiodes 121*f*-111 to 121*f*-119, or may be used as a pixel 121*a-s* including the photodiodes 121*f*-111, 121*f*-112, 121*f*-114, and 121*f*-115.

For example, in a case where the pixel 121*a* is the pixel 121*a-b*, the incident angle directivity of the output pixel value is controlled by controlling the presence/absence and degree of contribution to the output pixel value of the pixel 121*a* of the photodiodes 121*f*-111 to 121*f*-119. On the other hand, in a case where the pixel 121*a* is the pixel 121*a-s*, the incident angle directivity of the output pixel value is controlled by controlling the presence/absence and degree of contribution to the output pixel value of the pixel 121*a* of the photodiodes 121*f*-111, 121*f*-112, 121*f*-114, and 121*f*-115. In this case, the other photodiodes 121*f* (photodiodes 121*f*-113, 121*f*-116, 121*f*-117 to 121*f*-119) are caused not to contribute to the output pixel value.

That is, for example, in a case where the incident angle directivities of the output pixel values are different from each other between a plurality of the pixels 121*a-b*, the presence/absence and degree of contribution to the output pixel value of at least one of the photodiodes 121*f*-111 to 121*f*-119 is different. On the other hand, for example, in a case where the incident angle directivities of the output pixel values are different from each other between a plurality of the pixels 121*a-s*, the presence/absence and degree of contribution to the output pixel value of at least one of the photodiode 121*f*-111, 121*f*-112, 121*f*-114, or 121*f*-115 is different, and the other photodiodes 121*f*-113, 121*f*-116, and 121*f*-117 to 121*f*-119 do not contribute to the output pixel value commonly between these pixels.

Note that, whether the pixel 121*a* is the pixel 121*a-b* or the pixel 121*a-s* can be set for each pixel. Furthermore, this setting may be made to be performed for each unit (a plurality of pixels).

Figure 24:
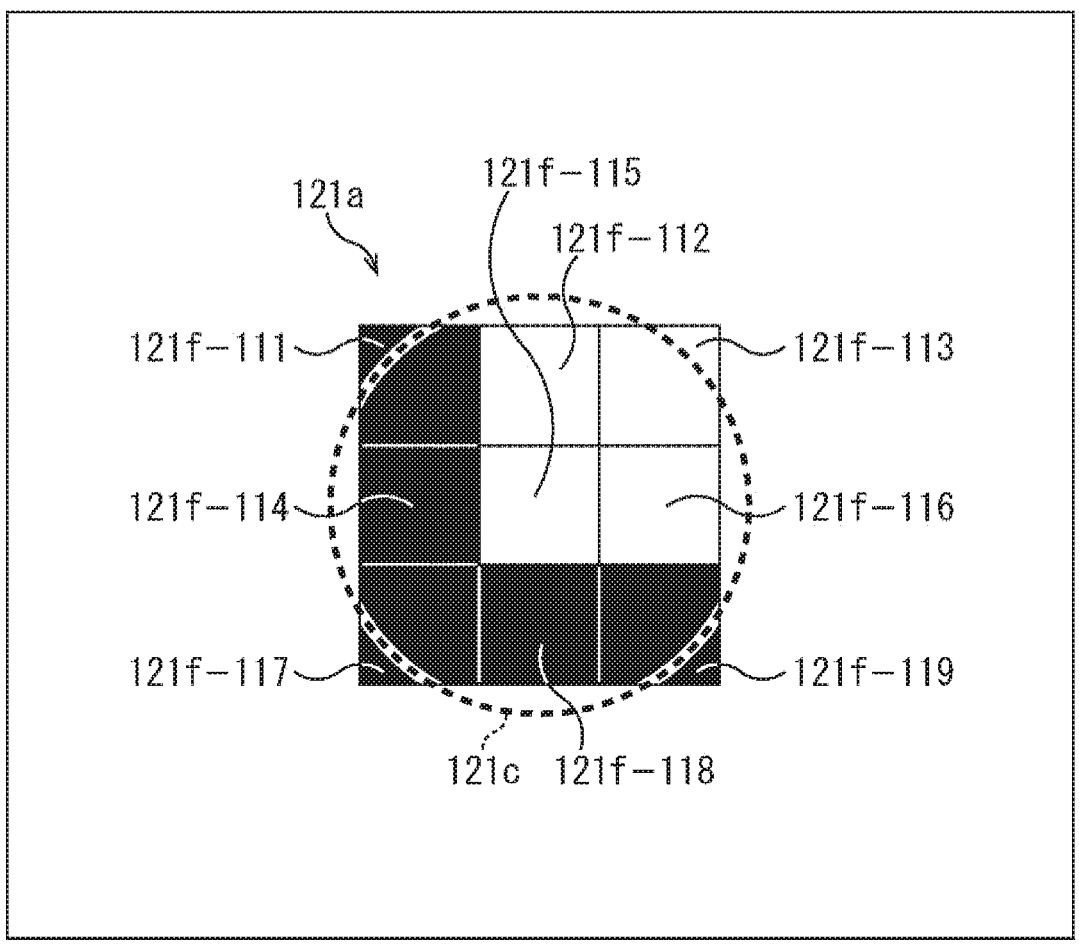
FIG. 24 is a diagram illustrating a modification.

Furthermore, as described above, one on-chip lens is formed in each pixel (each pixel output unit) of the imaging element 121. That is, in a case where the pixel 121*a* is configured as in the example illustrated in FIG. 23, one on-chip lens 121*c* is provided for the photodiodes 121*f*-111 to 121*f*-119, as illustrated in FIG. 24. Thus, as described with reference to FIG. 23, in the case where the pixel 121*a* is the pixel 121*a-b*, and also in the case where the pixel 121*a* is the pixel 121*a-s*, one pixel (one pixel output unit) and one on-chip lens 121*c* correspond to each other one to one.

<Limitation of Imaging Element>

The imaging element 121 has been described above. In the imaging apparatus 100 of FIG. 1, the imaging element 121 as described above is used. Next, a description will be given of a range of a subject that can be imaged by the imaging element 121.

<Limitation of Subject Distance>

In the imaging element 121, as the distance from the imaging surface of the imaging element 121 to the subject (subject distance) is increased, the conversion accuracy from the detection image to the captured image (restored image) is reduced. That is, the imaging element 121 substantially has an upper limit of the subject distance in which imaging is possible (distance to the farthest subject that can be imaged). Then, the upper limit is determined by the design of the imaging element 121, and it has been difficult to change the upper limit after the manufacturing.

As described above, the imaging element 121 obtains a captured image (restored image) by using the difference in the incident angle (angle from a direction perpendicular to the imaging surface) of light (incident light) from the subject to each pixel. Then, the imaging element 121 includes a plurality of pixel output units each outputting one detection signal indicating an output pixel value modulated by the incident angle of the incident light so that the difference in the incident angle can be detected more clearly. For example, the imaging element 121 has a configuration for making the incident angle directivities of output pixel values different from each other between at least two pixels. That is, in the detection signal obtained at each pixel of the imaging element 121, the difference between pixels of the incident angle of light (incident light) from the subject is expressed, and by solving simultaneous equations by using the difference, the pixel value of the captured image can be obtained. In other words, if the difference between the pixels of the incident angle included in the detection signal is small, there is a possibility that the conversion accuracy from the detection image to the captured image (restored image) is reduced.

Figure 25C:
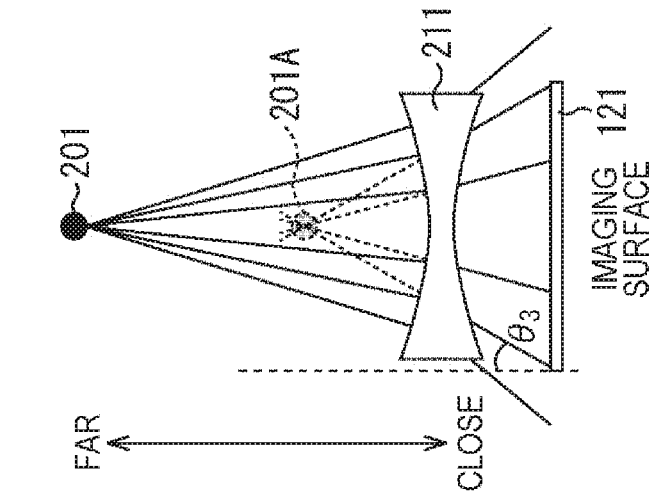
FIGS. 25A, 25B, and 25C are diagrams for explaining a subject distance and an optical system.
Figure 25B:
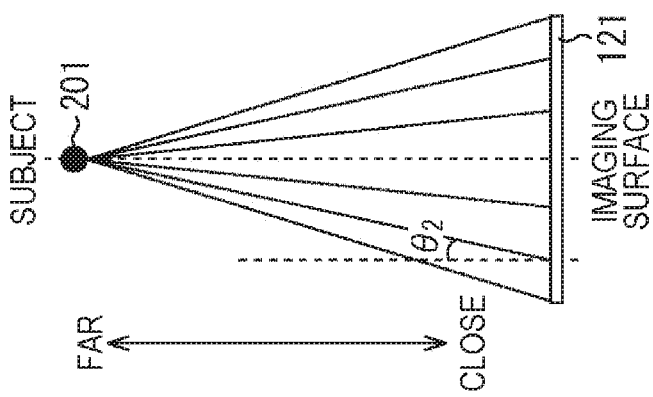
Figure 25A:
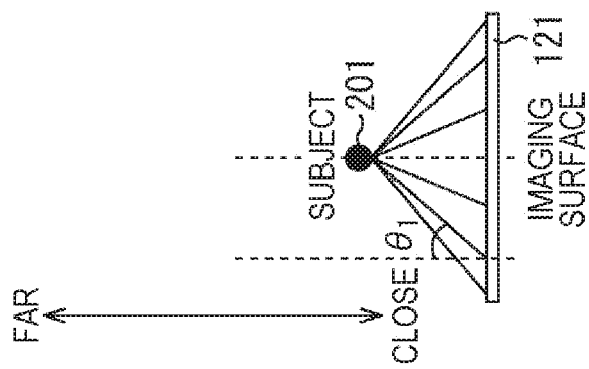

For example, when a case where the distance from the imaging surface of the imaging element 121 to a subject 201 (subject distance) is short (the subject 201 is close) as illustrated in FIG. 25A is compared with a case where the subject distance is long (the subject 201 is far) as illustrated in FIG. 25B, the incident angle θ1 of the light (incident light) from the subject 201 in the case of the case where the subject distance is short (FIG. 25A) is greater than the incident angle θ2 of the light (incident light) from the subject 201 in the case of the case where the subject distance is far (FIG. 25B). That is, in general, as the subject distance is increased, the difference in incident angle between pixels of the light from the subject 201 is decreased.

Thus, in general, as the subject distance is increased, the conversion accuracy from the detection image to the captured image (restored image) is reduced. If the conversion accuracy from the detection image to the captured image (restored image) is reduced in this way, the subjective image quality is reduced, so that if the conversion accuracy is extremely reduced, the conversion can be substantially impossible.

On the other hand, for example, as illustrated in FIG. 25C, when a concave lens 211 is provided between the subject 201 and the imaging element 121, the light from the subject is refracted in the diffusion direction by the concave lens 211, and an incident angle θ3 to the imaging surface increases. That is, when viewed from the imaging element 121, it appears that the subject 201 has moved to a nearer position (a subject 201A). Thus, the difference in incident angle of the incident light on each pixel becomes large, and the conversion accuracy from the detection image to the captured image (restored image) can be improved. In other words, the imaging element 121 can image a subject beyond the upper limit of the subject distance in which imaging is possible. That is, the range of the subject that can be imaged by the imaging element 121 can be expanded.

<Limitation of Angle>

Furthermore, the imaging element 121 has a limitation on the angle of a subject that can be imaged (an angle with the imaging surface as a reference). Then, the limitation is determined by the design of the imaging element 121, and it has been difficult to change the upper limit after the manufacturing.

Although light from the subject enters each pixel of the imaging element 121, it does not mean that the light can enter from an arbitrary angle, and there is an angle at which the light cannot enter due to the physical structure. In other words, each pixel of the imaging element 121 has a limitation on the incident angle of incident light due to the physical structure.

Figure 26A:
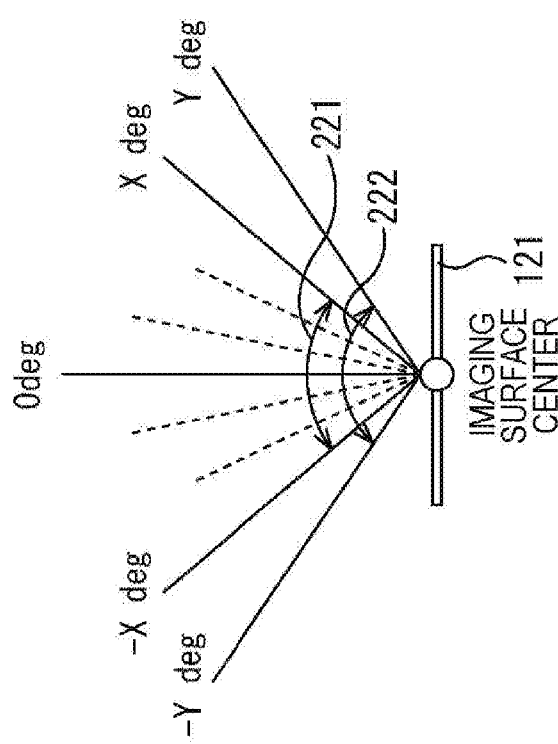
FIGS. 26A and 26B are diagrams for explaining an angle of view and an optical system.

For example, as illustrated in FIG. 26A, it is assumed that a pixel at the center of the imaging element 121 can receive incident light in a range 221 of ±X deg from a direction perpendicular to the imaging surface. In that case, the pixel cannot receive light from an angle Y deg greater than X deg, or −Y deg. That is, it is impossible to image a range 222 of ±Y deg from the direction perpendicular to the imaging surface.

Figure 26B:
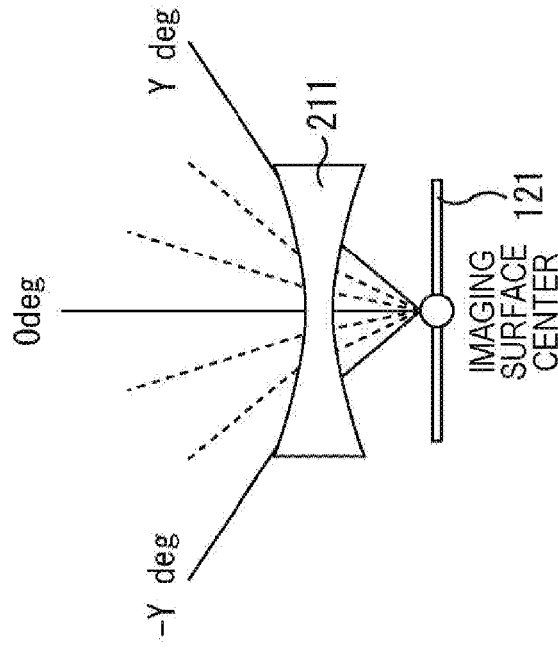

On the other hand, for example, as illustrated in FIG. 26B, when the concave lens 211 is provided on the light incident side of the imaging element 121, the light from the pixel at the center of the imaging element 121 is refracted in the diffusion direction by the concave lens 211. For example, light emitted from the pixel at an angle of ±X deg from the direction perpendicular to the imaging surface is refracted by the concave lens 211 in an angle of ±Y deg from the direction perpendicular to the imaging surface.

In other words, the light from ±Y deg from the direction perpendicular to the imaging surface enters the pixel at the center of the imaging element 121 via the concave lens 211. Thus, the imaging element 121 can image the subject beyond a range of the angle in which imaging is possible. That is, the range of the subject that can be imaged by the imaging element 121 can be expanded.

<Optical System>

In the imaging apparatus 100 of FIG. 1, for example, the concave lens 211 as described above is provided, as the optical system 120 different from the imaging lens, in front (light incident side) of the imaging element 121. Thus, the imaging apparatus 100 can image the subject beyond the range in which imaging can be performed by the imaging element 121. That is, the imaging apparatus 100 can expand the range of the subject that can be imaged by the imaging element 121. Next, the optical system 120 will be described.

<Design of Position and Curvature>

The range of the subject that can be imaged by the imaging element 121 is determined by an installation position (distance from the imaging surface) and a curvature of the concave lens 211 described above. In other words, the installation position and curvature of the concave lens 211 are only required to be designed to match a range of a desired subject (depending on what range of the subject can be imaged).

In general, as the curvature of the concave lens 211 increases, a farther subject can be imaged (it is possible to suppress the reduction of the conversion accuracy from the detection image to the captured image (restored image) in a case where a farther subject is imaged). Furthermore, in general, as the installation position of the concave lens 211 is farther from the imaging element 121, a farther subject can be imaged (it is possible to suppress the reduction of the conversion accuracy from the detection image to the captured image (restored image) in a case where a farther subject is imaged).

Figure 27B:
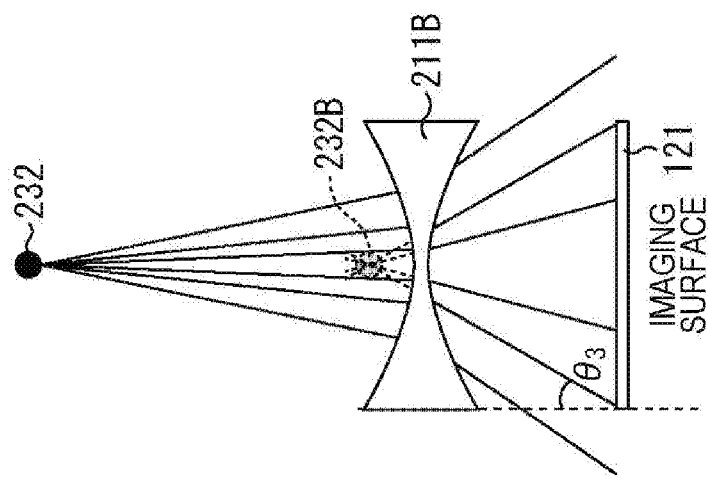
FIGS. 27A and 27B are diagrams for explaining a position of an optical system.
Figure 27A:
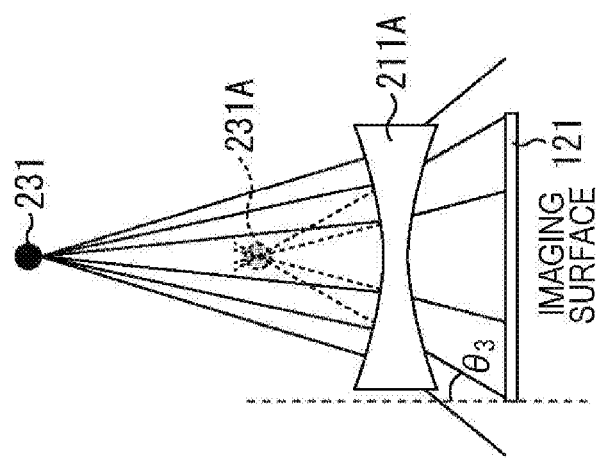

For example, in the case of FIG. 27A, a concave lens 211A having a certain curvature is installed at a certain position. In this case, the subject 201 is seen at a position of the subject 201A when viewed from the imaging surface. On the other hand, the curvature of the concave lens 211B of FIG. 27B is greater than the curvature of the concave lens 211A. Furthermore, the installation position of the concave lens 211B is farther from the imaging element 121 than the installation position of the concave lens 211A.

Thus, in the case of FIG. 27B, the subject 201 farther than in the case of FIG. 27A is seen at a position of a subject 201B nearer than the subject 201A when viewed from the imaging element 121. That is, a farther subject can be imaged in the case of FIG. 27B.

<Examples of Optical System>

In the above description, the concave lens is used as an example of the optical system 120, but the present technology is not limited to this example. The optical system 120 is only required to be configured to have a negative power and change characteristics of the incident light incident on the imaging element 121 with respect to an incident angle.

For example, as illustrated in FIG. 28A, the optical system 120 may include a single concave lens 231. That is, the optical system 120 may include a single optical element having a negative power. Furthermore, for example, as illustrated in FIG. 28B, a lens 232 and a lens 233 may be included. That is, the optical system 120 may include an optical element group (a plurality of optical elements) having a negative power as a whole. Moreover, as illustrated in FIG. 28C, the optical system 120 may include a lens group including lenses 234 to 236, and a lens 237 (constituting a lens group). That is, the optical system 120 may include an optical element (group) having a positive power as a whole, and an optical element (group) having a negative power as a whole. That is, some optical elements (groups) may have positive power.

In the above, a lens has been described as an example of the optical element, but the optical system 120 may include an optical element other than the lens. That is, the configuration of the optical system 120 is arbitrary, and it is sufficient that the optical system 120 has a negative power as a whole.

As described above, the imaging apparatus 100 includes: the optical system 120 having a negative power that is not an imaging lens; and the imaging element 121 including a plurality of pixel output units that receives incident light entering without passing through either an imaging lens or a pinhole and entering through the optical system 120, and each outputs one detection signal indicating an output pixel value modulated by an incident angle of the incident light (the imaging element 121 having, for example, a configuration for causing incident angle directivities with respect to incident light from the subject of output pixel values of at least two pixel output units among the plurality of pixel output units to be different characteristics from each other), so that by imaging the subject by the imaging element 121 through the optical system 120, it is possible to perform imaging beyond the range of the subject that can be imaged by the imaging element 121. That is, the range of the subject that can be imaged can be expanded.

<Flow of Imaging Processing>

The imaging apparatus 100 executes an imaging processing to perform imaging. An example will be described of a flow of imaging processing executed by the imaging apparatus 100, with reference to a flowchart of FIG. 29.

When the imaging processing is started, in step S101, the imaging element 121 images a subject through the optical system 120 having a negative power, and obtains data (detection signals and the like) of a detection image.

In step S102, the control unit 101 determines a subject distance. The method of determining the subject distance is arbitrary. For example, the control unit 101 may determine the subject distance on the basis of an instruction (designation of the subject distance) from the user or the like input from the input unit 111. Furthermore, for example, the control unit 101 may cause a sensor of the sensor unit 124 to perform distance measurement of a subject existing in a region designated by the user within an imaging angle of view, and set the distance information as the subject distance. Note that, the distance measurement method in this case is arbitrary, and a method may be used that does not use the sensor unit 124. Furthermore, for example, the subject distance may be determined on the basis of preset information (for example, information designating a preset subject distance) or the like.

In step S103, the control unit 101 sets image restoration coefficients used for calculation for converting the detection image into a restored image on the basis of the subject distance set in step S102. For example, in the case of the equation (1), the coefficient $\alpha 1$, the coefficient $\beta 1$, and the coefficient $\gamma 1$ are set as the image restoration coefficients. Furthermore, for example, in the case of the equation (2), the coefficient $\alpha 2$, the coefficient $\beta 2$, and the coefficient $\gamma 2$ are set as the image restoration coefficients. Moreover, for example, in the case of the equation (3), the coefficient $\alpha 3$, the coefficient $\beta 3$, and the coefficient $\gamma 3$ are set as the image restoration coefficients.

In step S104, the control unit 101 determines whether or not to restore a captured image (generate a restored image) from the detection image. The control unit 101 determines whether or not to restore the captured image on the basis of, for example, an instruction from the user or the like input from the input unit 111, preset information (for example, a setting whether or not to restore the captured image), or the like. In a case where it is determined that restoration is to be performed, the processing proceeds to step S105. In this case, the data (detection signals and the like) of the detection image read from the imaging element 121 is supplied to the restoration unit 122. Furthermore, the control unit 101 supplies the image restoration coefficient set in step S103 to the restoration unit 122.

In step S105, the restoration unit 122 converts the detection image by using the supplied data (detection signals and the like) of the detection image and the image restoration coefficients to generate a Raw image. The restoration unit 122 supplies the data of the generated Raw image, and the like as output data to the other processing units such as the output unit 112, the storage unit 113, the communication unit 114, and the recording/reproducing unit 115 via the bus 110. Furthermore, the processing proceeds to step S107.

Furthermore, in a case where it is determined in step S104 that the captured image is not restored, the processing proceeds to step S106. In this case, the data (detection signals and the like) of the detection image read from the imaging element 121 is supplied to the associating unit 123.

Furthermore, the control unit 101 supplies the image restoration coefficients set in step S103 to the associating unit 123.

In step S106, the associating unit 123 associates the supplied data (detection signals and the like) of the detection image with the image restoration coefficients. The associating unit 123 supplies the information and the like associated with each other as output data to the other processing units such as the output unit 112, the storage unit 113, the communication unit 114, and the recording/reproducing unit 115 via the bus 110. Furthermore, the processing proceeds to step S107.

In step S107, the output data is output. This output includes any method. For example, this output may include image display, data output and printing to another apparatus, storage on a storage medium, transmission to a communication partner, recording on the recording medium 116, and the like.

First, a case will be described in which a Raw image (that may be a restored image subjected to synchronization processing, color separation processing, and the like (for example, demosaic processing and the like)) is output. For example, in a case where the output is "display", the restoration unit 122 supplies the data of the Raw image, and the like to the output unit 112. The output unit 112 displays the Raw image on an image display device (for example, a liquid crystal display (LCD) or the like), or projects the Raw image from a projector. Furthermore, for example, in a case where the output is "output", the restoration unit 122 supplies the data of the Raw image, and the like to the output unit 112. The output unit 112 outputs the data of the Raw image, and the like from the external output terminal to another apparatus. Moreover, for example, in a case where the output is "storage", the restoration unit 122 supplies the data of the Raw image, and the like to the storage unit 113. The storage unit 113 stores the data of the Raw image, and the like in a storage medium included in the storage unit 113. Furthermore, for example, in a case where the output is "transmission", the restoration unit 122 supplies the data of the Raw image, and the like to the communication unit 114. The communication unit 114 communicates with another apparatus by using a predetermined communication method, and transmits the data of the Raw image, and the like to the communication partner. Moreover, for example, in a case where the output is "recording", the restoration unit 122 supplies the data of the Raw image, and the like to the recording/reproducing unit 115. The recording/reproducing unit 115 records the data of the Raw image, and the like on the recording medium 116 mounted to the recording/reproducing unit 115.

Next, a description will be given of a case where the data of the detection image, image restoration coefficients, and the like associated with each other are output. For example, in a case where the output is "display", the associating unit 123 supplies the data of the detection image, image restoration coefficients, and the like associated with each other, to the output unit 112. The output unit 112 displays information such as images and characters regarding the data of the detection image, image restoration coefficients, and the like on an image display device (for example, a liquid crystal display (LCD) or the like), or projects the information from a projector. Furthermore, for example, in a case where the output is "output", the associating unit 123 supplies the data of the detection image, image restoration coefficients, and the like associated with each other to the output unit 112. The output unit 112 outputs the data of the detection image, image restoration coefficients, and the like associated with each other from the external output terminal to another apparatus. Moreover, for example, in a case where the output is "storage", the associating unit 123 supplies the data of the detection image, image restoration coefficients, and the like associated with each other to the storage unit 113. The storage unit 113 stores the data of the detection image, image restoration coefficients, and the like associated with each other in the storage medium included in the storage unit 113. Furthermore, for example, in a case where the output is "transmission", the associating unit 123 supplies the data of the detection image, image restoration coefficients, and the like associated with each other to the communication unit 114. The communication unit 114 communicates with another apparatus by using a predetermined communication method, and transmits the data of the detection image, image restoration coefficients, and the like associated with each other to the communication partner. Moreover, for example, in a case where the output is "recording", the associating unit 123 supplies the data of the detection image, image restoration coefficients, and the like associated with each other to the recording/reproducing unit 115. The recording/reproducing unit 115 records the data of the detection image, image restoration coefficients, and the like associated with each other on the recording medium 116 mounted to the recording/reproducing unit 115.

When the output data is output, the imaging processing ends. By performing the imaging processing as described above, imaging is performed by the imaging element 121 through the optical system 120 having a negative power, so that it is possible to perform imaging beyond the range of the subject that can be imaged by the imaging element 121. That is, the range of the subject that can be imaged can be expanded.

<Signal Processing Unit>

Note that, the signal processing unit 125 (the control unit 101 thereof) executes the processing of step S103 of the imaging processing as described above, thereby being able to set coefficients (for example, a restoration matrix) used when a restored image is restored from a plurality of detection signals (for example, a detection image) obtained by imaging by the imaging element 121 through the optical system 120 having a negative power. Thus, the signal processing unit 125 can obtain appropriate coefficients even in a case where the imaging element 121 performs imaging beyond the range of the subject that can be imaged as described above. That is, an appropriate restored image can be obtained even in such a case, so that the range of the subject that can be imaged can be expanded.

2. Second Embodiment

<Optical System is Variable>

The optical system 120 may be made variable. For example, the position of the optical system 120 may be made variable. Here, the position of the optical system 120 may be, for example, a relative position with the imaging element 121 as a reference. For example, the position may be a relative position of the center of the optical system 120 (a lens and the like constituting the optical system 120) from the center of the imaging element 121.

Figure 30C:
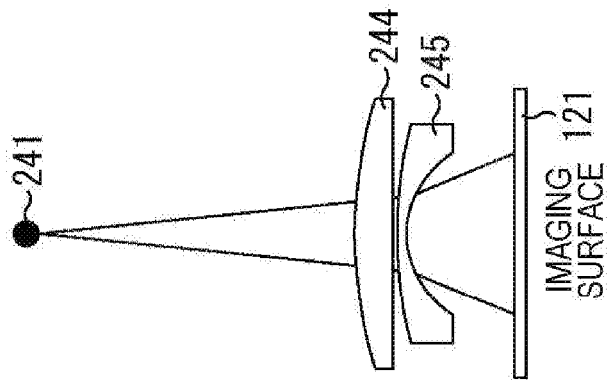
FIGS. 30A, 30B, and 30C are diagrams for explaining a change in the type and position of an optical system.
Figure 30B:
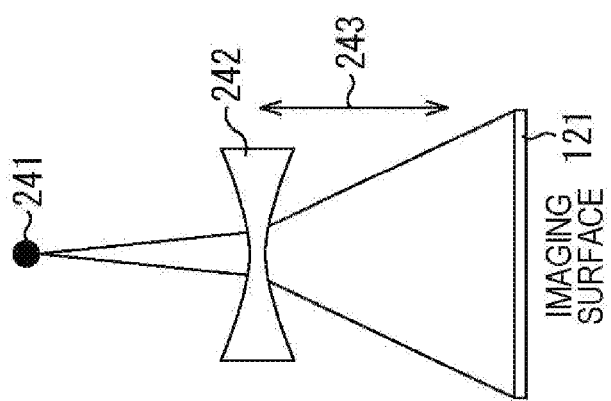
Figure 30A:
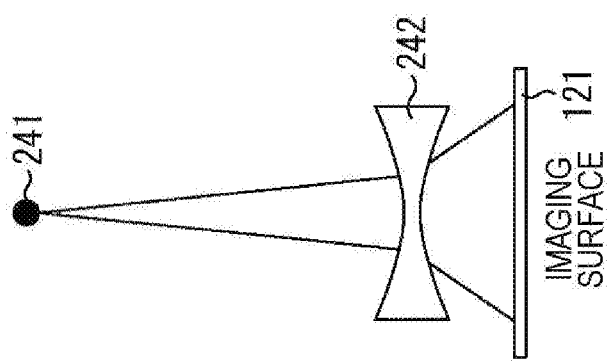

For example, as illustrated in FIG. 30A, a case where the imaging element 121 images a subject 241 through an optical element 242 having a negative power positioned at a predetermined distance from the imaging element 121 is used as a reference. On the other hand, in a case where the position of the optical element 242 is moved away from the imaging element 121 by a distance of a double arrow 243 as illustrated in FIG. 30B, the incident angle of incident light changes from the case of FIG. 30A. That is, by making the position of the optical system 120 variable, a range of the position (for example, the distance or the angle) of the subject that can be imaged by the imaging element 121 can be made variable.

Furthermore, for example, a type of the optical system 120 may be made variable. Here, the type is a classification of optical features of the optical system 120. The optical features are features of an optical element constituting the optical system 120, and may be any feature as long as it contributes to an optical influence on the range of the position of the subject that can be imaged by the imaging element 121. In a case where the optical element is a lens, for example, the structure, curvature, radius, reflectance, and the like may be used as the optical features.

That is, changing the type of the optical system 120 means changing to the optical system 120 including other optical elements having different optical features. In other words, by changing the type of the optical system 120 (the optical element constituting the optical system 120), the range of the position of the subject that can be imaged by the imaging element 121 can be changed.

For example, as illustrated in FIG. 30C, by changing the optical element 242 (FIG. 30A) to an optical element group having a negative power including an optical element 244 and an optical element 245, the incident angle of the incident light can be changed from the case of FIG. 30A. That is, by making the type of the optical system 120 variable, the range of the position (for example, the distance or the angle) of the subject that can be imaged by the imaging element 121 can be made variable.

<Imaging Apparatus>

Figure 31:
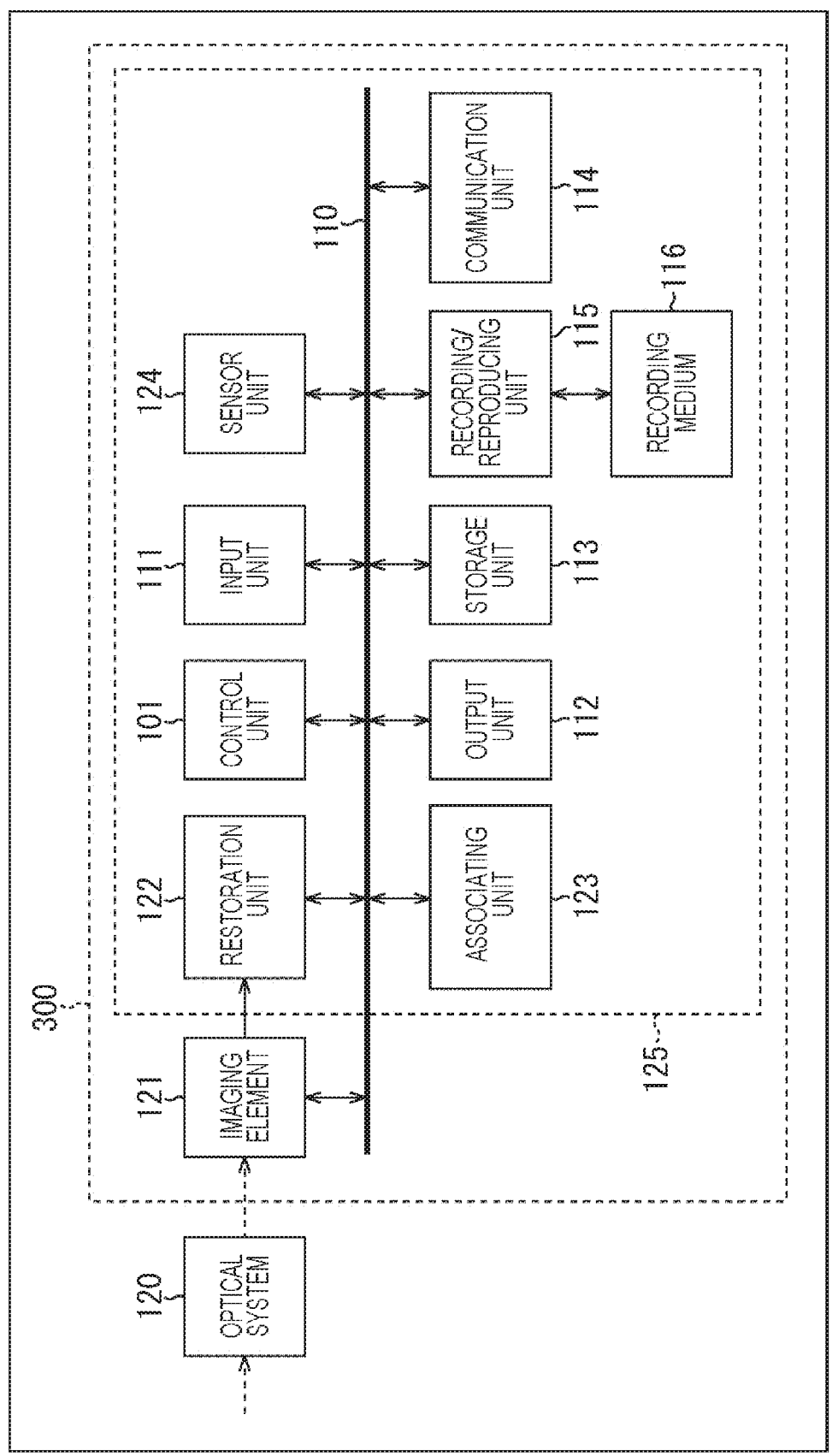
FIG. 31 is a block diagram illustrating a main configuration example of an imaging apparatus.

FIG. 31 is a diagram illustrating a main configuration example of an imaging apparatus that is an embodiment of an imaging apparatus or an image processing apparatus to which the present technology is applied in this case. An imaging apparatus 300 illustrated in FIG. 31 is an apparatus that images a subject and obtains electronic data regarding the captured image. The imaging apparatus 300 is basically an apparatus similar to the imaging apparatus 100 (FIG. 1), but unlike the imaging apparatus 100, configured such that the optical system 120 is detachable from the imaging apparatus 300.

As illustrated in FIG. 31, the imaging apparatus 300 has the same configuration as a configuration obtained by removing the optical system 120 from the imaging apparatus 100. For example, the imaging apparatus 300 includes the imaging element 121. Furthermore, the imaging apparatus 300 has a structure from which the optical system 120 is detachable. The optical system 120 can be mounted to the imaging apparatus 300 by using the structure. The optical system 120 is positioned in front (light incident side) of the imaging element 121 in a state of being mounted to the imaging apparatus 300.

Thus, in a state where the optical system 120 is mounted, the imaging apparatus 300 can perform imaging by the imaging element 121 through the optical system 120 having a negative power, similarly to the case of the imaging apparatus 100. In that case, the plurality of pixel output units included in the imaging element 121 receives incident light from the subject entering without passing through either an imaging lens or a pinhole and entering through the optical system 120 having a negative power, and each outputs one detection signal indicating an output pixel value modulated by the incident angle of the incident light. Note that, the imaging apparatus 300 can also perform imaging by the imaging element 121 without using the optical system 120 in a state where the optical system 120 is not mounted. In that case, the plurality of pixel output units included in the imaging element 121 receives incident light from the subject entering without passing through either an imaging lens or a pinhole (and without passing through the optical system 120), and each outputs one detection signal indicating an output pixel value modulated by the incident angle of the incident light.

The optical system 120 having an arbitrary structure can be mounted to the imaging apparatus 300. That is, in the imaging apparatus 300, the optical system 120 (the optical element thereof) mounted to the imaging apparatus 300 is variable. That is, the imaging apparatus 300 can make the range variable of the position (for example, the distance or the angle) of the subject that can be imaged, by changing the position and type of the optical system 120 (the optical element thereof) mounted to the imaging apparatus 300.

Here, it is assumed that attaching and detaching the optical system 120 is performed manually (for example, by manual work of the user or the like). When the position and type of the optical system 120 (the optical element thereof) are changed, the image restoration coefficients used for conversion from the detection image to the captured image or the like change. That is, in the conversion from the detection image to the captured image or the like, it is necessary to use coefficients corresponding to the position and type of the optical system 120.

Thus, in the imaging apparatus 300, the input unit 111 accepts designation of the position and type of the optical system 120 (the optical element thereof) mounted to the imaging apparatus 300 from the outside such as the user. The control unit 101 sets the coefficients corresponding to the position and type of the optical system 120 in accordance with the designation.

Note that, instead of accepting the designation from the outside, the sensor unit 124 may have a sensor that detects the position and type of the optical system 120 (the optical element thereof) mounted to the imaging apparatus 300. The method of detecting the position and type is arbitrary. The control unit 101 sets the coefficient corresponding to the position and type of the optical system 120 in accordance with the detection result of the sensor.

For example, the storage unit 113 stores in advance a coefficient set group corresponding to the positions and types of various optical systems, and the control unit 101 selects and acquires a desired coefficient set (corresponding to the position and type of the optical system 120 (the optical element thereof) mounted to the imaging apparatus 300) from the coefficient set group, and sets image restoration coefficients corresponding to the subject distance by using the coefficient set. In this way, the imaging apparatus 300 can perform conversion from the detection image to the captured image or the like by using appropriate coefficients, and can perform the conversion more accurately.

Note that, the coefficient set group stored in advance in the storage unit 113 may be made to be updated. In other words, the coefficient set group may be made to be stored in the storage unit 113 after the shipment. Furthermore, for example, the storage unit 113 may store coefficient set groups corresponding to the positions and types of the representative optical systems, and the control unit 101 may perform interpolation processing or the like by using coefficient sets corresponding to the positions and types of the representative optical systems, to calculate a desired coefficient set. Furthermore, for example, the control unit 101 may calculate a desired coefficient set by a predetermined calculation without storing the coefficient set in the storage unit 113.

<Flow of Imaging Processing>

Next, an example will be described of a flow of imaging processing in this case, with reference to a flowchart of FIG. 32.

When the imaging processing is started, in step S121, the sensor unit 124 specifies the type and position (relative position with the imaging element 121 as a reference) of the optical system 120 (the optical element thereof) mounted to the imaging apparatus 300.

In step S122, the imaging element 121 images a subject through the optical system 120 having a negative power mounted to the imaging apparatus 300, and obtains data (detection signals and the like) of a detection image.

In step S123, the control unit 101 sets a coefficient set corresponding to the type and position of the optical system. For example, the control unit 101 selects and acquires a coefficient set corresponding to the position and type of the optical system 120 (the optical element thereof) mounted to the imaging apparatus 300 from the coefficient set group stored in the storage unit 113.

In step S124, the control unit 101 determines a subject distance. The method of determining the subject distance is arbitrary similarly to the case of the first embodiment.

In step S125, the control unit 101 sets image restoration coefficients by using the coefficient set that is set in step S123 and the subject distance determined in step S124.

Each processing step from steps S126 to S129 is executed similarly to each processing step from steps S104 to S107 (FIG. 29).

When the output data is output in step S129, the imaging processing ends. By performing the imaging processing as described above, imaging is performed by the imaging element 121 through the optical system 120 mounted to the imaging apparatus 300 and having a negative power, so that it is possible to perform imaging beyond the range of the subject that can be imaged by the imaging element 121. That is, the range of the subject that can be imaged can be expanded. Furthermore, as compared with the case of the first embodiment, imaging can be performed by using more various optical systems 120, so that the range of the subject that can be imaged can be further expanded.

3. Third Embodiment

<Optical System Setting Function>

Note that, the imaging apparatus 300 may be made to set the type and position of the optical system 120. For example, the imaging apparatus 300 may select and set an appropriate optical system 120 (the optical element thereof) depending on the imaging conditions and the like from candidates of a plurality of optical systems 120 (plurality of optical elements) having different types or positions from each other. For example, the imaging apparatus 300 may select and set the type and position of the optical system 120 (the optical element thereof) depending on the subject distance.

In this case, the imaging apparatus 300 has a configuration basically similar to that of the second embodiment illustrated in FIG. 31. However, although not illustrated, for example, the bus 110 is also connected to the optical system 120 so that the control unit 101 can control the optical system 120.

Furthermore, the optical system 120 in this case includes a plurality of optical system candidates, and selects an optical system to be installed in front of the imaging element 121 from the candidates. Furthermore, in the optical system 120 in this case is enabled to change (that is, move) the position (relative position with the imaging element 121 as a reference) of the optical system 120 (the optical element thereof). The optical system 120 performs such selection and change in accordance with the control of the control unit 101, for example.

Similarly to the cases of the first and second embodiments, the control unit 101 determines the subject distance. Moreover, the control unit 101 determines an appropriate type and position of the optical system 120 (the optical element thereof) for the determined subject distance, and controls the optical system 120 as appropriate.

In this way, the imaging apparatus 300 can set more various optical systems 120 more easily, so that the range of the subject that can be imaged can be expanded more easily than in the case of the second embodiment.

Note that, the method of determining the subject distance in this case is arbitrary similarly to the cases of the first embodiment and the second embodiment.

<Flow of Imaging Processing>

Next, an example will be described of a flow of imaging processing in this case, with reference to a flowchart of FIG. 33.

When the imaging processing is started, in step S141, the imaging apparatus 300 performs optical system setting processing, and sets an optical system to be set in the imaging apparatus 300 as the optical system 120.

Each processing step of steps S142 and S143 is executed similarly to each processing step of steps S122 and S123.

In step S144, the control unit 101 sets image restoration coefficients by using the coefficient set that is set in step S143 and the subject distance determined in step S141.

Figure 32:
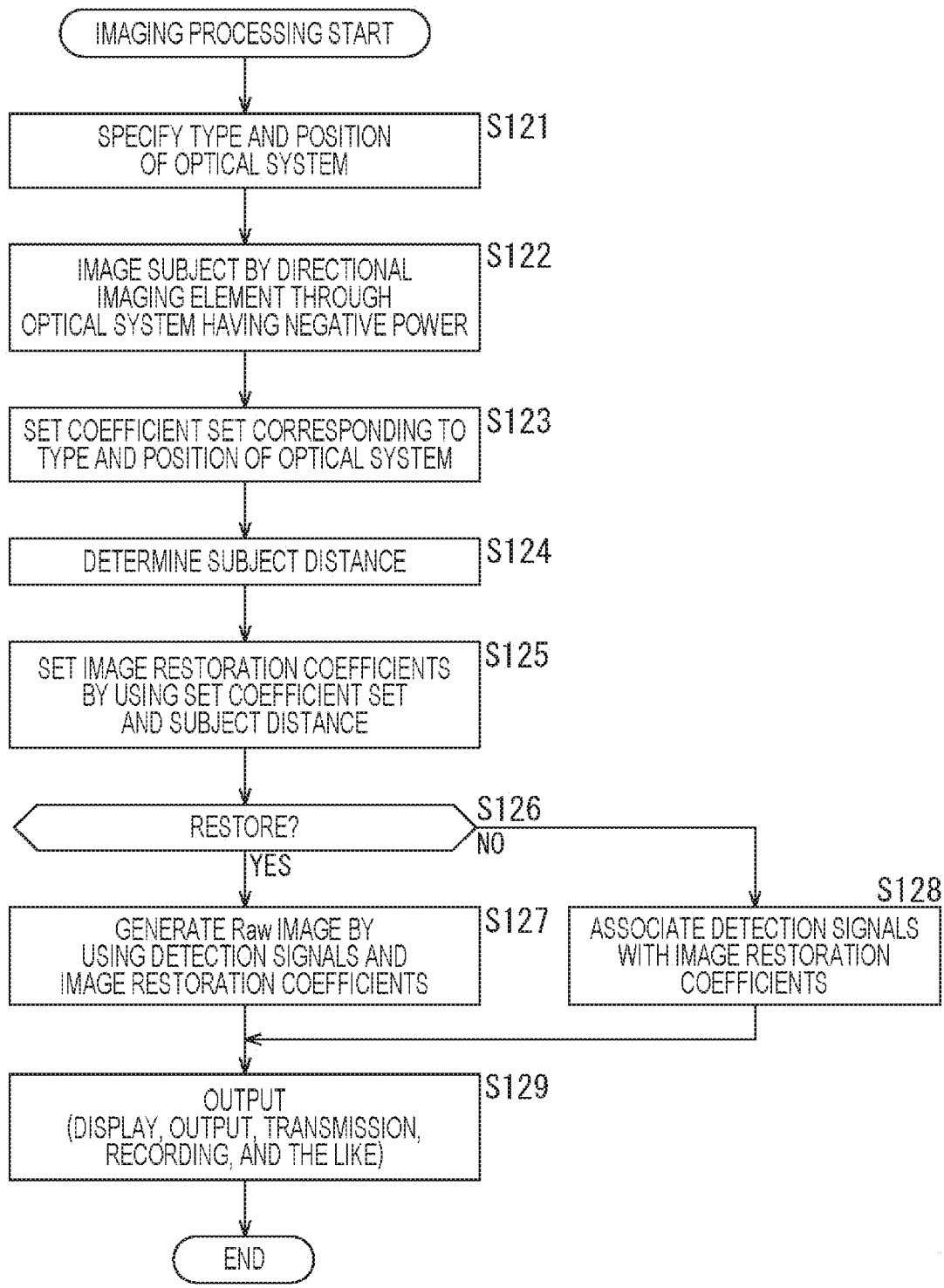
FIG. 32 is a flowchart illustrating an example of a flow of imaging processing.

Each processing step of steps S145 to S148 are executed similarly to each processing step of steps S126 to S129 (FIG. 32).

When the output data is output in step S148, the imaging processing ends. By performing the imaging processing as described above, imaging is performed by the imaging element 121 through the optical system 120 mounted to the imaging apparatus 300 and having a negative power, so that it is possible to perform imaging beyond the range of the subject that can be imaged by the imaging element 121. That is, the range of the subject that can be imaged can be expanded. Furthermore, as compared with the case of the first embodiment, imaging can be performed by using more various optical systems 120, so that the range of the subject that can be imaged can be further expanded. Moreover, the imaging apparatus 300 selects the optical system 120 of an appropriate position and type, so that the range of the subject that can be imaged can be expanded more easily than in the case of the second embodiment.

<Flow of Optical System Setting Processing>

Next, with reference to a flowchart of FIG. 34, an example will be described of a flow of the optical system setting processing executed in step S141 of FIG. 33.

When the optical system setting processing is started, in step S161, the input unit 111 accepts designation of a subject distance from the outside such as the user, for example.

In step S162, the control unit 101 specifies an appropriate type and position of the optical system depending on the subject distance designated by the input accepted in step S161.

In step S163, the control unit 101 acquires information regarding the currently set optical system from the optical system 120 mounted to the imaging apparatus 300. The information regarding the currently set optical system includes, for example, information indicating the type and position of the optical system.

In step S164, the control unit 101 determines whether or not the currently set optical system needs to be changed on the basis of the appropriate type and position of the optical system specified in step S162 and the information acquired in step S163.

For example, in a case where it is determined that the appropriate type of the optical system specified in step S162 does not match the type of the optical system currently set acquired in step S163, and change is necessary, the processing proceeds to step S165.

In step S165, the optical system 120 is controlled by the control unit 101 to change the type of the optical system. in other words, the optical system 120 changes the currently set optical system to the appropriate optical system specified in step S162.

Upon completion of the processing of step S165, the processing proceeds to step S166. Furthermore, in step S164, for example, in a case where it is determined that the appropriate type of the optical system specified in step S162 matches the type of the optical system currently set acquired in step S163, and it is not necessary to change the type of the optical system, the processing of step S165 is omitted, and the processing proceeds to step S166.

In step S166, the control unit 101 determines whether or not the currently set optical system needs to be moved on the basis of the appropriate type and position of the optical system specified in step S162 and the information acquired in step S163.

For example, in a case where it is determined that the appropriate position of the optical system (the optical element thereof) specified in step S162 does not match the position of the currently set optical system (the optical element thereof) acquired in step S163, and movement is necessary, the processing proceeds to step S167.

In step S167, the optical system 120 is controlled by the control unit 101 to change the position of the optical system (the optical element thereof). In other words, the optical system 120 moves the currently set optical system (the optical element thereof) to the appropriate position specified in step S162. Note that, this movement is performed within the optical system 120, that is, the position of the optical element constituting the optical system 120 is moved without changing the position of the entire optical system 120, or the entire optical system 120 may be moved.

Figure 33:
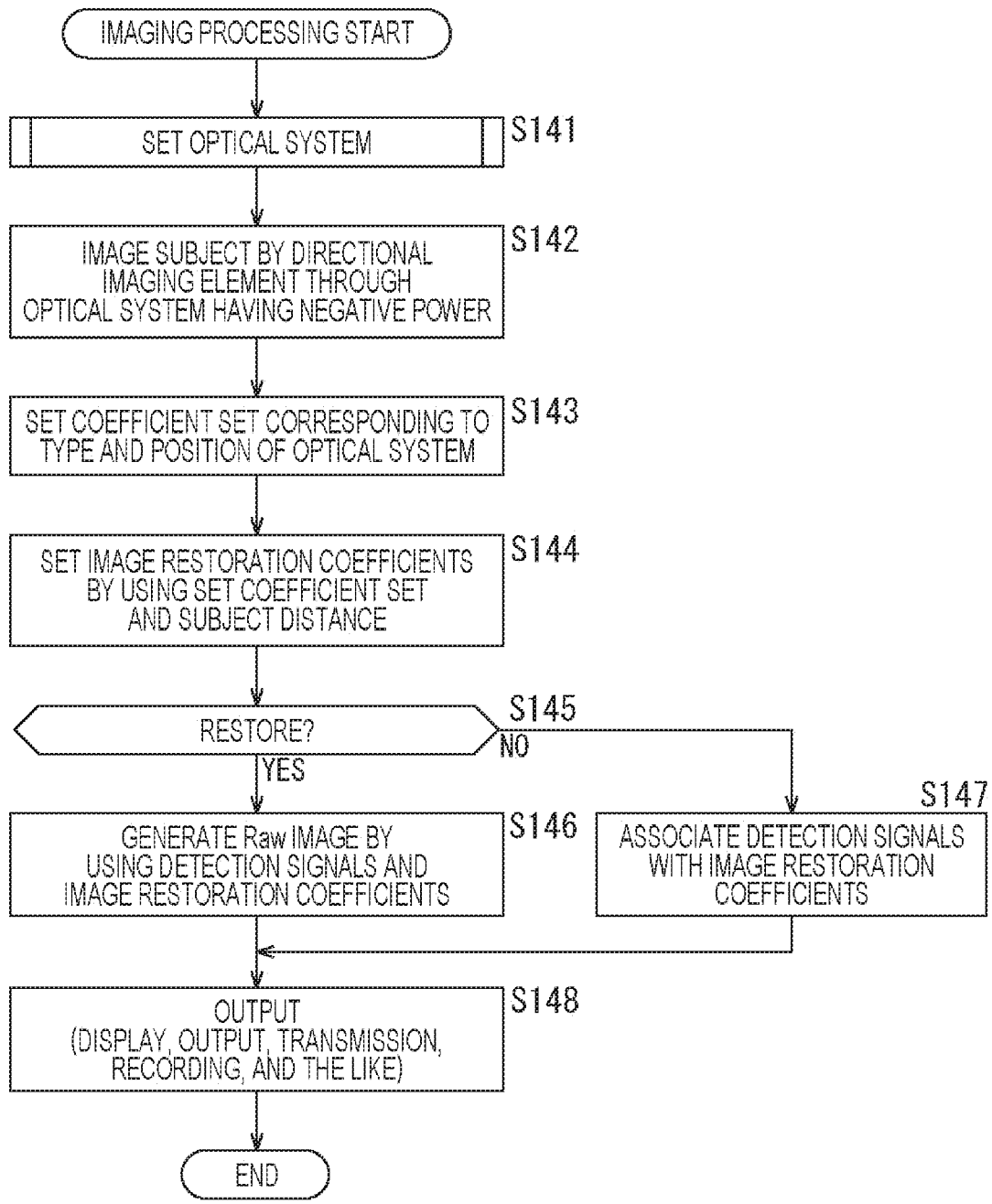
FIG. 33 is a flowchart illustrating an example of a flow of imaging processing.

Upon completion of the processing of step S167, the optical system setting processing is completed, and the processing returns to FIG. 33. Furthermore, in step S166 of FIG. 34, for example, in a case where it is determined that the appropriate position of the optical system specified in step S162 matches the position of the currently set optical system acquired in step S163, and it is not necessary to move the optical system, the processing of step S167 is omitted, and the optical system setting processing is completed, and then the processing returns to FIG. 33.

By performing the optical system setting processing as described above, the imaging apparatus 300 can set an appropriate optical system depending on the subject distance. Therefore, the range of the subject that can be imaged can be expanded more easily.

<Flow of Optical System Setting Processing 2>

Figure 34:
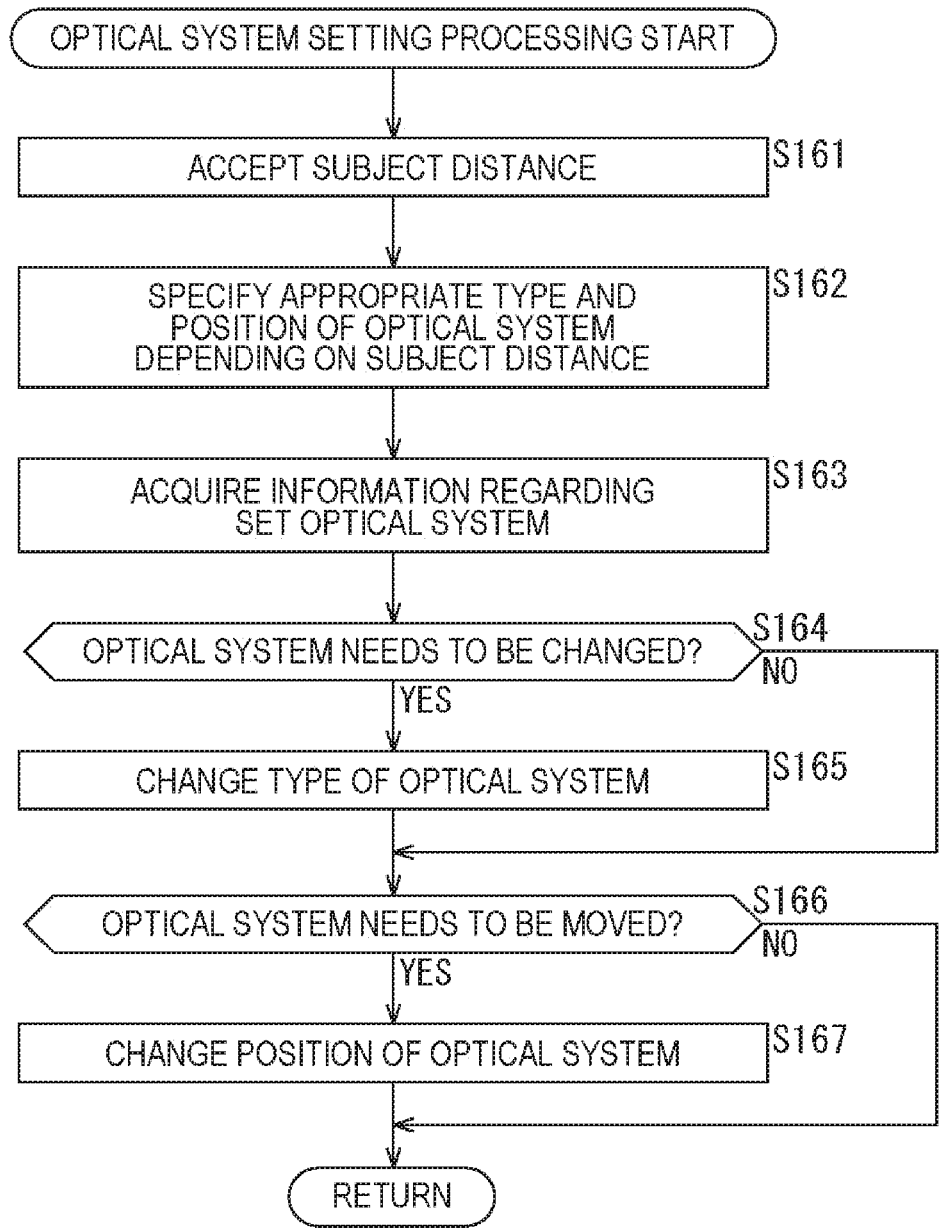
FIG. 34 is a flowchart illustrating an example of a flow of optical system setting processing.
Figure 35:
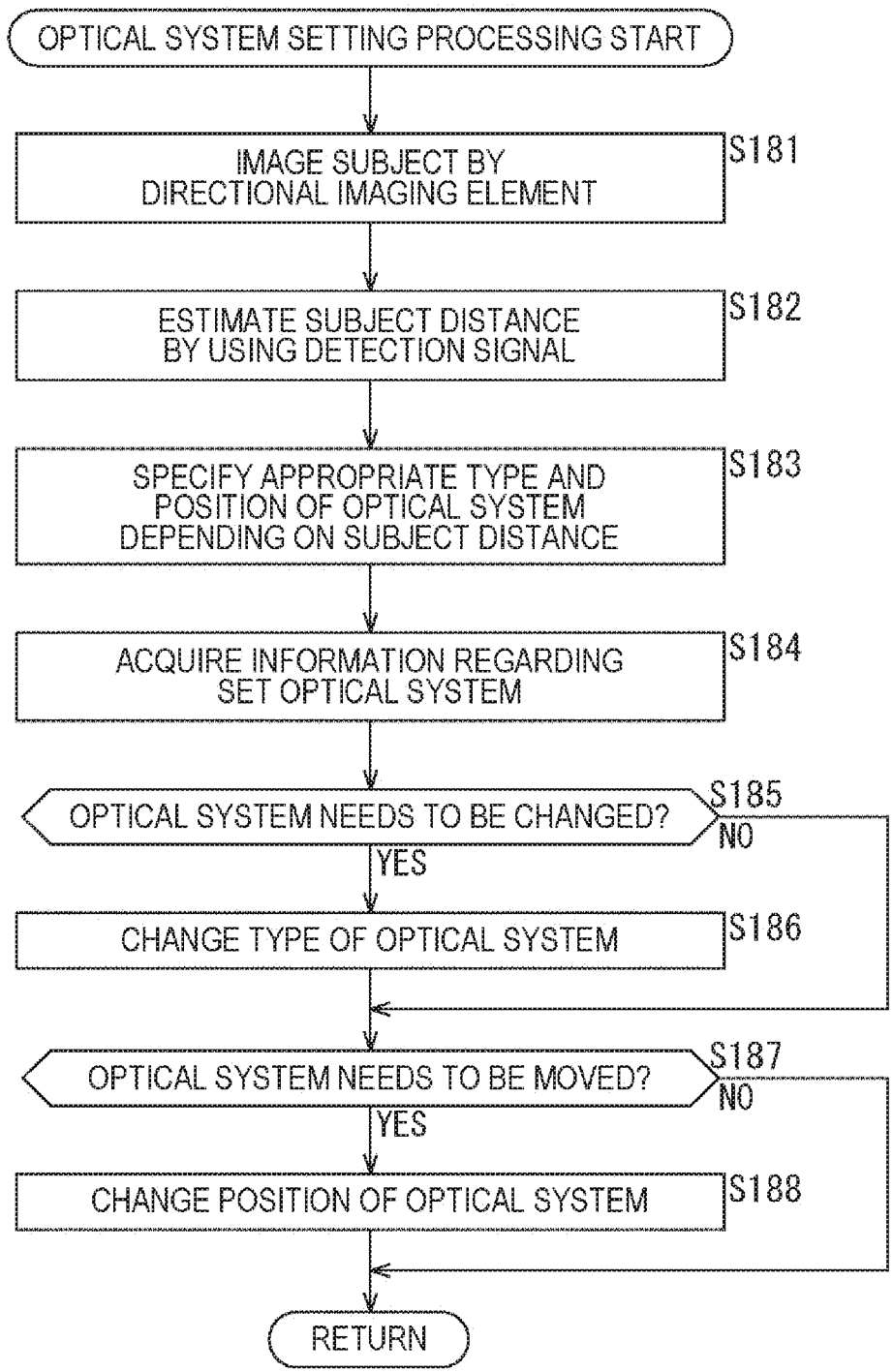
FIG. 35 is a flowchart illustrating an example of a flow of optical system setting processing.

In FIG. 34, as an example of the flow of the optical setting processing, the case has been described where the subject distance is designated from the outside; however, this is not a limitation, and for example, the imaging apparatus 300 may measure the subject distance. An example will be described of the flow of the optical system setting processing in that case, with reference to a flowchart of FIG. 35.

In this case, when the optical system setting processing is started, in step S181, the imaging element 121 images a subject. In this imaging, the setting of the optical system 120 is arbitrary. The setting may be initialized.

In step S182, the control unit 101 acquires a detection signal read from the imaging element 121 in step S181, and estimates a subject distance by using the detection signal. Note that, to estimate the subject distance more accurately, the obtained estimation result may be reflected in the setting of the optical system 120, and imaging may be performed again in that state, and the subject distance may be estimated again. That is, the processing of step S181 and step S182 may be repeated a plurality of times while the subject distance estimation result is reflected in the setting of the optical system 120.

When the subject distance is estimated, the control unit 101, in step S183, the control unit 101 specifies an appropriate type and position of the optical system depending on the estimated subject distance.

Each processing step of steps S184 to S188 are executed similarly to each processing step of steps S163 to S167.

Upon completion of the processing of step S188 or the processing of step S187, the optical system setting processing is completed, and the processing returns to FIG. 33.

By performing the optical system setting processing as described above, the imaging apparatus 300 can set an appropriate optical system depending on the subject distance. Therefore, the range of the subject that can be imaged can be expanded more easily.

4. Fourth Embodiment

<Other Configuration Examples of Imaging Elements>

Although the example of the imaging element 121 has been described above, the imaging element 121 is only required to include a plurality of pixel output units that receives incident light entering without passing through either an imaging lens or a pinhole, and each outputs one detection signal indicating an output pixel value modulated by an incident angle of the incident light, and the configuration is arbitrary.

For example, by using a random black-and-white pattern mask or an optical interference mask as a modulation element, the light incident on the imaging surface of the imaging element 121 may be modulated depending on the monochrome pattern or light interference.

Figure 36:
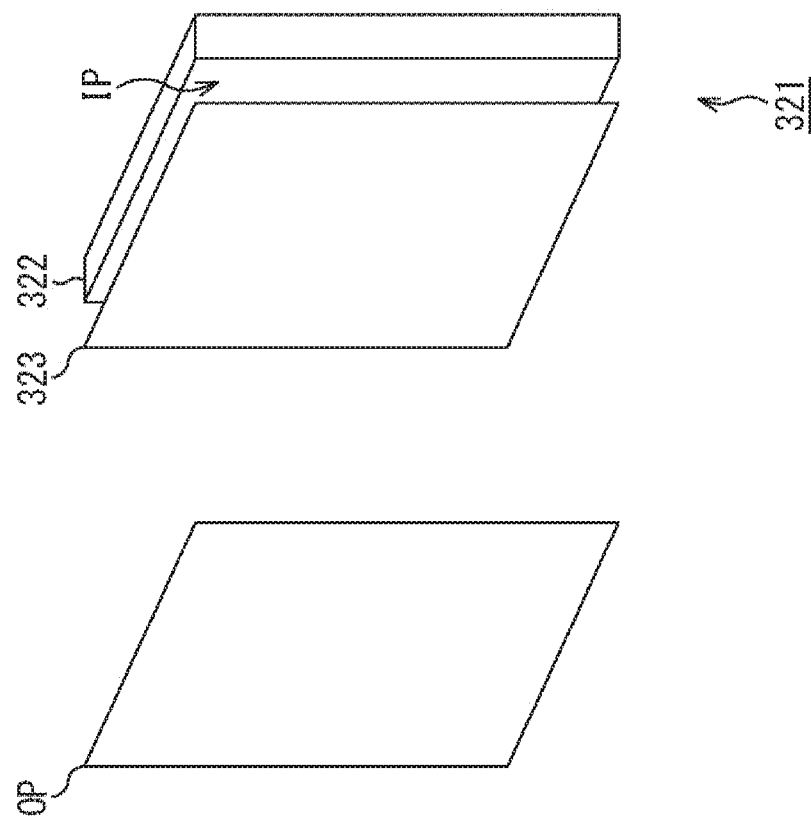
FIG. 36 is a diagram illustrating a main configuration example of the imaging element.

FIG. 36 illustrates another configuration of the imaging element. An imaging element 321 is configured such that a mask 323 that is a modulation element is fixed to an imaging element 322 to have a predetermined interval with respect to an imaging surface IP of the imaging element 322, and light from a subject surface OP is modulated by the mask 323 and then enters the imaging surface IP of the imaging element 322.

Figure 37A:
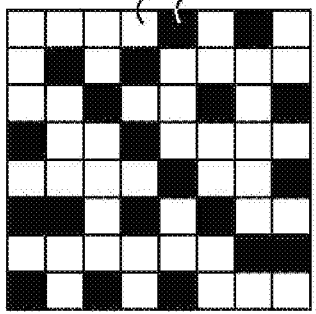
FIGS. 37A and 37B are diagrams illustrating a case where a black-and-white pattern mask is used.
Figure 37B:
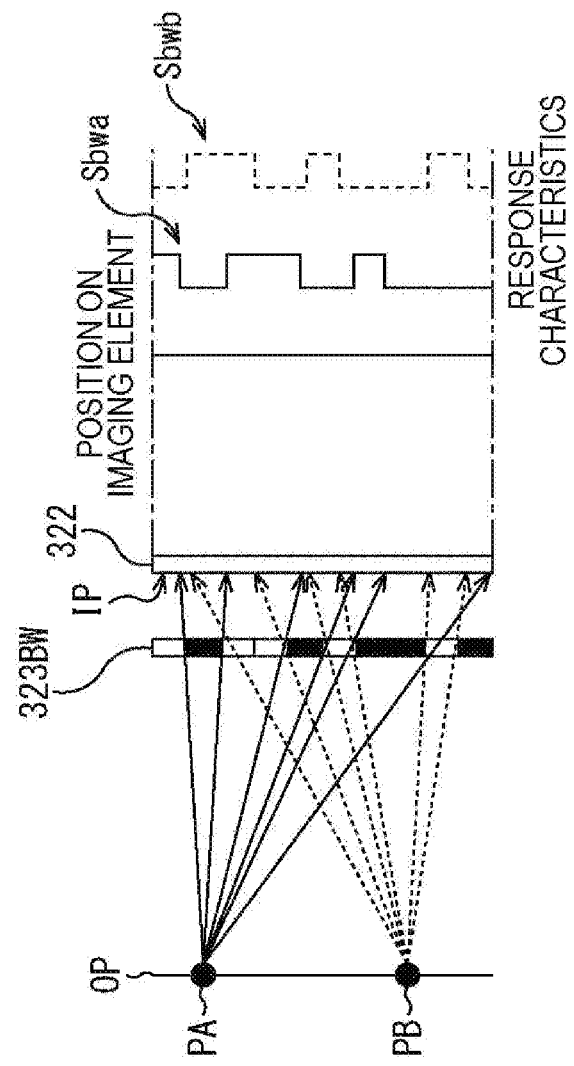

FIGS. 37A and 37B illustrate a case where a black-and-white pattern mask is used. In FIG. 37A, a black-and-white pattern mask is exemplified. A black-and-white pattern mask 323BW has a configuration in which a white pattern portion that transmits light and a black pattern portion that blocks light are randomly arranged, and the pattern size is set independently of the pixel size of the imaging element 322. In FIG. 37B, an irradiation state with respect to the imaging surface IP is schematically illustrated, for light emitted from the point light source PA and light emitted from the point light source PB. Furthermore, in FIG. 37B, an example is also schematically illustrated of a response of the imaging element in a case where the black-and-white pattern mask 323BW is used, individually for the light emitted from the point light source PA and the light emitted from the point light source PB. The light from the subject surface OP is modulated by the black-and-white pattern mask 323BW and then enters the imaging surface IP of the imaging element 322. Thus, the response of the imaging element corresponding to the light emitted from the point light source PA on the subject surface OP is Sbwa. Furthermore, the response of the imaging element corresponding to the light emitted from the point light source PB on the subject surface OP is Sbwb. Thus, pixel output information output from the imaging element 322 is information of one image obtained by combining the responses of the respective point light sources for each pixel output unit. In the case of this configuration, the incident angle directivity cannot be set independently for each pixel output unit, and the pixel output units at close positions have incident angle directivities close to each other.

Figures 38A, 38B:
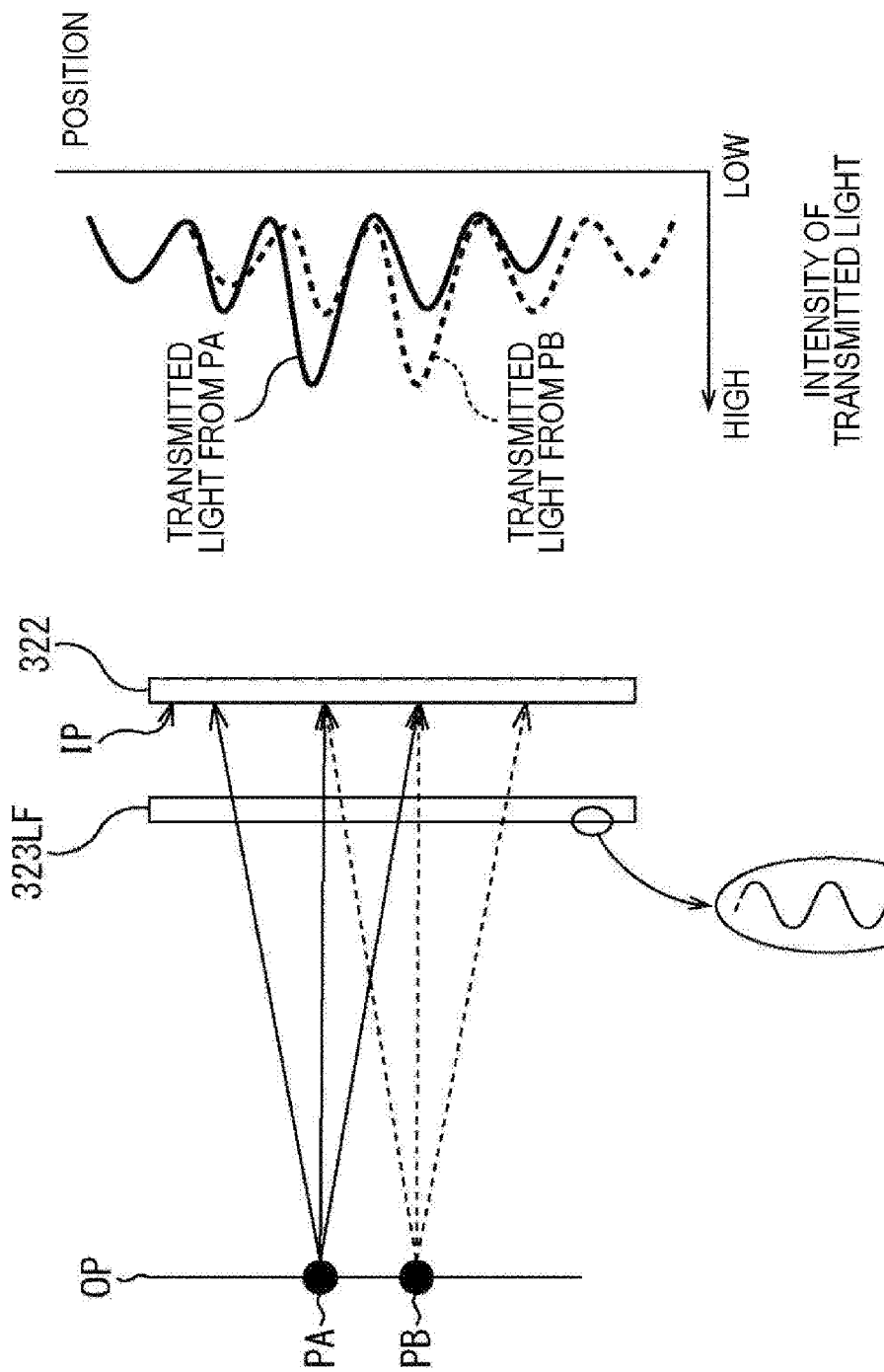
FIGS. 38A and 38B are diagrams illustrating a case where an optical interference mask is used.

FIGS. 38A and 38B illustrate a case where the optical interference mask is used. As illustrated in FIG. 38A, the light emitted from the point light sources PA and PB on the subject surface OP is emitted to the imaging surface IP of the imaging element 322 through an optical interference mask 323LF. For example, the light incident surface of the optical interference mask 323LF is provided with unevenness of the order of the wavelength of light as illustrated in FIG. 38A. Furthermore, the optical interference mask 323LF maximizes transmission of light of a specific wavelength emitted from the vertical direction. When a change increases in the incident angle (inclination with respect to the vertical direction) of the light of the specific wavelength emitted from the point light sources PA and PB on the subject surface OP with respect to the optical interference mask 323LF, an optical path length changes. Here, when the optical path length is an odd multiple of the half wavelength, the light is weakened, and when the optical path length is an even multiple of the half wavelength, the light is strengthened. In other words, the intensity of the transmitted light of the specific wavelength emitted from the point light sources PA and PB and transmitted through the optical interference mask 323LF is modulated depending on the incident angle with respect to the optical interference mask 323LF and enters the imaging surface IP of the imaging element 322, as illustrated in FIG. 38B. Thus, the pixel output information output from each output pixel unit of the imaging element 822 is information obtained by combining the light intensities after the modulation of the respective point light sources transmitted through the optical interference mask 823LF. In the case of this configuration, the incident angle directivity cannot be set independently for each pixel output unit, and the pixel output units at close positions have incident angle directivities close to each other.

Figure 39:
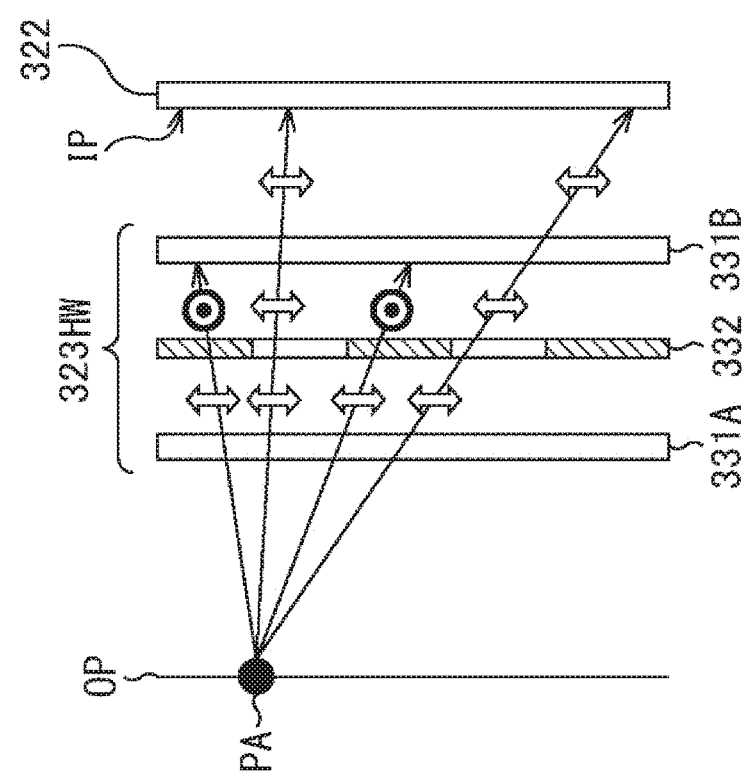
FIG. 39 is a diagram illustrating a modification of the imaging element.

Note that, an optical filter 323HW of FIG. 39 may be used instead of the optical filter 323BW. The optical filter 323HW includes a linearly polarizing element 331A and a linearly polarizing element 331B having the same polarization direction as each other, and a half-wave plate 332, and the half-wave plate 332 is sandwiched between the linearly polarizing element 331A and the linearly polarizing element 331B. The half-wave plate 332 is provided with a polarizing portion indicated by oblique lines instead of the black pattern portion of the optical filter 323BW, and the white pattern portion and the polarizing portion are randomly arranged.

The linearly polarizing element 331A transmits only a light component in a predetermined polarization direction out of substantially non-polarized light emitted from the point light source PA. Hereinafter, it is assumed that the linearly polarizing element 331A transmits only a light component whose polarization direction is parallel to the paper surface. As for the polarized light transmitted through the polarizing portion of the half-wave plate 332 out of the polarized light transmitted through the linearly polarizing element 331A, the polarization plane is rotated, whereby the polarization direction changes in a direction perpendicular to the paper surface. On the other hand, as for the polarized light transmitted through the white pattern portion of the half-wave plate 332 out of the polarized light transmitted through the linearly polarizing element 331A, the polarization direction remains unchanged in a direction parallel to the paper surface. Then, the linearly polarizing element 331B transmits the polarized light transmitted through the white pattern portion and hardly transmits the polarized light transmitted through the polarizing portion. Thus, the amount of light of the polarized light transmitted through the polarizing portion is reduced compared to the polarized light transmitted through the white pattern portion. Therefore, a shade pattern substantially similar to a case where the optical filter 323BW is used is generated on the light-receiving surface (imaging surface) IP of the imaging element 322.

However, in the cases of these configurations, since it is necessary to add another configuration such as a mask to the imaging element, the imaging element 121 of the configuration example described in the first to third embodiments can be further downsized.

As described above, in the present technology, the imaging element 121 may be configured as described with reference to FIG. 4, may be configured as described with reference to FIG. 5, may be configured as described with reference to FIGS. 36, 37A and 37B, or may be configured as described with reference to FIGS. 38A and 38B. That is, the imaging element 121 is only required to be an imaging element including a plurality of pixel output units that receives incident light entering without passing through either an imaging lens or a pinhole (and, in a case where the optical system having a negative power that is not an imaging lens is provided in front, through the optical system), and each outputs one detection signal indicating an output pixel value modulated by an incident angle of the incident light.

Furthermore, the present technology may be made to be applied to the imaging element 121 having the configuration described with reference to FIG. 4, or the configuration described with reference to FIG. 5. That is, the plurality of pixel output units of the imaging element 121 may have a configuration in which the incident angle directivity of the output pixel value indicating the directivity with respect to the incident angle of the incident light from the subject is settable independently for each of the pixel output units.

Furthermore, the present technology may be made to be applied to an imaging element having a configuration as described with reference to FIG. 4. That is, the plurality of pixel output units of the imaging element 121 may have a configuration in which the incident angle directivity indicating the directivity with respect to the incident angle of the incident light from the subject is settable independently for each of the pixel output units.

Furthermore, the present technology may be made to be applied to an imaging element having a configuration as described with reference to FIG. 5. That is, the plurality of pixel output units of the imaging element 121 may be made to be able to set the incident angle directivity of the output pixel value indicating the directivity with respect to the incident angle of the incident light from the subject independently for each pixel output unit, by making photo diodes (PDs) that contribute to output different from each other.

<Other Configuration Examples of Imaging Apparatus and Image Processing Apparatus>

In the above description, the imaging apparatus 100 and the imaging apparatus 300 each include the imaging element 121; however, the number of the imaging elements 121 included in the imaging apparatus 100 and the imaging apparatus 300 is arbitrary. The imaging apparatus 100 and the imaging apparatus 300 may each include a single imaging element 121 or a plurality of the imaging elements 121. Furthermore, in a case where the imaging apparatus 100 and the imaging apparatus 300 include the plurality of imaging elements 121, performances (for example, the number of pixels, shape, pixel structure, imaging characteristics, imaging method, and the like) of the plurality of imaging elements 121 may all be unified, or may include different one.

Furthermore, in the above description, the imaging apparatus 100 and the imaging apparatus 300 include the restoration unit 122; however, the number of the restoration units 122 included in the imaging apparatus 100 and the imaging apparatus 300 is arbitrary, and may be singular or plural in each of the imaging apparatuses. Furthermore, in a case where the imaging apparatus 100 and the imaging apparatus 300 each include the plurality of restoration units 122, performances of the plurality of restoration units 122 may be unified, or may include different one. Furthermore, the imaging apparatus 100 and the imaging apparatus 300 may include a plurality of other processing units.

5. Others

Application Examples

The present technology can be applied to any apparatus as long as the apparatus has an imaging function. Furthermore, the present technology can be applied to any apparatus or system as long as the apparatus or system processes an image obtained by the imaging function. Furthermore, the present technology can be applied to an apparatus or system used for arbitrary fields, for example, traffic, medical care, security, agriculture, livestock industry, mining, beauty, factory, home appliances, weather, natural monitoring, and the like.

For example, the present technology can be applied to an apparatus or a system that handles images used for appreciation, such as a digital camera or a portable device with a camera function. Furthermore, the present technology can also be applied to an apparatus or a system that handles images used for applications such as security, surveillance, and observation, for example, a surveillance camera. Furthermore, the present technology can also be applied to an apparatus or a system that handles images used for applications, for example, person authentication, image analysis, distance measurement, and the like. Furthermore, the present technology can also be applied to an apparatus or a system that handles images used for control of a machine or the like, for example, automatic driving of an automobile, a robot, or the like.

<Software>

A series of the processing steps described above can be executed by hardware, and can be executed by software. Furthermore, some processing steps can be executed by hardware, and other processing steps can be executed by software. In a case where the series of processing steps is executed by software, a program constituting the software is installed.

The program can be installed, for example, from a recording medium. For example, in the case of the imaging apparatus 100 of FIG. 1 or the imaging apparatus 300 of FIG. 31, the recording medium includes the recording medium 116 on which the program is recorded, which is distributed to deliver the program to the user separately from the apparatus main body. In that case, for example, by mounting the recording medium 116 to the recording/reproducing unit 115, the program stored in the recording medium 116 can be read and installed in the storage unit 113.

Furthermore, the program can also be provided via a wired or wireless transmission medium such as a local area network, the Internet, or digital satellite broadcasting. For example, in the case of the imaging apparatus 100 of FIG. 1 or the imaging apparatus 300 of FIG. 31, the program can be received by the communication unit 114 and installed in the storage unit 113.

Besides, the program can be installed in advance in the storage unit, the ROM, and the like. For example, in the case of the imaging apparatus 100 of FIG. 1 or the imaging apparatus 300 of FIG. 31, the program can also be installed in advance in the storage unit 113, a ROM (not illustrated) in the control unit 101, and the like.

<Supplement>

The embodiment of the present technology is not limited to the embodiments described above, and various modifications are possible without departing from the gist of the present technology.

For example, the present technology can also be implemented as any configuration constituting an apparatus or system, for example, a processor as a system large scale integration (LSI) or the like, a module using a plurality of processors and the like, a unit using a plurality of modules and the like, a set in which other functions are further added to the unit, or the like (in other words, a configuration of a part of the apparatus).

Furthermore, each processing unit described above can be realized by an arbitrary configuration. For example, each processing unit described above may include a circuit, an LSI, a system LSI, a processor, a module, a unit, a set, a device, an apparatus, a system, and the like. Furthermore, a plurality of them may be combined together. At this time, for example, the same type of configurations may be combined together, such as a plurality of circuits, and a plurality of processors, or different types of configurations may be combined together, such as a circuit and an LSI.

Note that, in this specification, a system means a set of a plurality of constituents (apparatus, module (component), and the like), and it does not matter whether or not all of the constituents are in the same cabinet. Thus, a plurality of apparatuses that is accommodated in a separate cabinet and connected to each other via a network and one apparatus that accommodates a plurality of modules in one cabinet are both systems.

Furthermore, for example, the configuration described as one apparatus (or processing unit) may be divided and configured as a plurality of apparatuses (or processing units). Conversely, configurations described as a plurality of apparatuses (or processing units) in the above may be collectively configured as one apparatus (or processing unit). Furthermore, configurations other than those described above may be added to the configuration of each apparatus (or each processing unit), of course. Moreover, as long as the configuration and operation of the system as a whole are substantially the same, a part of the configuration of a certain apparatus (or processing unit) may be included in the configuration of another apparatus (or another processing unit).

Furthermore, for example, the present technology can adopt a configuration of cloud computing that shares one function in a plurality of apparatuses via a network to process in cooperation.

Furthermore, for example, the program described above can be executed in an arbitrary apparatus. In that case, it is sufficient that the apparatus has a necessary function (function block, or the like) and can obtain necessary information.

Furthermore, for example, each step described in the above flowchart can be executed by sharing in a plurality of apparatuses, other than being executed by one apparatus. Moreover, in a case where a plurality of pieces of processing is included in one step, the plurality of pieces of processing included in the one step can be executed by sharing in a plurality of apparatuses, other than being executed by one apparatus. In other words, a plurality of pieces of processing included in one step can be executed as processing of a plurality of steps. Conversely, processing described as a plurality of steps can be executed collectively as one step.

In the program executed by the computer, pieces of processing of steps describing the program may be executed in chronological order along with the order described in this specification, or in parallel, or may be individually executed at necessary timing such as when each step is called. That is, as long as inconsistency does not occur, the processing of each step may be executed in an order different from the order described above. Moreover, the processing of the step describing the program may be executed in parallel with processing of another program, or may be executed in combination with the processing of the other program.

As long as inconsistency does not occur, each of a plurality of the present technologies described in this specification can be implemented alone independently. Of course, it is also possible to implement by combining any of the plurality of present technologies. For example, a part or all of the present technology described in any of the embodiments can be implemented in combination with a part or all of the present technology described in other embodiments. Furthermore, a part or all of the present technology described above can be implemented in combination with another technology not described above.

The present technology can also adopt the following configurations.

(1) An imaging apparatus including:
an optical system that is not an imaging lens and has a negative power; and
an imaging element including a plurality of pixel output units that receives incident light from a subject entering without passing through either an imaging lens or a pinhole and entering through the optical system, and each outputs one detection signal indicating an output pixel value modulated by an incident angle of the incident light.

(2) The imaging apparatus according to (1), in which
the optical system includes a single concave lens.

(3) The imaging apparatus according to (1), in which
the optical system includes a plurality of lenses having a negative power as a whole.

(4) The imaging apparatus according to (3), in which
some lenses among the plurality of lenses have a positive power.

(5) The imaging apparatus according to any of (1) to (4), in which
a relative position of the optical system with respect to the imaging element is variable.

(6) The imaging apparatus according to any of (1) to (5), in which
the optical system is detachable from the imaging apparatus.

(7) The imaging apparatus according to any of (1) to (6), in which
the plurality of pixel output units has a configuration in which an incident angle directivity of the output pixel value indicating a directivity with respect to an incident angle of incident light from a subject is settable independently for each of the pixel output units.

(8) The imaging apparatus according to any of (1) to (6), in which
the plurality of pixel output units has a configuration in which an incident angle directivity indicating a directivity with respect to an incident angle of incident light from a subject is settable independently for each of the pixel output units.

(9) The imaging apparatus according to any of (1) to (6), in which
the plurality of pixel output units has a configuration in which an incident angle directivity of the output pixel value indicating a directivity with respect to an incident angle of incident light from a subject is settable independently for each of the pixel output units by making photo diodes (PDs) that contribute to output different from each other.

(10) An imaging method including
imaging a subject by an imaging element including a plurality of pixel output units that receives incident light from the subject entering without passing through either an imaging lens or a pinhole and entering through an optical system that is not an imaging lens and has a negative power, and each outputs one detection signal indicating an output pixel value modulated by an incident angle of the incident light.

(11) An image processing apparatus including
a coefficient setting unit that sets, depending on at least one of a type and position of an optical system that is not an imaging lens and has a negative power, or a distance to a subject, coefficients used when a restored image is restored from output pixel values of a plurality of pixel output units, of an imaging element, the imaging element including the plurality of pixel output units that receives incident light from the subject entering without passing through either an imaging lens or a pinhole and entering through the optical system, and each outputs one detection signal indicating an output pixel value modulated by an incident angle of the incident light.

(12) The image processing apparatus according to (11), further including
an acceptance unit that accepts designation of the type and position of the optical system, in which
the coefficient setting unit sets the coefficients depending on the type and position of the optical system accepted by the acceptance unit.

(13) The image processing apparatus according to (11) or (12), further including
a detection unit that detects the type and position of the optical system, in which
the coefficient setting unit sets the coefficients depending on the type and position of the optical system detected by the detection unit.

(14) The image processing apparatus according to any of (11) to (13), further including
a subject distance acceptance unit that accepts an input of the distance to the subject, in which the coefficient setting unit sets the coefficients depending on the distance to the subject accepted by the subject distance acceptance unit.

(15) The image processing apparatus according to any of (11) to (14), further including
a subject distance detection unit that detects the distance to the subject, in which
the coefficient setting unit sets the coefficients depending on the distance to the subject detected by the subject distance detection unit.

(16) The image processing apparatus according to any of (11) to (15), further including
a restoration unit that restores the restored image by using the output pixel values of the plurality of pixel output units of the imaging element and the coefficients set by the coefficient setting unit.

(17) The image processing apparatus according to any of (11) to (16), further including
an associating unit that associates the coefficients set by the coefficient setting unit as metadata with data including the output pixel values of the plurality of pixel output units of the imaging element.

(18) The image processing apparatus according to any of (11) to (17), further including
an optical system setting unit that sets the type and position of the optical system.

(19) The image processing apparatus according to (18), in which
the optical system setting unit sets the type and position of the optical system depending on the distance to the subject.

(20) An image processing method including
setting, depending on at least one of a type and position of an optical system that is not an imaging lens and has a negative power, or a distance to the subject, coefficients used when a restored image is restored from output pixel values of a plurality of pixel output units, of an imaging element, the imaging element including the plurality of pixel output units that receives incident light entering without passing through either an imaging lens or a pinhole and entering through the optical system, and each outputs one detection signal indicating an output pixel value modulated by an incident angle of the incident light.

REFERENCE SIGNS LIST

100 Imaging apparatus
120 Optical system
121 Imaging element
122 Restoration unit
123 Associating unit
124 Sensor unit
125 Signal processing unit
300 Imaging apparatus

The invention claimed is:

1. An imaging apparatus, comprising:
an optical system that is not an imaging lens and has a negative power; and
an imaging element including a plurality of pixel output units that receives incident light from a subject entering without passing through either an imaging lens or a pinhole and entering through the optical system, and each outputs one detection signal indicating an output pixel value modulated by an incident angle of the incident light.

2. The imaging apparatus according to claim 1, wherein the optical system includes a single concave lens.

3. The imaging apparatus according to claim 1, wherein the optical system includes a plurality of lenses having a negative power as a whole.

4. The imaging apparatus according to claim 3, wherein some lenses among the plurality of lenses have a positive power.

5. The imaging apparatus according to claim 1, wherein a relative position of the optical system with respect to the imaging element is variable.

6. The imaging apparatus according to claim 1, wherein the optical system is detachable from the imaging apparatus.

7. The imaging apparatus according to claim 1, wherein the plurality of pixel output units has a configuration in which an incident angle directivity of the output pixel value indicating a directivity with respect to an incident angle of incident light from a subject is settable independently for each of the pixel output units.

8. The imaging apparatus according to claim 1, wherein the plurality of pixel output units has a configuration in which an incident angle directivity indicating a directivity with respect to an incident angle of incident light from a subject is settable independently for each of the pixel output units.

9. The imaging apparatus according to claim 1, wherein the plurality of pixel output units has a configuration in which an incident angle directivity of the output pixel value indicating a directivity with respect to an incident angle of incident light from a subject is settable independently for each of the pixel output units by making photo diodes (PDs) that contribute to output different from each other.

10. An imaging method, comprising
imaging a subject by an imaging element including a plurality of pixel output units that receives incident light from the subject entering without passing through either an imaging lens or a pinhole and entering through an optical system that is not an imaging lens and has a negative power, and each outputs one detection signal indicating an output pixel value modulated by an incident angle of the incident light.

11. An image processing apparatus, comprising
a coefficient setting unit that sets, depending on at least one of a type and position of an optical system that is not an imaging lens and has a negative power, or a distance to a subject, coefficients used when a restored image is restored from output pixel values of a plurality of pixel output units, of an imaging element, the imaging element including the plurality of pixel output units that receives incident light from the subject entering without passing through either an imaging lens or a pinhole and entering through the optical system, and each outputs one detection signal indicating an output pixel value modulated by an incident angle of the incident light.

12. The image processing apparatus according to claim 11, further comprising
an acceptance unit that accepts designation of the type and position of the optical system, wherein
the coefficient setting unit sets the coefficients depending on the type and position of the optical system accepted by the acceptance unit.

13. The image processing apparatus according to claim 11, further comprising
   a detection unit that detects the type and position of the optical system, wherein
   the coefficient setting unit sets the coefficients depending on the type and position of the optical system detected by the detection unit.

14. The image processing apparatus according to claim 11, further comprising
   a subject distance acceptance unit that accepts an input of the distance to the subject, wherein
   the coefficient setting unit sets the coefficients depending on the distance to the subject accepted by the subject distance acceptance unit.

15. The image processing apparatus according to claim 11, further comprising
   a subject distance detection unit that detects the distance to the subject, wherein
   the coefficient setting unit sets the coefficients depending on the distance to the subject detected by the subject distance detection unit.

16. The image processing apparatus according to claim 11, further comprising
   a restoration unit that restores the restored image by using the output pixel values of the plurality of pixel output units of the imaging element and the coefficients set by the coefficient setting unit.

17. The image processing apparatus according to claim 11, further comprising
   an associating unit that associates the coefficients set by the coefficient setting unit as metadata with data including the output pixel values of the plurality of pixel output units of the imaging element.

18. The image processing apparatus according to claim 11, further comprising
   an optical system setting unit that sets the type and position of the optical system.

19. The image processing apparatus according to claim 18, wherein
   the optical system setting unit sets the type and position of the optical system depending on the distance to the subject.

20. An image processing method, comprising
   setting, depending on at least one of a type and position of an optical system that is not an imaging lens and has a negative power, or a distance to the subject, coefficients used when a restored image is restored from output pixel values of a plurality of pixel output units, of an imaging element, the imaging element including the plurality of pixel output units that receives incident light entering without passing through either an imaging lens or a pinhole and entering through the optical system, and each outputs one detection signal indicating an output pixel value modulated by an incident angle of the incident light.

\* \* \* \* \*